(12) United States Patent
Sagisaka et al.

(10) Patent No.: US 7,550,554 B2
(45) Date of Patent: *Jun. 23, 2009

(54) ARYL AMINE POLYMER, THIN FILM TRANSISTOR USING THE NEW ARYL AMINE POLYMER, AND METHOD OF MANUFACTURING THE THIN FILM TRANSISTOR

(75) Inventors: Toshiya Sagisaka, Yokohama (JP); Masaomi Sasaki, Susono (JP); Masafumi Torii, Yokohama (JP); Shinichi Kawamura, Ushiku (JP); Takashi Okada, Yokohama (JP); Yoshinobu Nakayama, Setagaya-ku (JP); Yoshikazu Akiyama, Yokohama (JP); Hitoshi Kondoh, Sagamihara (JP); Hidenori Tomono, Yokohama (JP); Takumi Yamaga, Yokohama (JP)

(73) Assignee: Ricoh Company, Ltd., Yokohama-shi (JP)

( * ) Notice: Subject to any disclaimer, the term of this patent is extended or adjusted under 35 U.S.C. 154(b) by 65 days.

This patent is subject to a terminal disclaimer.

(21) Appl. No.: 11/566,728

(22) Filed: Dec. 5, 2006

(65) Prior Publication Data
US 2007/0092760 A1 Apr. 26, 2007

Related U.S. Application Data

(62) Division of application No. 10/777,095, filed on Feb. 13, 2004, now Pat. No. 7,166,689.

(30) Foreign Application Priority Data

| Feb. 13, 2003 | (JP) | ............................... 2003-035582 |
| Jun. 27, 2003 | (JP) | ............................... 2003-185402 |
| Aug. 29, 2003 | (JP) | ............................... 2003-307561 |
| Oct. 31, 2003 | (JP) | ............................... 2003-373723 |
| Jan. 30, 2004 | (JP) | ............................... 2004-24866 |
| Jan. 30, 2004 | (JP) | ............................... 2004-24867 |
| Jan. 30, 2004 | (JP) | ............................... 2004-24878 |
| Feb. 3, 2004 | (JP) | ............................... 2004-27234 |

(51) Int. Cl.
*C08G 73/02* (2006.01)
*C08G 73/00* (2006.01)

(52) U.S. Cl. ................... 528/422; 528/86; 429/128; 428/690; 428/917; 427/59

(58) Field of Classification Search ............. 528/422, 528/86; 429/128; 428/690, 917; 427/59
See application file for complete search history.

(56) References Cited

U.S. PATENT DOCUMENTS 4,859,556 A 8/1989 Sasaki (Continued)

FOREIGN PATENT DOCUMENTS

JP 58-198043 11/1983

(Continued)

OTHER PUBLICATIONS

H. Rost, et al., Novel light emitting and photoconducting polyarylenevinylene derivatives containing phenylene arylamine and phenylene oxide units in the main chain, Synthetic Metals 84, pp. 269-270, 1997.

(Continued)

*Primary Examiner*—Duc Truong
(74) *Attorney, Agent, or Firm*—Oblon, Spivak, McClelland, Maier & Neustadt, P.C.

(57) ABSTRACT

An aryl amine polymer is provided which contains a specific repeat unit, its use in preparing an organic semiconductor material which contains the aryl amine polymer and an additional specific compound and in the preparation of organic light emitting devices (OLED), organic thin film transistors (TFT) and so on, along with an organic TFT including a substrate, an organic semiconductor layer which contains the organic semiconductor material and is located overlying the substrate, an electrode pair of a source electrode and a drain electrode; and a third electrode.

21 Claims, 16 Drawing Sheets

U.S. PATENT DOCUMENTS

| | | | |
|---|---|---|---|
| 4,892,949 | A | 1/1990 | Sasaki |
| 5,840,454 | A | 11/1998 | Nagai et al. |
| 6,018,014 | A | 1/2000 | Nagai et al. |
| 6,187,494 | B1 | 2/2001 | Kawamura et al. |
| 6,303,736 | B1 | 10/2001 | Kawamura et al. |
| 6,492,079 | B2 | 12/2002 | Shimada et al. |
| 6,596,449 | B2 | 7/2003 | Shimada et al. |
| 2007/0092760 | A1 | 4/2007 | Sagisaka et al. |

FOREIGN PATENT DOCUMENTS

| | | |
|---|---|---|
| JP | 58-198425 | 11/1983 |
| JP | 60-098437 | 6/1985 |
| JP | 08-157575 | 6/1996 |
| JP | 08-228034 | 9/1996 |
| JP | 08/228035 | 9/1996 |
| JP | 10-310635 | * 11/1998 |
| JP | 11-195790 | 7/1999 |
| WO | WO97/09394 | 3/1997 |

OTHER PUBLICATIONS

R.C. Haddon, et al., $C_{60}$ thin film transistors, Appl. Phys. Lett 67 (1), Jul. 3, 1995, pp. 121-123.

Zhenan Bao, et al., Organic field-effect transistors with high mobility based on copper phthalocyanine, American Institute of Physics, pp. 3066-3068, 1996.

Zhenan Bao, et al, Soluble and processable regioregular poly (3-hexylthiophene) for thin film filed-efect transistor applications with high mobility., American Institute of Physics, pp. 4108-4110, 1996.

H. Sirringhaus, et al., Bis(dithienothiophene) organic field-effect transistors with a high On/Off ration., American Institute of Physics, pp. 3871-3873, 1997.

Howard E. Katz, et al., a,a-Dihexylquaterthiophene: A Second Thin Film Single-Crystal Organic Semiconductor, Chemistry of Materials, vol. 10, No. 2, pp. 457-459, Feb. 1998.

Gilles Horowitz, et al., Role of the semiconductor/insulator interface in the characteristics of π-conjugated-oligomer-based thin-film transistors, Synthetic Metals, 51, pp. 419-424, 1992.

H. Fuchigami, et al., Polytheinylenevinylene thin-film transistor with high carrier mobility, American Institute of Physics, Appl. Phys. Lettt. 63, (10), Sep. 6, 1993.

N. Miyaura, et al., The Palladium-catalyzed cross-coupling reaction of phenylboronic acid with haloarenes in the presence of bases., Synthetic Communications, 11(7), 513-519, 1981.

H. Sirringhaus, et al., High-Resolution Inkjet Printing of All-Polymer Transistor Circuits, Science vol. 290, pp. 2123-2126, Dec. 2000.

Scheinert et al., Field effect in organic devices with solution doped arylamino-poly(phenylene-vinylene), 2000, Elsevier Sciene Ltd., Chem Abstract 132: 341661.

Bai et al, The photo- and electroluminescence of some novel light emitting copolymers, Elsevier Sciene S.A., 2000 Chem Abstract 132: 309300.

Zheng et al. New light emitting materials: alternating—chromophores, 1999, John Wiley & Sons, Inc., Chem Abstract 132: 36095.

Ueda et al., Styryl containing polymer,—hole transporting material using it, 1998, Minolta Camera Co., Ltd., Peop. Rep. China, Chem Abstract 130:73811.

U.S. Appl. No. 12/144,079, filed Jun. 23, 2008, Yamaga et al.

* cited by examiner

ARYL AMINE POLYMER, THIN FILM TRANSISTOR USING THE NEW ARYL AMINE POLYMER, AND METHOD OF MANUFACTURING THE THIN FILM TRANSISTOR

This application is a DIV of Ser. No. 10/777,095 filed on Feb. 13, 2004 now U.S. Pat. No. 7,166,689.

FIELD OF THE INVENTION

The present invention relates to an aryl amine polymer for organic light emitting devices, organic transistors and so on. Also the present invention relates to an organic thin film transistor (TFT) using the aryl amine polymer as a semiconductor layer therein and a method of manufacturing the organic TFT.

DISCUSSION OF THE BACKGROUND

Organic light emitting devices and organic transistor devices have been proposed utilizing various characteristics of organic materials such as light emitting and charge transport characteristics. By using organic materials for these devices, advantages such as light weight, low price, low manufacturing cost and flexibility are expected.

For materials for use in organic light emitting devices, various materials from low molecular weight materials to polymeric materials have been reported. As for low molecular weight materials, it is reported that efficiency is boosted by adopting various kinds of layer structures and durability is improved by skillfully controlling the doping method. However, in the case of layers of the low molecular weight materials, it is reported that the state of the layers changes with an extended period of time. Therefore the layers have a vital problem with stability of the film.

As for polymeric materials, pi-conjugated polymers such as poly-p-phenylenevinylene (PPV) based compounds and poly-thiophenes have been intensively studied. However, these materials have shortcomings such as difficulty in purifying the materials and a low fluorescence quantum yield. Currently, no high-performance light emitting device has been obtained so far.

Published unexamined Japanese Patent Applications Nos. 10-310635 and 8-157575, WO (Patent Cooperation Treaty) 97/09394 and Synth. Met., 84, 269, 1997 have disclosed polymeric materials which contain an aryl amine moiety in the main chain of pi-conjugated polymers. Considering that polymeric materials are inherently stable in the glass state, if a high fluorescent quantum yield is imparted thereto, an excellent light emitting device can be designed. Therefore, further improvement in this area has been sought.

As for organic thin film transistor (TFT) devices, various kinds of materials from low molecular weight materials to polymeric materials have been reported. Recently organic TFTs having an organic active layer have drawn much attention as a low cost replacement for silicon-based TFTs. By utilizing organic materials, thin films and circuits can be easily formed by wet methods such as printing methods, spin coating methods and dipping methods. The devices can thus be manufactured without the costly processes which are required in the manufacturing process of silicon-based TFTs. Therefore, large cost cutting in manufacturing and large-sized devices are expected. In addition, devices including organic materials have advantages such as mechanical flexibility and light weight. Although organic materials do not match with inorganic semiconductor materials in terms of carrier mobility, organic semiconductor devices attract intense interest due to the advantages mentioned above.

Next, structures and operations of organic TFTs will be described.

FIG. 1A illustrates a cross section of an example of conventional TFTs. The materials and the structure thereof will be explained referring to FIG. 1A.

In FIG. 1, numeral references 1, 2, 3, 4, 5 and 6 denote a source electrode (hereinafter a source), a drain electrode (hereinafter referred to as a drain), a gate electrode (hereinafter referred to as a gate), an organic semiconductor layer, an insulation layer and a substrate, respectively. When a voltage is applied between the source 1 and the drain 2, an electric current flows between the source 1 and the drain 2 through an organic semiconductor layer. At the same time, if a voltage is applied to the gate 3 which is separated from the organic semiconductor layer 4 by the insulation layer 5 therebetween, conductivity of the organic semiconductor layer varies because of the electric field effect, meaning that the electric current flowing between the source 1 and the drain 2 can be modulated. This is thought to be because the voltage which is applied to the gate 3 changes the width of the accumulation layer in the organic semiconductor layer adjacent to the insulation layer, resulting in change of the channel cross sectional area.

Specific examples of such proposed organic TFT materials include low molecular weight materials such as pentacene (Synth. Met., 51, 419, 1992.), phthalocyanine (Appl. Phys. Lett., 69, 3066, 1996.), fullerene (Published unexamined Japanese Patent Application No. 8-228034 and Appl. Phys. Lett., 67, 121, 1995.), anthradithiophene (Published unexamined Japanese Patent Application No. 11-195790), thiophene oligomer (Japanese Patent No. 3145294 and Chem. Mater., 10, 457, 1998) and bis-dithienothiophene (Appl. Phys. Lett., 71, 3871, 1997.), and polymeric materials such as polythiophene (Appl. Phys. Lett., 69, 4108, 1996) and polythienylenevinylene (Appl. Phys. Lett., 63, 1372, 1993.).

The materials mentioned above have sufficient carrier mobility as to be used organic semiconductor for TFT devices. However, these materials still need improvements I order that the TFT devices using the organic materials satisfy commercial purposes. For example, it is reported that pentacene has a mobility of about 1 $cm^2$/Vs. However, pentacene is barely soluble in a solvent and thereby forming a pentacene film from a solution is difficult. In addition, pentacene is unstable under oxidation conditions and therefore tends to be oxidized with time in an atmosphere containing oxygen. Similarly, materials such as phthalocyanine and fullerene are also barely soluble and generally an organic semiconductor layer thereof needs to be manufactured by a vacuum deposition method. Therefore, advantages of the devices using organic materials such as cost cutting in manufacturing process and formability of large-sized devices cannot be expected. Further, these materials have problems in that a film thereof tends to peel off and crack due to deformation of the substrate.

Among materials which can be applied by a wet process and have a relatively high mobility, polyalkylthiophene (Appl. Phys. Lett., 69, 4108, 1996.) based materials attract interest but have shortcomings such that a device using a polyalkylthiophene based compound has a low on-off ratio and polyalkylthiophene based compounds tend to be oxidized, and thereby the properties thereof change with time.

As described above, a plurality of materials have been proposed as organic semiconductor materials for TFTs but desirable organic semiconductor materials which satisfy all the requirements have not yet been obtained.

Therefore, a need exists for an organic semiconductor material which has excellent transistor characteristics, a solubility to a degree such that an excellent film can be formed in a wet process, and a stable preservability inclusive of oxidation resistance.

SUMMARY OF THE INVENTION

Accordingly, an object of the present invention is to provide an aryl amine polymer which can be used for organic light-emitting devices and organic thin film transistors (TFTs).

Another object of the present invention is to provide an organic TFT which has an excellent carrier mobility, a high-on-off ratio, a high preservability and which can achieve a printable circuit.

Another object of the present invention is to provide a method of manufacturing the organic TFT at a low manufacturing cost using a wet process (such as a spin coating method or a dipping method).

These objects and other objects of the present invention as hereinafter will become more readily apparent can be attained, when singly or in combination thereof, by a polymer having a repeat unit represented by the following formula (I).

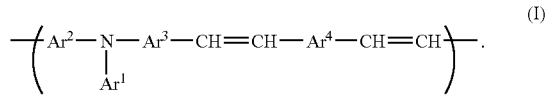

In formula (I), $Ar^1$ represents a substituted aromatic hydrocarbon group or a non-substituted aromatic hydrocarbon group. $Ar^2$ and $Ar^3$ each, independently, represent a divalent aromatic hydrocarbon selected from the group consisting of a substituted or non-substituted monocyclic aromatic hydrocarbon, a substituted or non-substituted non-condensed polycylic aromatic hydrocarbon and a substituted or a non-substituted condensed polycylic aromatic hydrocarbon. Ar4 represents a bivalent group of benzene, thiophene, biphenyl or anthracene, each of which can have a substituent, its use in preparation of a TFT and materials for manufacturing a TFT using one of the polymers.

These and other objects, features and advantages of the present invention will become apparent upon consideration of the following description of the preferred embodiments of the present invention taken in conjunction with the accompanying drawings.

BRIEF DESCRIPTION OF THE DRAWINGS

Various other objects, features and attendant advantages of the present invention will be more fully appreciated as the same becomes better understood from the detailed description when considered in connection with the accompanying drawings in which like reference characters designate like corresponding parts throughout and wherein.

DETAILED DESCRIPTION OF THE INVENTION

Figure 1A:
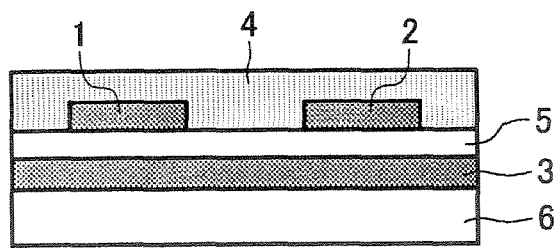
FIGS. 1A to 1D illustrates the schematic cross sectional diagrams of various embodiments of the organic thin film transistor (TFT) of the present invention.

The inventors of the present invention have found that it is effective to use an aryl amine polymer which contains a specific unit, or a combination of the aryl amine polymer and a compound which has a specific structure, to form a semiconductor layer of an organic thin film transistor (TFT).

The present invention will be described in detail referring to the accompanying drawings.

FIGS. 1A, 1B, 1C and 1D illustrate the schematic structures of certain embodiments of the organic TFT of the present invention. The organic semiconductor layer of the organic TFT of the present invention is made of an organic semiconductor material which comprises a polymer containing the repeat unit represented by one of the following formulae or a composition of the polymer and a specific compound. The organic TFT device has a gate electrode, a source electrode and a drain electrode which are spatially separated from each other. An insulation layer is provided between the gate electrode and the organic semiconductor layer. An electric current flowing through the organic semiconductor layer between the source electrode and the drain electrode can be controlled by applying a voltage to the gate electrode.

The device of the present invention has an organic semiconductor layer (hereafter also referred to as an active layer) which comprises a polymer having a repeat unit represented by the following formula (I) as a main component.

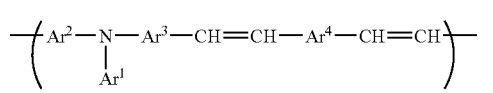

(I)

In formula (I), $Ar^1$ represents a substituted aromatic hydrocarbon group or a non-substituted aromatic hydrocarbon group. $Ar^2$ and $Ar^3$ each, independently, represent a divalent aromatic hydrocarbon selected from the group consisting of a substituted or non-substituted monocyclic aromatic hydrocarbon, a substituted or non-substituted non-condensed polycylic aromatic hydrocarbon and a substituted or a non-substituted condensed polycylic aromatic hydrocarbon. $Ar^4$ represents a bivalent group from benzene, thiophene, biphenyl or anthracene, each of which can have a substituent.)

The repeat unit preferably has the following formula (II).

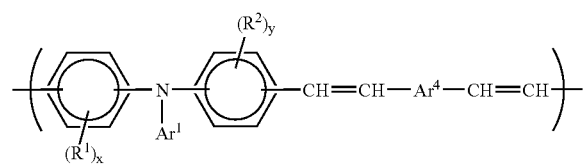

(II)

In formula (II), $Ar^1$ represents a substituted aromatic hydrocarbon group or a non-substituted aromatic hydrocarbon group. $Ar^4$ represents a bivalent group of benzene, thiophene, biphenyl or anthracene, each of which can have a substituent. $R^1$ and $R^2$ each, independently, represent a halogen atom, a substituted or non-substituted alkyl group, a substituted or non-substituted alkoxy group or a substituted or non-substituted alkylthio group. Characters x and y independently represent 0 or an integer of from 1 to 4.

The repeat unit more preferably has the following formula (III).

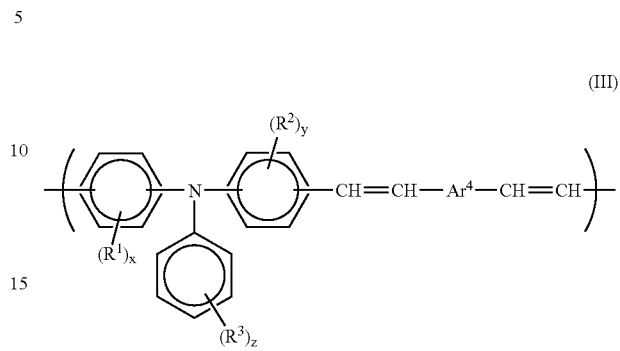

(III)

In formula (III), $Ar^4$ represents a bivalent group of benzene, thiophene, biphenyl or anthracene, each of which can have a substituent. $R^1$ and $R^2$ each, independently, represent a halogen atom, a substituted or non-substituted alkyl group, a substituted or non-substituted alkoxy group, or a substituted or non-substituted alkylthio group. $R^3$ represents a halogen atom, a substituted or non-substituted alkyl group, a substituted or non-substituted alkoxy group, a substituted or non-substituted alkylthio group or a substituted or non-substituted aryl group. Characters x and y independently represent 0 or an integer of from 1 to 4 and z represents 0 or an integer of from 1 to 5.

In another embodiment the repeat unit preferably has the following formula (IV).

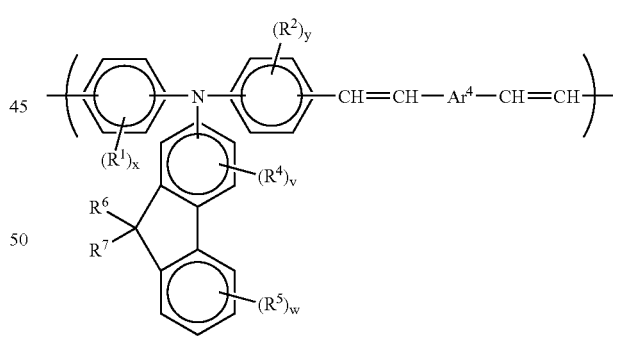

(IV)

In formula (IV), $Ar^4$ represents a bivalent groups of benzene, thiophene, biphenyl or anthracene, each of which can have a substituent. Characters $R^1$, $R^2$, $R^4$, $R^5$, $R^6$ and $R^7$ each, independently, represent a halogen atom, a substituted or non-substituted alkyl group, a substituted or non-substituted alkoxy group, or a substituted or non-substituted alkylthio group. A character v represents 0 or an integer of from 1 to 3 and w, x and y independently represents 0 or an integer of from 1 to 4.

In another embodiment the repeat unit preferably has the following formula (V).

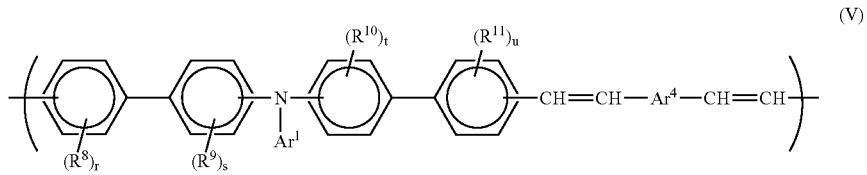
(V)

In formula (V), $Ar^1$ represents a substituted aromatic hydrocarbon group or a non-substituted aromatic hydrocarbon group. $Ar^4$ represents a bivalent group of benzene, thiophene, biphenyl or anthracene, each of which can have a substituent. Characters $R^8$, $R^9$, $R^{10}$ and $R^{11}$ each, independently, represent a halogen atom, a substituted or non-substituted alkyl group, a substituted or non-substituted alkoxy group, or a substituted or non-substituted alkylthio group. Characters r, s, t and u independently represent 0 or an integer of from 1 to 4.

In an additional embodiment the repeat unit preferably has the following formula (VI).

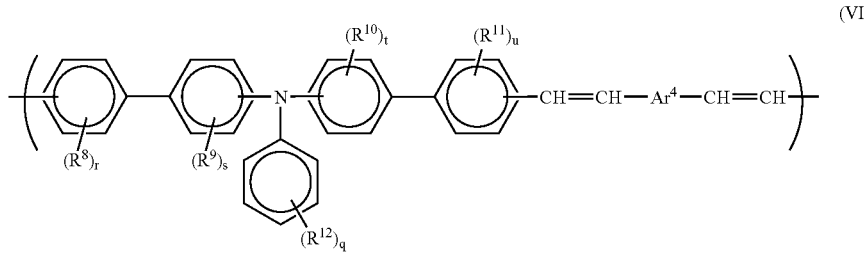
(VI)

In formula (VI), $Ar^4$ represents a bivalent group of benzene, thiophene, biphenyl or anthracene, each of which can have a substituent. Characters $R^8$, $R^9$, $R^{10}$, $R^{11}$ and $R^{12}$ each, independently, represent a halogen atom, a substituted or non-substituted alkyl group, a substituted or non-substituted alkoxy group, or a substituted or non-substituted alkylthio group. Characters q represents 0 or an integer of from 1 to 5 and r, s, t and u independently represent 0 or an integer of from 1 to 4.

It is also preferable that at least one of $Ar^1$, $Ar^2$, $Ar^3$ and $Ar^4$ included in the repeat unit have at least one substituted or non-substituted alkyl group, substituted or non-substituted alkoxy group or substituted or non-substituted alkylthio group, each of which has a straight or branched chain having 2 to 18 carbon atoms.

As another aspect of the present invention, an organic semiconductor material made of one of the polymers and a compound represented by the following formula (VII) is provided.

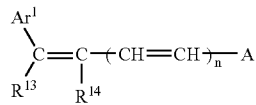
(VII)

In formula (VII), n is 0 or 1. Ar' represents a substituted or non-substituted aryl group. Characters $R^{13}$ and $R^{14}$ each, independently, represent a hydrogen atom, a substituted or non-substituted alkyl group, or a substituted or non-substituted aryl group. Ar' and $R^{13}$ may jointly form a ring. A represents one of a 9-anthryl group, a substituted or non-substituted carbazolyl group, a compound represented by the following formula (1) or a compound represented by the following formula (2).

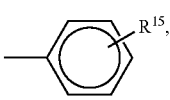
(1)

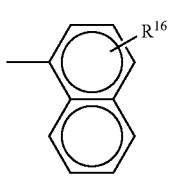
(2)

In formulae (1) and (2), $R^{15}$ and $R^{16}$ each, independently, represent a hydrogen atom, an alkyl group, an alkoxyl group, a halogen atom, or a group represented by the following formula (3).

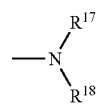
(3)

In formula (3), $R^{17}$ and $R^{18}$ each, independently, represent a substituted or non-substituted alkyl group, or a substituted or non-substituted aryl group and can combine to form a ring.

As yet another aspect of the present invention, a TFT is provided which comprises a substrate, an organic semiconductor layer containing one of the polymers mentioned above and being located overlying the substrate, an electrode pair having a source electrode and a drain electrode and a third electrode.

It is also preferable that the organic TFT contain an organic semiconductor layer which includes the organic semiconductor material mentioned above instead of one of the polymers mentioned above.

It is also preferable that the organic TFT have a repeat unit in which at least one of $Ar^1$, $Ar^2$, $Ar^3$ and $Ar^4$ has at least one substituted or non-substituted alkyl group, substituted or non-substituted alkoxy group and substituted or non-substituted alkylthio group, each of which has a straight chain or a branched chain having 2 to 18 carbon atoms.

It is also preferable that the organic TFT further comprise an insulation layer between the electrode pair and the third electrode.

It is also preferable that the insulation layer included in the organic TFT have a surface energy of from 25 to 40 mN/m.

It is also preferable that the organic semiconductor layer have a surface having a surface roughness not greater than 1 nm in PV value.

As yet another aspect of the present invention, a method of manufacturing an organic TFT is provided which comprises the steps of applying a solution made of a solvent and the polymer on the substrate and drying the solvent of the applied solution to form an organic layer on the substrate.

It is also preferable that the solution used in the method of manufacturing an organic TFT further include a compound having the following formula (VII).

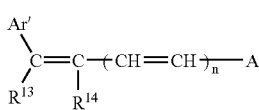

(VII)

In formula (VII), n is 0 or 1. Ar' represents a substituted or non-substituted aryl group. Characters $R^{13}$ and $R^{14}$ each, independently, represent a hydrogen atom, a substituted or non-substituted alkyl group, or a substituted or non-substituted aryl group. Ar' and $R^{13}$ may jointly form a ring. A represents one of a 9-anthryl group, a substituted or non-substituted carbazolyl group, a compound represented by the following formula (1) or a compound represented by the following formula (2).

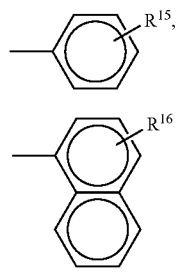

In formulae (1) and (2), $R^{15}$ and $R^{16}$ each, independently, represent a hydrogen atom, an alkyl group, an alkoxyl group, a halogen atom, or a group represented by the following formula (3).

In formula (3), $R^{17}$ and $R^{18}$ each, independently, represent a substituted or non-substituted alkyl group, or a substituted or non-substituted aryl group and can combine to form a ring.

It is also preferable that the method of manufacturing an organic TFT further comprise a step of forming an insulation layer overlying the substrate, wherein the solution is applied on the surface of the insulation layer, and wherein the surface of the insulation layer has a surface energy of from 25 to 40 mN/m.

It is also preferable that the method of manufacturing an organic TFT further comprise a step of subjecting the surface of the insulation layer to a silane coupling treatment before the solution applying step.

It is also preferable that in the method of manufacturing an organic TFT, the organic semiconductor layer has a surface having a surface roughness not greater than 1 nm in PV value.

It is also preferable that in the method of manufacturing an organic TFT, the organic semiconductor layer is applied by a cup spin method.

It is also preferable that in the method of manufacturing an organic TFT, the solvent include tetrahydrofuran as a main component and at least one of toluene, xylene, dioxane, chloroform and dichloromethane. It is also preferable that in the method of manufacturing the organic TFT, the solvent is dried at a temperature not higher than 150° C.

The aromatic ring included in the organic semiconductor material of the present invention may have a substituent. In light of solubility, groups such as alkyl groups, alkoxy groups and alkylthio groups are preferably used as the substituent. As the number of carbon atoms included in such substituents increases, the solubility improves but the carrier mobility reduces. Therefore, it is preferable to select a substituent which can impart desired properties without reducing solubility. Sutiable substituents include alkyl groups, alkoxy groups and alkylthio groups which have 1 to 25 carbon atoms, and more preferably 2 to 18 carbon atoms. The aromatic rings can have a plurality of same or different substituents. Further, these alkyl groups, alkoxy groups and alkylthio groups can include a halogen atom, a cyano group, an aryl group, a hydroxyl group, a carboxyl group, or an aryl group which has a substituent of a straight-chained, branch-chained or cyclic alkyl group, alkoxy group or alkylthio group which has 1 to 12 carbon atoms.

Specific alkyl groups include a methyl group, an ethyl group, a n-propyl group, an i-propyl group, a t-butyl group, a s-butyl group, an i-butyl group, a pentyl group, a hexyl group, a heptyl group, an octyl group, a nonyl group, a decyl group, 3,7-dimethyl octyl group, 2-ethylhexyl group, a trifluoromethyl group, a 2-cyanoetyl group, a benzyl group, a 4-chlorobenzyl group, a 4-methylbenzyl group, a cyclopentyl group and a cyclohexyl group.

Specific examples of alkoxy groups and alkylthio groups include alkylthio groups and alkoxy groups in which an oxygen atom or a sulfur atom is inserted at the bonding site of the alkyl groups mentioned above.

The polymers mentioned above have improved solubility in the presence of alkyl groups, alkoxy groups and alkylthio groups. It is important to improve the solubility of the polymer because polymers having a high solubility show a large tolerance when a film of the polymer is prepared by a wet process. Such a large tolerance increases the number of applicable solutions and widens the range of temperatures when preparing a solution. In addition, the range of temperatures and pressures can be widened when drying the coated liquid. Therefore, the processability of the polymer is improved, increasing the probability of obtaining a thin film which has high purity, uniformity and quality.

Specific examples of $Ar^1$ in formula (I), which is a substituted or non-substituted aromatic hydrocarbon and which can be a monocyclic group, a condensed polycyclic group or a non-condensed polycyclic group, include a phenyl group, a naphthyl group, a pyrenyl group, a fluorenyl group, an azulenyl group, an anthryl group, a triphenylenyl group, a chrysenyl group, a biphenyl group and a terphenyl group.

Specific examples of $Ar^2$ and $Ar^3$ in formula (I), each of which independently represents a divalent aromatic hydrocarbon selected from the group of a substituted or non-substituted monocyclic aromatic hydrocarbon, a substituted or non-substituted non-condensed polycylic aromatic hydrocarbon and a substituted or a non-substituted condensed polycylic aromatic hydrocarbon include bivalent groups from the aromatic groups mentioned above for use in $Ar^1$.

In addition, aromatic groups of $Ar^1$, $Ar^2$, $Ar^3$ and $Ar^4$ can have the following substituents:

(1) a halogen atom, a trifluoromethyl group, a cyano group, a nitro group;
(2) a straight or branched alkyl group or an alkoxy group, which groups may include a halogen atom, a cyano group, a phenyl group, a hydroxyl group, a carboxyl group, an alkoxy group and/or an alkylthio group as a substituent;
(3) an aryloxy group. Specific examples thereof include aryloxy groups which include a phenyl group and a naphthyl group. These aryloxy groups may include a halogen atom or a straight or a branched alkyl group, alkoxy group or alkylthio group, which has 1 to 25 carbon atoms, as a substituent. Specific examples of such aryloxy groups include a phenoxy group, a 1-naphtyloxy group, a 2-naphthyloxy group, a 4-methylphenoxy group, a 4-methoxyphenoxy group, a 4-chlorophenoxy group and a 6-methyl-2-naphthyloxy group;
(4) an alkylthio group or an arylthio group. Specific examples of the alkylthio groups and the arylthio groups include a methylthio group, an ethylthio group, a phenylthio group and a p-methylphenylthio group;
(5) an alkyl-substituted amino group. Specific examples of the groups include a diethylamino group, a N-methyl-N-phenylamino group, a N,N-diphenylamino group, a N,N-di(p-tolyl) amino group, a dibenzylamino group, a piperidino group, a morpholino group and a julolidyl group; and
(6) an acyl group. Specific examples thereof include an acetyl group, a propionyl group, a butyryl group, a malonyl group and a benzoyl group.

The repeat unit represented by formula (I) is preferably a unit represented by the following formula (II).

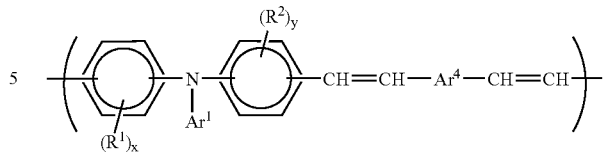

In formula (II), $Ar^1$ represents a substituted aromatic hydrocarbon group or a non-substituted aromatic hydrocarbon group. $Ar^4$ represents a bivalent group from benzene, thiophene, biphenyl or anthracene, each of which can have a substituent. $R^1$ and $R^2$ each, independently, represent a halogen atom, a substituted or non-substituted alkyl group, a substituted or non-substituted alkoxy group or a substituted or non-substituted alkylthio group. Characters x and y independently represent 0 or an integer of from 1 to 4.

Alternatively the repeat unit represented by formula (I) may be a unit represented by the following formula (V).

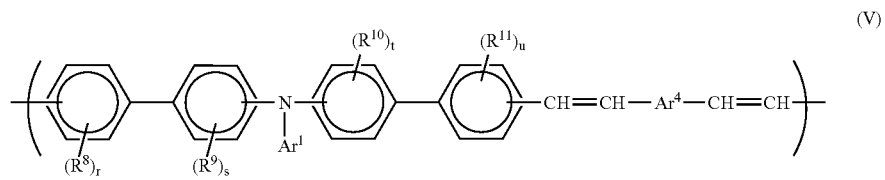

In formula (V), $Ar^1$ represents a substituted aromatic hydrocarbon group or a non-substituted aromatic hydrocarbon group. $Ar^4$ represents a bivalent group from benzene, thiophene, biphenyl or anthracene, each of which can have a substituent. $R^8$, $R^9$, $R^{10}$ and $R^{11}$ each, independently, represent a halogen atom, a substituted or non-substituted alkyl group, a substituted or non-substituted alkoxy group, or a substituted or non-substituted alkylthio group. Characters r, s, t and u each, independently, represent 0 or an integer of from 1 to 4.

The repeat unit represented by formula (II) is preferably a unit represented by the following formula (III).

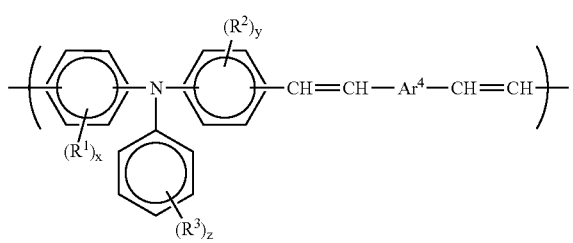

In formula (III), $Ar^4$ represents a bivalent group from benzene, thiophene, biphenyl or anthracene, each of which can have a substituent. $R^1$ and $R^2$ each, independently, represent a halogen atom, a substituted or non-substituted alkyl group, a substituted or non-substituted alkoxy group, or a substituted or non-substituted alkylthio group. $R^3$ represents a halogen atom, a substituted or non-substituted alkyl group, a substituted or non-substituted alkoxy group, a substituted or non-substituted alkylthio group or a substituted or non-substituted aryl group. Characters x and y each, independently, represent 0 or an integer of from 1 to 4 and z represents 0 or an integer from 1 to 5.

Alternatively the repeat unit represented by formula (II) may be a unit represented by the following formula (IV).

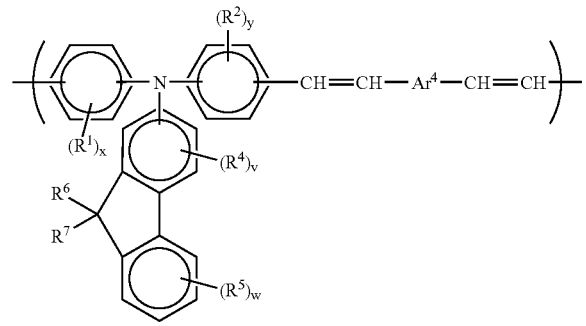

In formula (IV), $Ar^4$ represents a bivalent group from benzene, thiophene, biphenyl or anthracene, each of which can have a substituent. $R^1$, $R^2$, $R^4$, $R^5$, $R^6$ and $R^7$ each, independently, represent a halogen atom, a substituted or non-substituted alkyl group, a substituted or non-substituted alkoxy group, or a substituted or non-substituted alkylthio group. Character v represents 0 or an integer of from 1 to 3 and w, x and y each, independently, represents 0 or an integer of from 1 to 4.

Alternatively the repeat unit represented by formula (V) may be a unit represented by the following formula (VI).

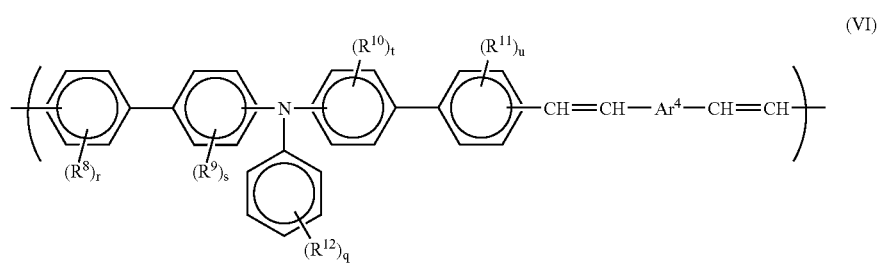

In formula (VI), $Ar^4$ represents a bivalent group from benzene, thiophene, biphenyl or anthracene, each of which can have a substituent. $R^8$, $R^9$, $R^{10}$, $R^{11}$ and $R^{12}$ each, independently, represent a halogen atom, a substituted or non-substituted alkyl group, a substituted or non-substituted alkoxy group, or a substituted or non-substituted alkylthio group. Character q represents 0 or an integer of from 1 to 5 and r, s, t and u each, independently, represent 0 or an integer of from 1 to 4.

Specific examples of the repeat unit represented by formula (I) include, but not limited to, the following repeat units.

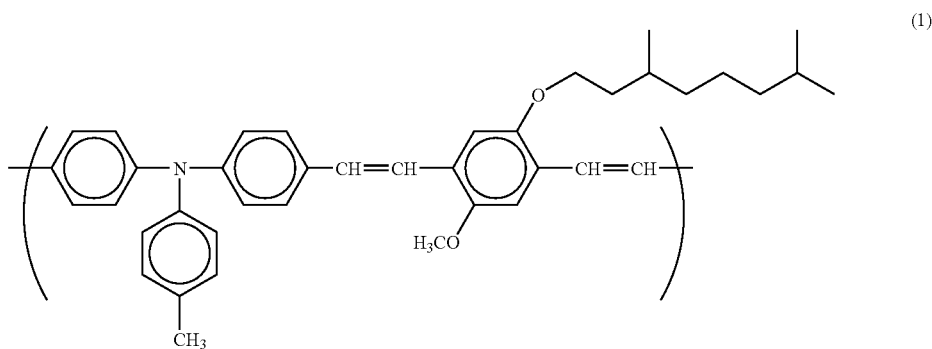

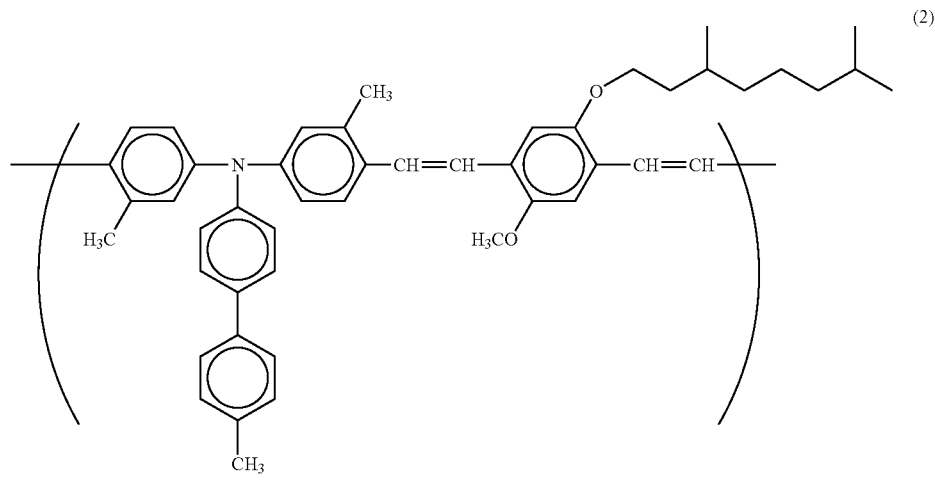
(2)
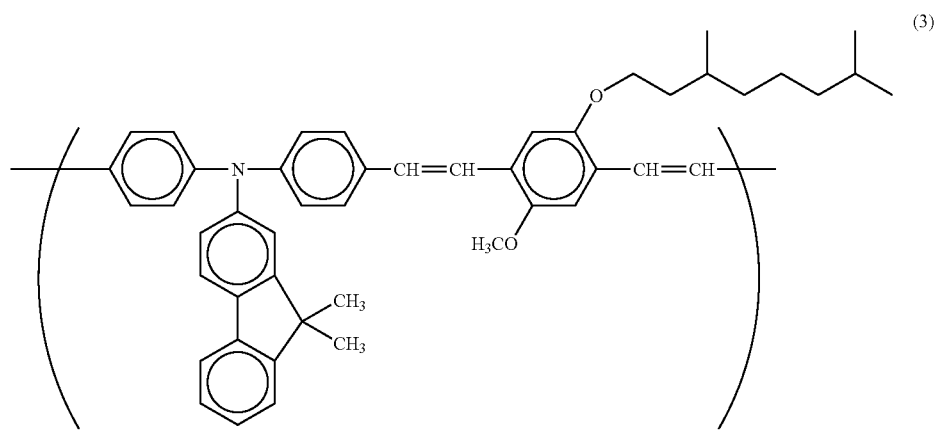
(3)
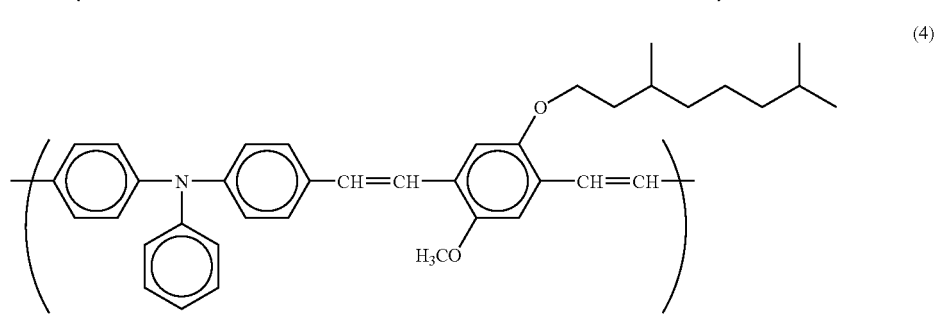
(4)
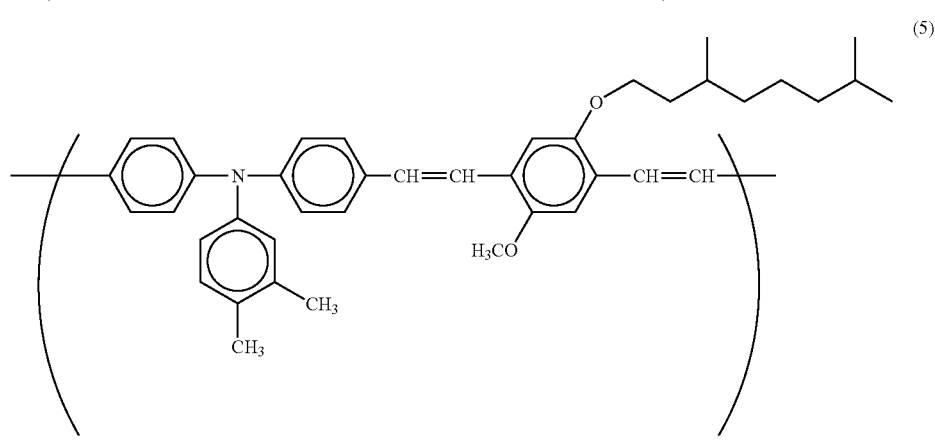
(5)

-continued
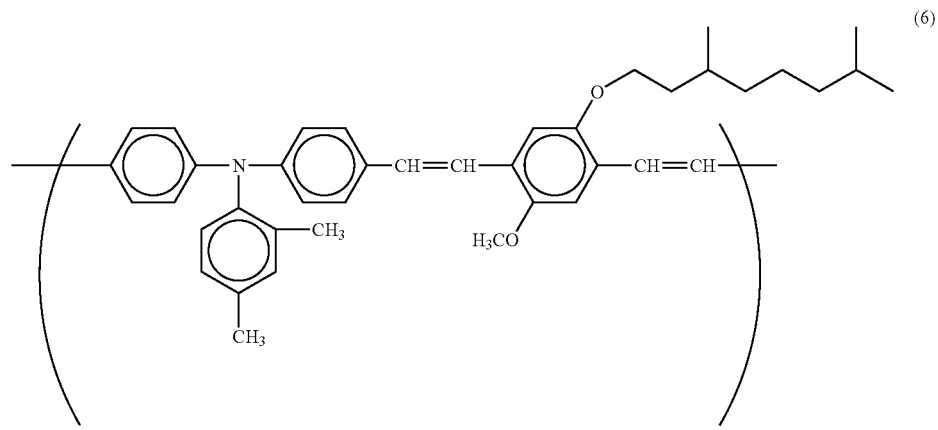
(6)
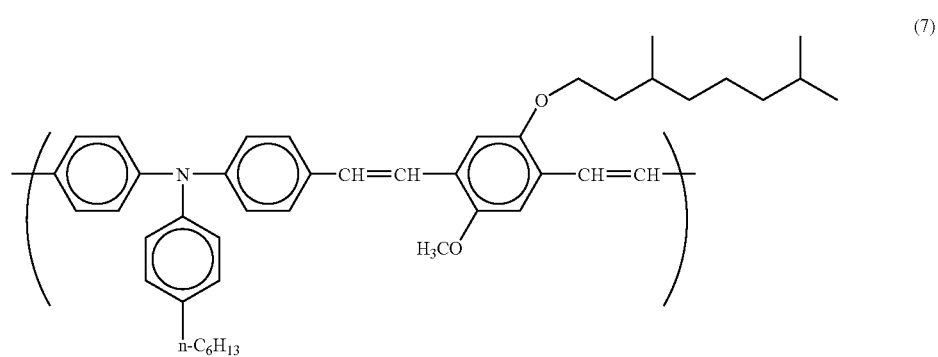
(7)
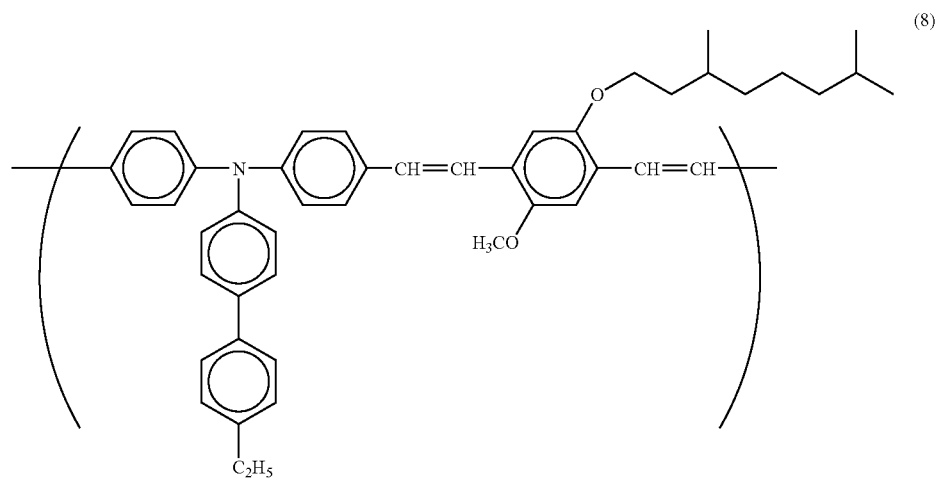
(8)
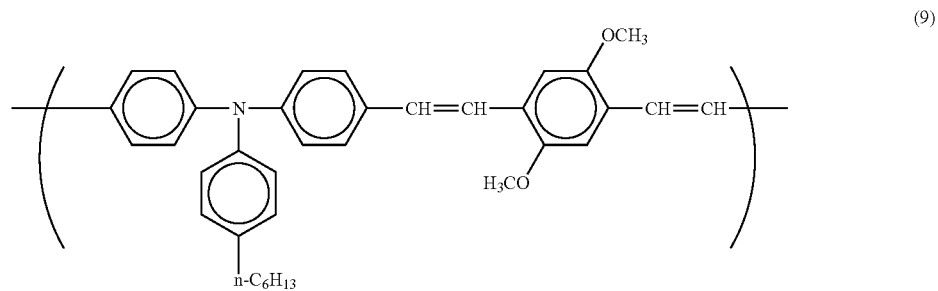
(9)

-continued
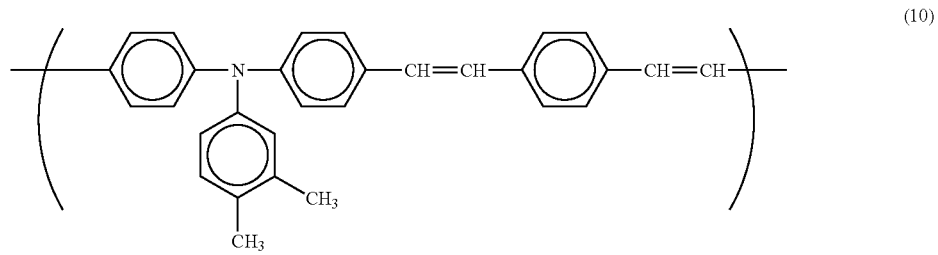
(10)
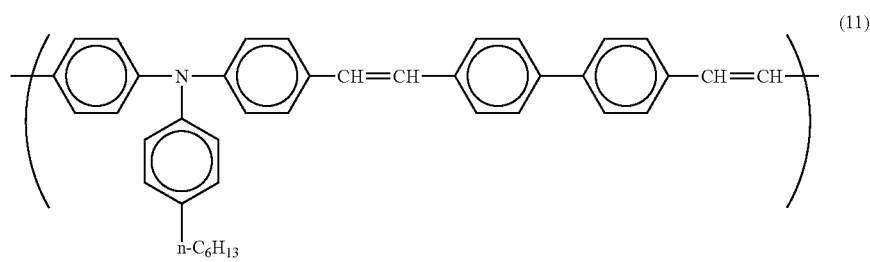
(11)
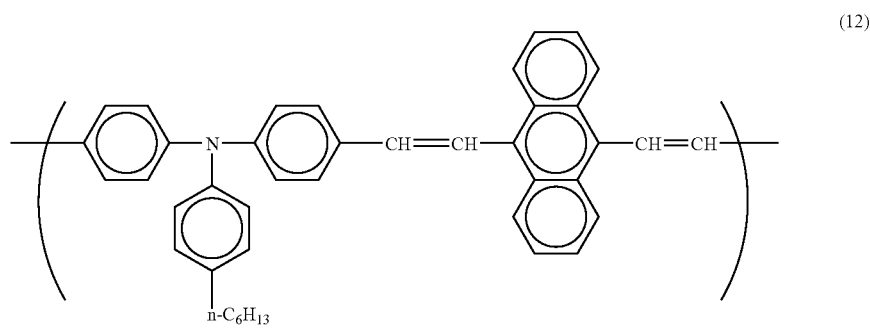
(12)
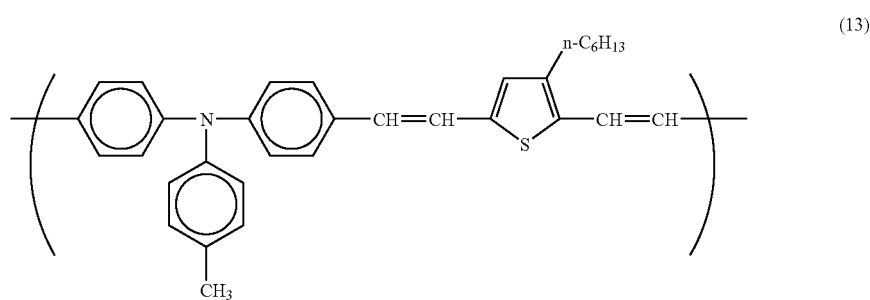
(13)
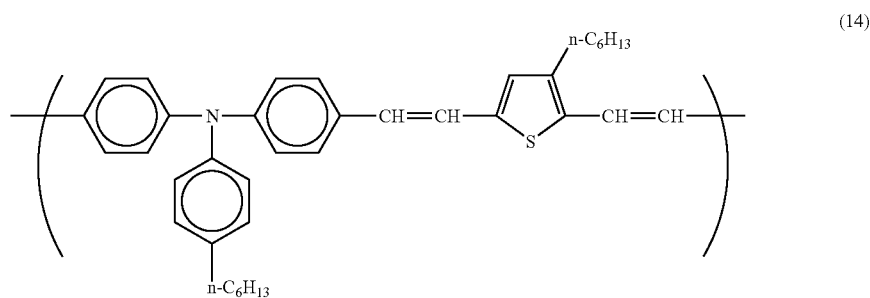
(14)

-continued
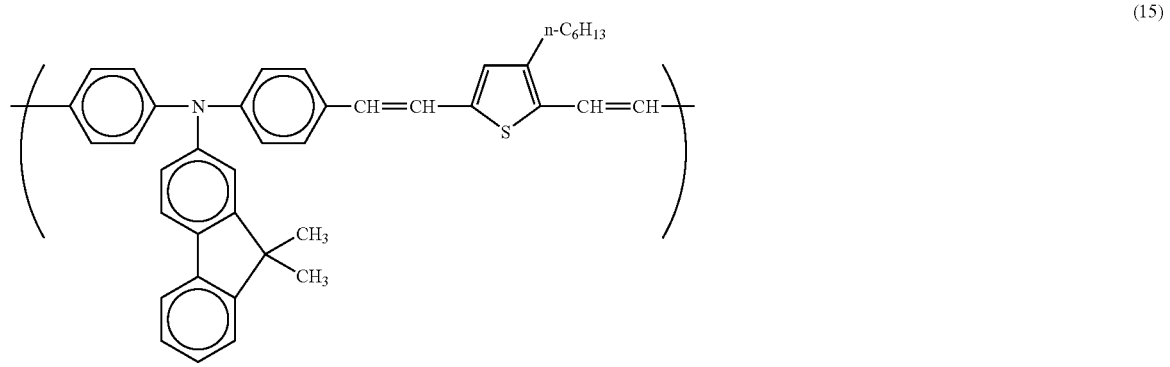
(15)
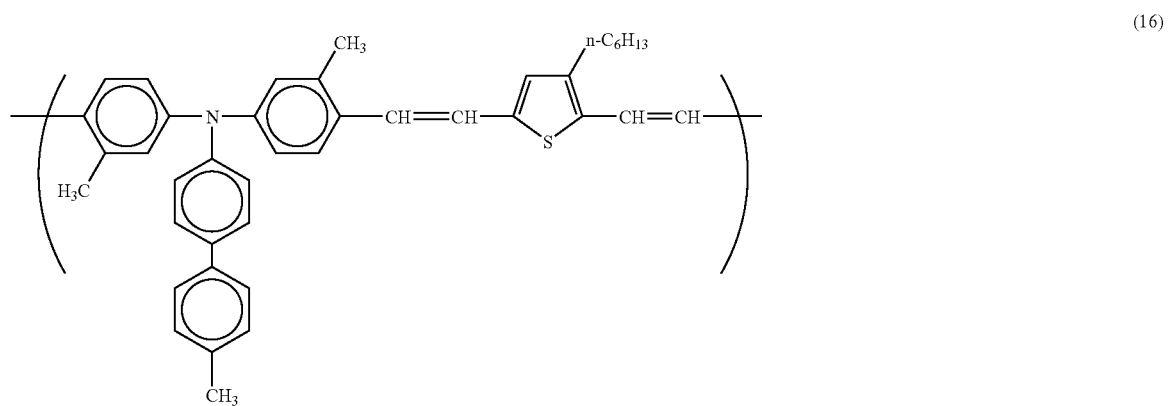
(16)
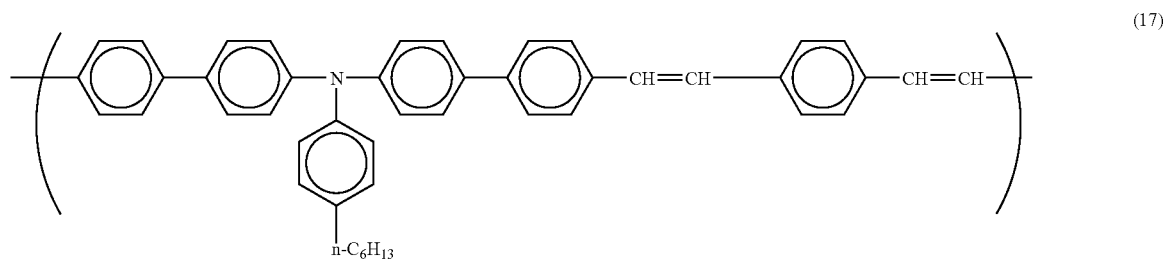
(17)
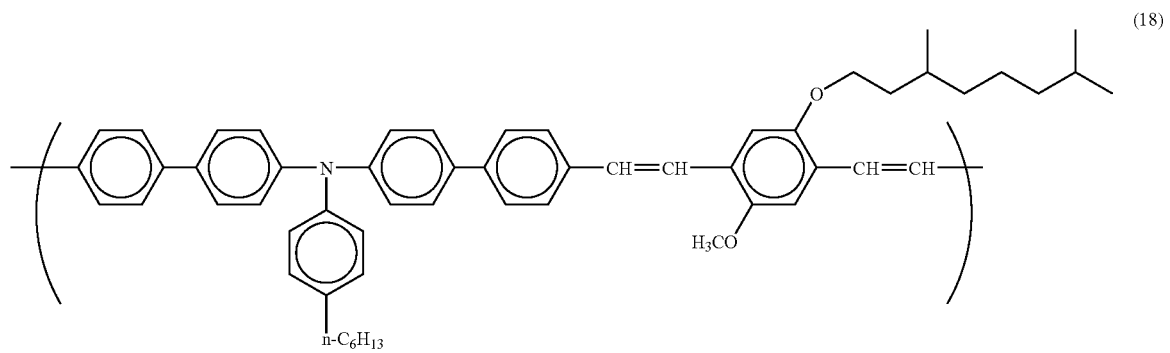
(18)

-continued

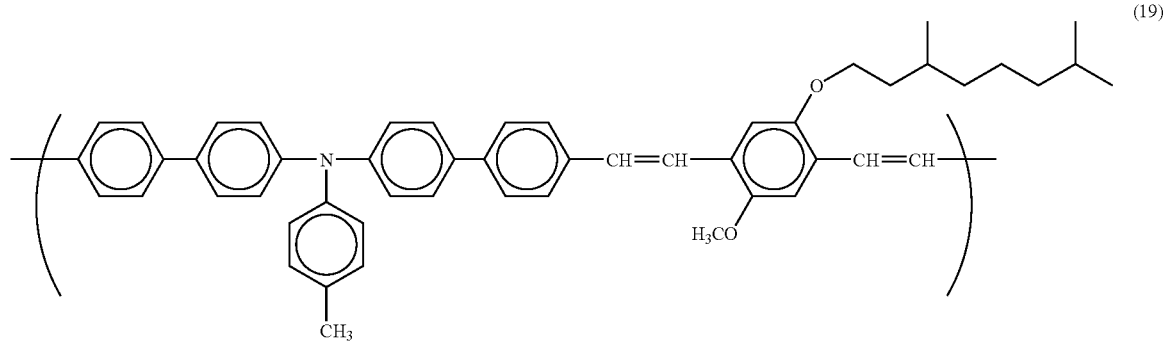
(19)

These repeat units can be formed by known chemical reactions such as a Wittig-Horner reaction using an aldehyde and a phosphonate, a Wittig reaction using an aldehyde and a phosphonium salt, a Heck reaction using a vinyl substitution product and a halogenated compound or an Ullmann reaction using an amine and a halogenated compound. Especially, the Wittig-Horner reaction and the Wittig reaction are effective in terms of easiness of controlling the reactions.

As an example of the methods of manufacturing the polymer of the present invention, a method using a Wittig-Horner reaction will be described.

As shown in the following chemical reaction, the polymer of the present invention can be obtained by mixing a solution in which a phosphonate ester compound and an aldehyde compound are present in a stoichiometrically equivalent amount with a base which is present in an amount not less than double the molar amount of the aldehyde compound and the phosphonate ester compound to promote a polymerization.

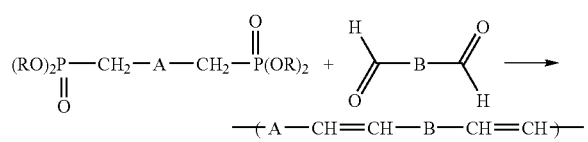

When preparing the aryl amine polymer of the present invention, a combination of a monomer including an aryl amine moiety as A and a monomer including $Ar^4$, which is a bivalent group from benzene, thiophene, biphenyl or anthracene, each of which can have a substituent, as B or another combination of a monomer including $Ar^4$ as A and a monomer including an aryl amine moiety as B can be used.

When preparing the dialdehyde compound shown above, various kinds of known reactions can be applied. Specific examples of such reactions include, but not limited to, a Vilsmeier reaction shown below;

a reaction shown below using an aryl lithium compound and a formylation agent such as dimethylformamide (DMF), N-formylmorpholine or N-formylpiperidine:

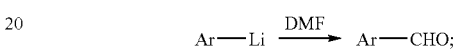

a Gatterman reaction shown below:

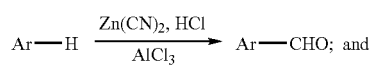

various kinds of oxidation reactions of a hydroxymethyl compound shown below:

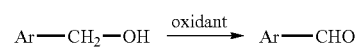

The dialdehyde compounds can be prepared using these reactions.

When preparing the polymer having the repeat unit represented by formula (V), a dialdehyde compound which is obtained by performing a Suzuki-Miyaura reaction (e.g., M. Miyaura, A. Suzuki et al. Synth. Commun. vol. 11, 513 (1981)) known as a cross coupling reaction of an aryl boron compound and an organic halogen compound using a palladium compound as a catalyst, can be used, as shown in the following chemical reaction:

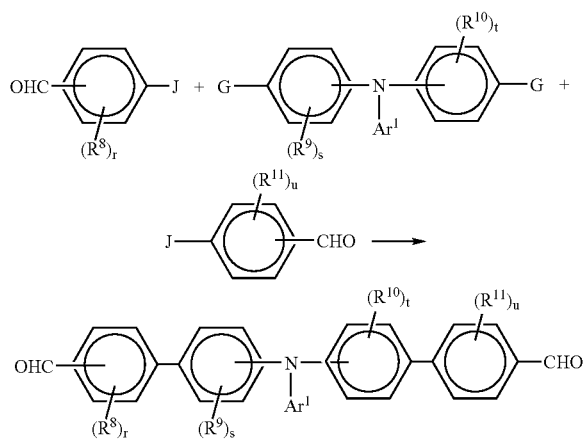

In this reaction, J represents a boron acid group or a boron acid ester group and G represents a halogen atom.

In light of reaction, the halogen atom represented by G is preferably I or Br. Specific examples of the palladium containing catalysts include Pd $(PPh_3)_4$, $PdCl_2$ $(PPh_3)_2$, Pd $(OAc)_2$ and $PdCl_2$. In general, Pd $(PPh_3)_4$ is preferably used.

A base is especially preferred to prepare the polymer of the present invention. Desirable results are obtained by using a relatively weak base such as $Na_2CO_3$ and $NaHCO_3$. However, it is also effective to use a strong base such as Ba $(OH)_2$ and $K_3PO_4$ to avoid a negative impact of steric hindrance etc. Specific examples of other bases include sodium hydroxide, potassium hydroxide and metal alkoxide such as potassium t-butoxide, sodium t-butoxide, lithium t-butoxide, potassium 2-methyl-2-butoxide, sodium 2-methyl-2-butoxide, sodium methoxide, sodium ethoxide, or potassium ethoxide, potassium methoxide. Organic bases such as triethylamine can also be used.

Specific examples of the solvents for use in the reaction include, but not limited to, alcohols such as methanol, ethanol, isopropanol, butanol and 2-methoxiethanol, ethers such as 1,2-dimethoxiethane and bis(2-methoxyethyl) ether, cyclic ethers such as dioxane and tetrahydrofuran, and others such as benzene, toluene, xylene, dimethylsulfoxido, N,N-dimethylformamide, N-methylpyrrolidone and 1,3-dimethyl-2-imidazolidinone.

Also various known reactions can be used to prepare phosphonate diester compounds for use in the Wittig-Horner reaction mentioned above. The Michaelis-Arbuzov reaction shown below is particularly easy to perform. In the reaction, X represents a halogen atom.

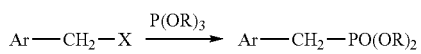

The base used in the Wittig-Horner reaction mentioned above is not limiting as long as the base forms a phosphonate carbanion. Specific examples of such bases include metal alkoxidos such as potassium t-butoxide, sodium t-butoxide, lithium t-butoxide, potassium 2-methyl-2-butoxide, sodium 2-methyl-2-butoxide, sodium methoxide, sodium ethoxide, potassium methoxide and potassium methoxide, metal hydrides such as sodium hydride and potassium hydride, and organic lithium compounds such as methyl lithium, ethyl lithium, propyl lithium, n-butyl lithium, s-butyl lithium, t-butyl lithium, phenyl lithium, lithium naphthylido, lithium amide and lithium diisopropyl amide.

Normally the amount of the base used in the reaction is determined such that the base reacts with the polymerization active points of a phosphonate ester compound but there is no problem if an excessive amount of the base is used.

The bases mentioned above can be added in the reaction system in the form of a solid or a suspension. However, in order to obtain a polymer having an excellent uniformity, it is preferable to add the base in the state of a homogeneous solution.

A proper solvent is selected for resolving the base to make a stable solution with the base. In addition, it is preferable to use a solvent in which the base is highly soluble. Also it is preferable to use a solvent capable of dissolving the polymer to be made. Further, it is preferable to use a solvent in which the final polymer is highly soluble. Solvents such as known alcohols, ethers, amines and hydrocarbons can be used depending on the characteristics of the base and the prepared polymer.

Various combinations of the bases and the solvents which uniformly dissolve the bases can be used. Specific examples of these combinations include, but not limited to, a methanol solution of sodium methoxide, an ethanol solution of sodium ethoxide, a 2-propanol solution of potassium t-butoxide, a 2-methyl-2-propanol solution of potassium t-butoxide, a tetrahydrofuran solution of potassium t-butoxide, a dioxane solution of potassium t-butoxide, a hexane solution of n-butyl lithium, an ether solution of methyl lithium, a tetrahydrofuran solution of lithium t-butoxide, a cyclohexane solution of lithium diisopropyl amide and a toluene solution of potassium bistrimethylsilyl amide. Several of the solutions mentioned above can be easily obtained from the market. In light of performance of a moderate reaction and easiness of handling, it is preferable to use an ether solution of metal t-butoxide and is more preferable to use a tetrahydrofuran solution of potassium t-butoxide.

In the polymerization reaction mentioned above, there is no limit to the addition order of the solutions. Namely a base solution can be added to a solution of the phosphonate ester compound and the aldehyde compound or vice versa or both solutions can be added to the reaction system at the same time.

The time required for the polymerization reaction mentioned above can be determined depending on the reaction properties of the monomers used, the desired molecular weight of the polymer and so on. A range of from 0.2 to 30 hours is preferable.

The polymerization reaction mentioned above proceeds well at room temperature and there is no specific need to control the reaction temperature therefor. However, the solution can be heated to improve the reaction efficiency or can be cooled down to perform the reaction in a moderate condition.

In addition, a molecular weight controlling agent can be added for controlling the molecular weight or an end capping agent serving as an end modification group can also be added for modifying the end of the polymer, at the start of or in the middle of the polymerization reaction. Therefore, the aryl amine polymer of the present invention may have a substituent based on the end capping agent at the end thereof.

As the molecular controlling agent and the end capping agent, compounds having one active group such as benzyl phosphonate diethyl or benzaldehyde can be mentioned.

Further, it is also possible to add a small amount of a branching agent at the time of polymerization to improve the mechanical characteristics. The applicable branching agents are compounds having more than two different or same reactive groups. These branching agents can be used alone or in combinations of two or more.

The thus obtained aryl amine polymer is used after eliminating the base used in the polymerization, non-reacted monomers, the end capping agent, and impurities such as inorganic salts which are produced in the polymerization. For these refinement operations, known methods such as reprecipitation, extraction, Soxhlet extraction, ultrafiltration and dialysis can be used.

The polymers represented by the aforementioned formulae preferably have a polystyrene equivalent weight average of from 1,000 to 1,000,000, and more preferably from 2,000 to 500,000. When the polymer has too small a molecular weight, the properties of the formed film deteriorate such that the film tends to crack and therefore the film is not practically usable. A polymer having too large a molecular weight is also not practically usable because the solubility of the polymer in a common organic solvent decreases and the viscosity of the polymer increases, resulting in difficulty in application of the solution.

In addition, not only the polymer mentioned above but also a composition of the polymer and a compound represented by the following formula (VII) can be used as the organic semiconductor material of the organic semiconductor layer in the device of the present invention. The composition comprising the polymer represented by formula (I) and the compound represented by the following formula (VII) can improve properties of charge transport.

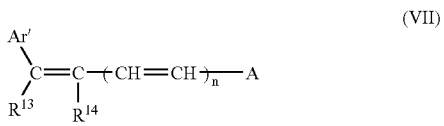

(VII)

In formula (VII), n is 0 or 1. Ar' represents a substituted or non-substituted aryl group. $R^{13}$ and $R^{14}$ each, independently, represent a hydrogen atom, a substituted or non-substituted alkyl group, or a substituted or non-substituted aryl group. A' and $R^{13}$ may optionally jointly form a ring. A represents a 9-anthryl group, a substituted or non-substituted carbazolyl group, a compound represented by the following formula (1), or a compound represented by the following formula (2):

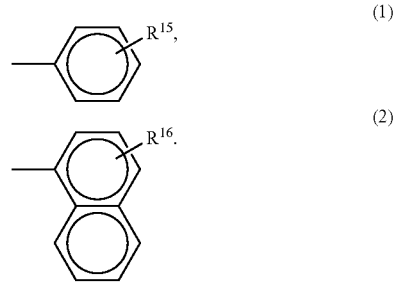

In formulae (1) and (2), $R^{15}$ and $R^{16}$ each, independently, represent a hydrogen atom, an alkyl group, alkoxyl group, a halogen atom, or a group represented by the following formula (3).

In formula (3), $R^{17}$ and $R^{18}$ each, independently, represent a substituted or non-substituted alkyl group, or a substituted or non-substituted aryl group or can combine to form a ring.

Specific examples of the compounds represented by formula (VII) include a 4-diphenyl aminostilbene, a 4-di-p-tolylaminostilbene, a 4'-diphenylamino-α-phenylstilbene, a 4'-di-p-tolylamino-α-phenylstilbene, a 9-styrylantracene, a 3-styryl-9-ethylcarbazole, a 1,1-diphenyl-4-diethylaminophenyl-1,3-butadiene, a 5-[4-(di-p-tolylamino)benzylidene]-5H-dibenzo[a,d]cycloheptane, and a 5-[4-(di-p-tolylamino)benzylidene]-5H-dibenzo[a,d]cycloheptene. These specific examples are not provided for the purpose of restriction and are not intended to be limiting. In addition, published examined Japanese Patent Applications Nos. 2-24864, 3-39306 and 4-66023 have disclosed specific examples of the compounds represented by formula (VII).

The organic semiconductor layer of a device according to the present invention is preferably formed in the following steps: dissolving or dispersing a polymer which has the repeat unit represented by formula (I) or a composition of a polymer which has the repeat unit represented by formula (I) and a compound represented by formula (VII) in a solvent such as dichlorometane, tetrahydrofuran, chloroform, toluene, dichlorobenzene or xylene, to obtain a solution having a desired concentration; and forming the semiconductor layer by coating the obtained solution using a wet film-forming method.

Specific examples of such wet methods for forming a thin organic semiconductor layer include, but not limited to, spin coating methods, dipping methods, blade coating methods, spray application methods, casting methods, ink jet methods and printing methods. For these various kinds of film-forming methods, a proper solvent can be selected by one of ordinary skill from the solvents mentioned above.

The spin coating methods use the centrifugal force of the rotation of a substrate to form a film thereon. In this method, a uniform film may not be obtained when the solvent dries too rapidly. Therefore, when forming a film by a spin coating method, a cup spin method is preferable.

The cup spin method includes the steps of: (1) fixing a substrate on the bottom surface of a cup (container), (2) locating a coating solution therein, (3) covering the container (putting a lid on) and (4) spinning the container to form a film. By doing this, the covered space in the container is saturated with the solvent vapor and thereby the solvent does not dry rapidly.

The organic semiconductor material of the present invention is not actually oxidized in the air when the material is in the state of solid form or liquid.

In the organic TFTs of the present invention, the organic semiconductor layer formed of the polymer mentioned above is sandwiched by the source 1 and the drain 2 in any structure of FIGS. 1A to 1D. The thickness of the semiconductor layer is set to form a uniform film free from gaps and holes which adversely affect carrier mobility of the material. Therefore, the thickness of the organic semiconductor layer is preferably from about 5 to about 200 nm and more preferably about 5 nm to about 100 nm.

There is a relationship between the surface roughness and the transistor characteristics of the organic semiconductor layer. The flatter the surface of the layer, the better the carrier mobility of the layer (i.e., the better the transistor physicality). As a result of studying the surface roughness and the mobility in various conditions for film-forming, it is found that a flat film having a PV (peak to valley) value not greater than 1 nm is preferable.

Measurement and determination of the surface roughness are as follows:
(1) the profile of the surface is determined with a scanning probe atomic force microscope (AFM) in a scanning area range of 0.5 μm×0.5 μm; and
(2) after baseline correction, the height difference between the highest (peak) and the lowest (valley) in the scanned area is determined (i.e., PV (peak to valley value)) to quantify the flatness level of the film.

When a film is formed by drying a coated liquid, flatness thereof varies depending on the solvent used in the liquid.

Specific examples of the important characteristics of such organic solvents are as follows:
solubility of a solute;
surface tension;
viscosity; and
vapor pressure.

As a result of measuring the flatness of a formed film using various kinds of organic solvents, tetrahydrofuran (THF) is found to be most preferred with respect to making the film flattest.

Further, considering the drying process of a coated liquid, it is preferable to use a solvent mixture rather than a single-component solvent in terms of controlling the solvent vapor state. In the present invention, preferred results are obtained by adding another solvent as a second solvent to THF serving as main component.

When solvents remain in the formed film, the semiconductor performance is affected. Therefore, the remaining solvents are removed by subjecting the film to a post baking treatment.

Heat drying methods are effective to remove such remaining solvents. However, the semiconductor materials of the present invention have a specific upper limit to the heat treatment temperature thereof because the heating temperature has a relationship with the mobility of the resultant semiconductor layer. Therefore, it is preferable to dry these materials at a treatment temperature not higher than 150° C.

The organic TFT of the present invention is on a substrate, which is made of any conventional substrate material, preferably glass, silicon or plastic. When it is desired for the organic TFT device to have properties such as flexibility, light weight and low price, a plastic substrate is preferably used. When a conductive substrate is used for the organic TFT having a structure illustrated in FIG. 1A or 1B, the substrate can function as the gate 3.

The insulation layer 5 is located between the gate 3 and the semiconductor layer 4. Suitable materials for use in the insulation layer 5 include known materials. Specific examples of such insulation materials include, but not limited to, inorganic materials such as silicon oxides, silicon nitrides, aluminum oxides, aluminum nitrides or titanium oxides. When a flexible, light weight and low price device is desired, polymers such as polyimides, polyvinylalcohols, polyvinylphenol, polyesters, polyethylenes, polyphenylene sulfides, polyparaxylylenes, polyacrylic nitrites or cyanoethyl pullulans, and organic materials such as various types of insulative Langumuir-Blodgett (LB) films can be mentioned. Also these materials can be used alone or in combination. There is no specific limitation to such materials but the materials having a high dielectric constant and a low conductivity are preferable.

There is no specific limit to methods of forming an insulation layer. Specific examples of the methods of forming such insulation layers include, but not limited to, CVD methods, plasma CVD methods, plasma polymerization methods, vapor deposition methods, spin coating methods and Langumuir-Blodgett (LB) methods. In addition, when a silicon containing compound is selected for the substrate which can also function as a gate, silicon oxides which are obtained by thermally oxidizing silicon are preferably used.

Further, when an organic semiconductor layer is placed on such an insulation layer by a wet film-forming process, the insulation layer preferably has a surface energy of from 25 to 40 mN/m. When the insulation layer has a surface energy that is too high or low, the device obtained is not optimal. The surface energy of the insulation layer can be determined by using a Zisman plot.

In order to adjust properties of the insulation layer surface such as the wetting property, surface treatments such as alkylation can be performed. Specific examples of surface finishing agents for use in such surface treatments include a finishing agent which is stuck onto the surface of the insulation layer or which is chemically bonded with a functional group contained therein. The surface of a material can be modified with, for example, a silane coupling agent using the following processes:

(1) locating the material in a sealed container filled with a vapor of hexamethyldisilazane (HMDS);
(2) allowing the material to stand for a desired period of time at room temperature; and
(3) subjecting the material to a post baking treatment.

The device of the present invention has three electrodes (a source, a drain and a gate) which are spatially separated from each other. The gate contacts with the insulation layer. Each electrode can be formed on a substrate by using a known technique.

There is no specific limit to materials for use in the source, the drain and the gate as long as the materials are conductive. Specific examples of such materials include Pt, Au, Ag, Ni, Cr, Cu, Fe, Sn, Sb, Pb, Ta, In, Al, Zn, Mg, and alloys thereof. In addition, inorganic or organic semiconductors, the conductivity of which can be improved by doping a material such as silicon single crystal, polysilicons, amorphous silicons, Ge, graphite, polyacetylenes, polyparaphenylenes, polythiophenes, polypryyroles, polyanilines, polythienylene vinylenes and polyparaphenylene vinylenes can be mentioned. It is preferable that the source and the drain be ohmically connected to the semiconductor layer at the contact area thereof.

Having generally described this invention, further understanding can be obtained by reference to certain specific examples which are provided herein for the purpose of illustration only and are not intended to be limiting. In the descriptions in the following examples, the numbers represent weight ratios in parts, unless otherwise specified.

EXAMPLES

Example 1

Synthesis of Polymer 1

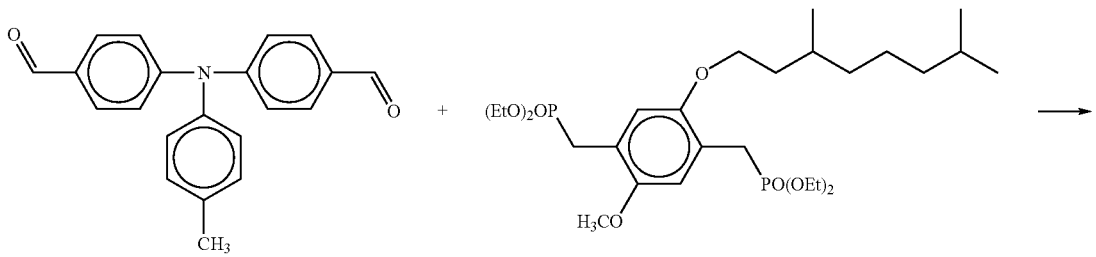

-continued

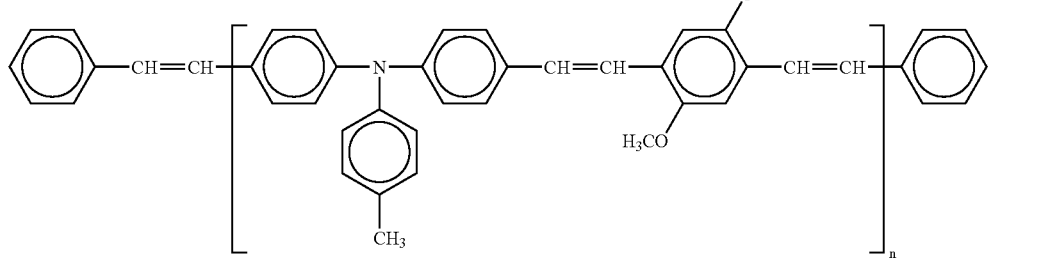

Polymer 1

A polymer 1 was prepared by: placing 0.852 g (2.70 mmol) of the dialdehyde illustrated above and 1.525 g (2.70 mmol) of the diphosphonate illustrated above in a 100 ml four-neck flask; performing nitrogen gas replacement; adding 75 ml of tetrahydrofuran to the mixture; to the solution, dropping 6.75 ml (6.75 mmol) of a tetrahydrofuran solution of 1.0 mol dm$^{-3}$ of potassium t-butoxide; stirring the solution for two hours at room temperature; adding benzylphosphonatediethyl and benzaldehyde to the resultant in this order: further stirring for another two hours; adding about 1 ml of acetic acid to the resultant; after finishing the reaction, washing the solution with water; evaporating the solution to eliminate the solvent under reduced pressure; and then reprecipitating the resultant by dissolving the resultant in a tetrahydrofuran and methanol solution for purification thereof. The weight of the thus obtained polymer 1 was 1.07 g and the yield thereof was 73%.

Elemental analysis value (theoretical value): C, 84.25% (84.02%); H, 8.20% (7.93%); N, 2.33% (2.45%).

The glass transition temperature of the polymer 1 obtained using differential scanning calorimetry (DSC) was 116.9° C.

The polystyrene-conversion number average molecular weight and weight average molecular weight measured by gel permeation chromatography (GPC) were 8,500 and 20,000, respectively.

Figure 2:
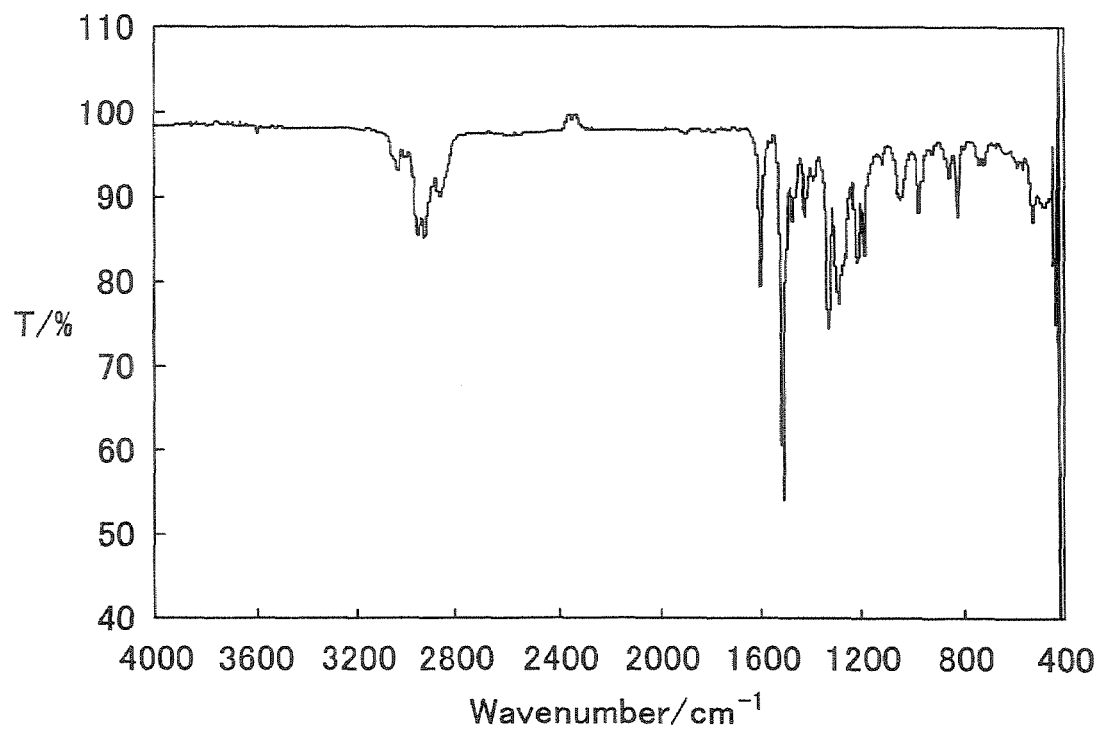
FIG. 2 illustrates an infrared absorption spectrum of the polymer obtained in Example 1.

Infrared absorption spectrum (NaCl cast film) of the polymer 1 is shown in FIG. 2.

Example 2

Synthesis of Polymer 2

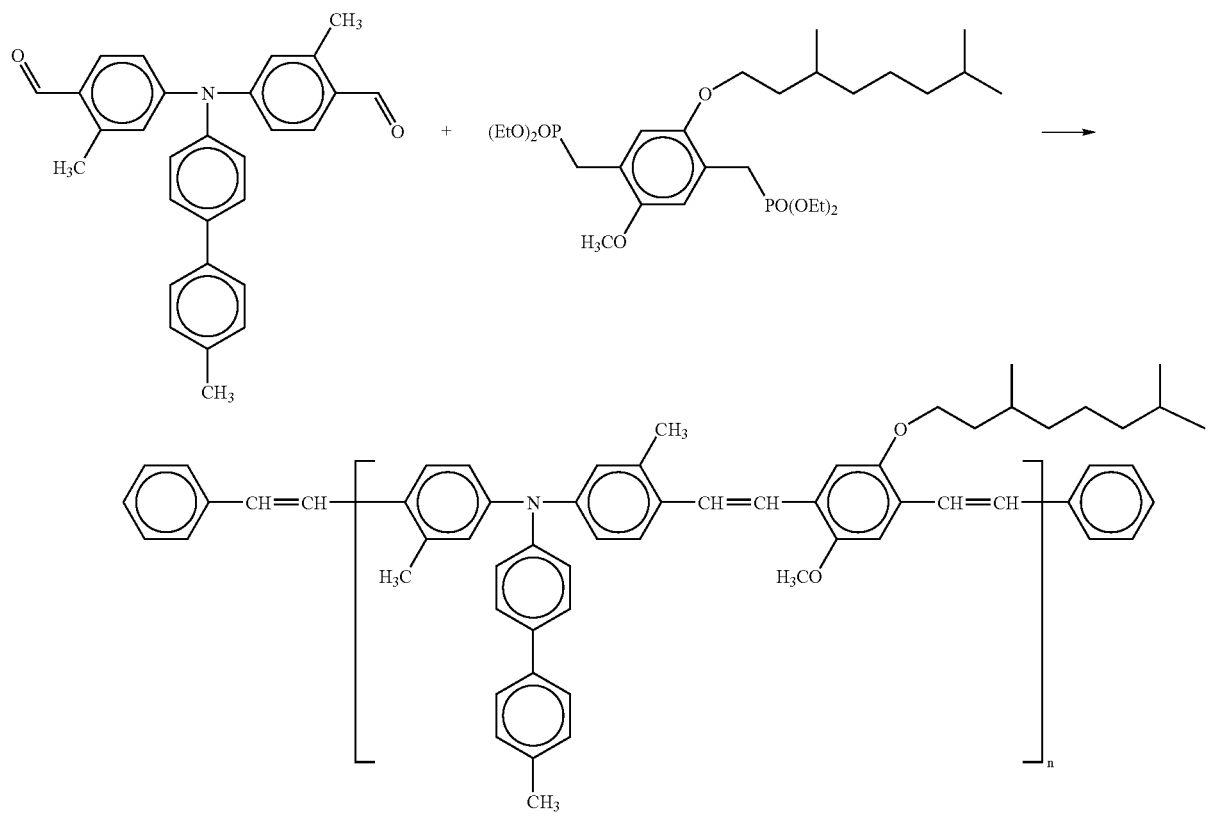

Polymer 2

A polymer 2 was prepared in the same manner as illustrated in Example 1 using 419.5 mg (1.00 mmol) of the dialdehyde illustrated above and 564.5 mg (1.00 mmol) of the diphosphonate illustrated above. The amount of the thus obtained polymer 2 was 518.3 mg and the yield thereof was 62%.

Elemental analysis value (theoretical value): C, 85.18% (85.55%); H, 8.03% (7.63%); N, 2.10% (2.08%).

The Glass transition temperature of the polymer 2 obtained using differential scanning calorimetry (DSC) was 133° C.

The polystyrene-conversion number average molecular weight and weight average molecular weight measured by gel permeation chromatography (GPC) were 39,200 and 116,000, respectively.

Figure 3:
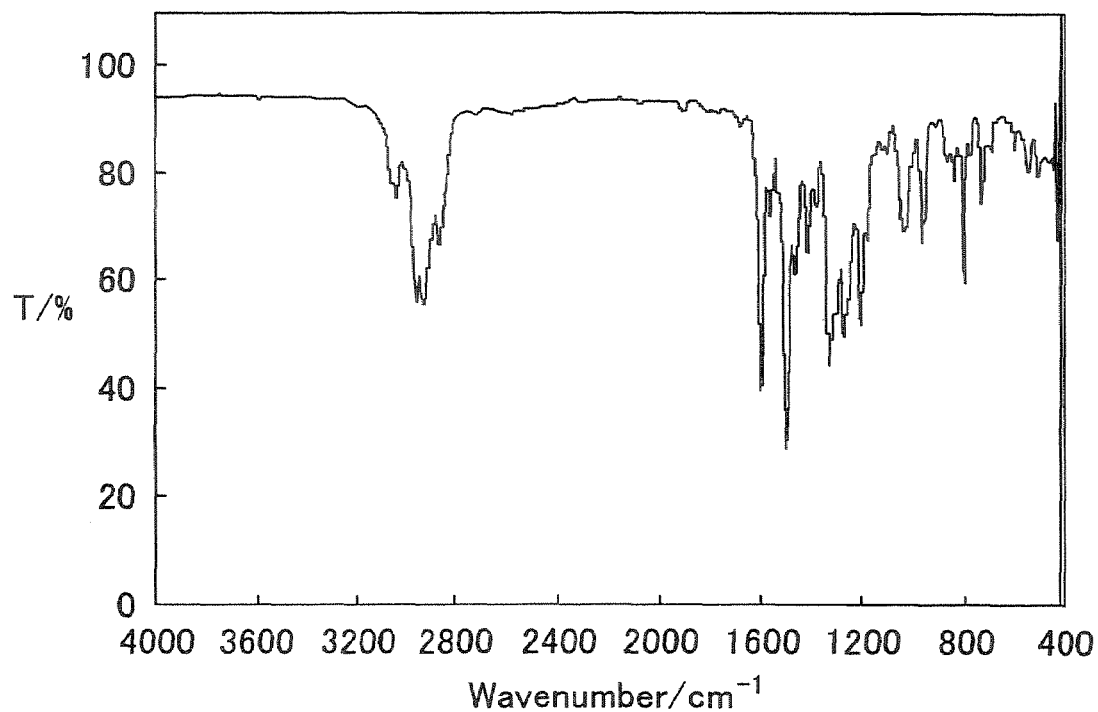
FIG. 3 illustrates an infrared absorption spectrum of the polymer obtained in Example 2.

Infrared absorption spectrum (NaCl cast film) of the polymer 2 is shown in FIG. 3.

Example 3

Synthesis of Polymer 3

A polymer 3 was prepared in the same manner as illustrated in Example 1 using 1.00 g (2.40 mmol) of the dialdehyde illustrated above and 1.35 g (2.40 mmol) of the diphosphonate illustrated above. The amount of the thus obtained Polymer 3 was 1.32 g and the yield thereof was 82%.

Elemental analysis value (thoretical value): C, 85.33% (85.55%); H, 7.86% (7.63%); N, 2.30% (2.08%).

The glass transition temperature of the polymer 3 obtained using differential scanning calorimetry (DSC) was 151.9° C.

The polystyrene-conversion number average molecular weight and weight average molecular weight measured by gel permeation chromatography (GPC) were 44,400 and 118,000, respectively.

Figure 4:
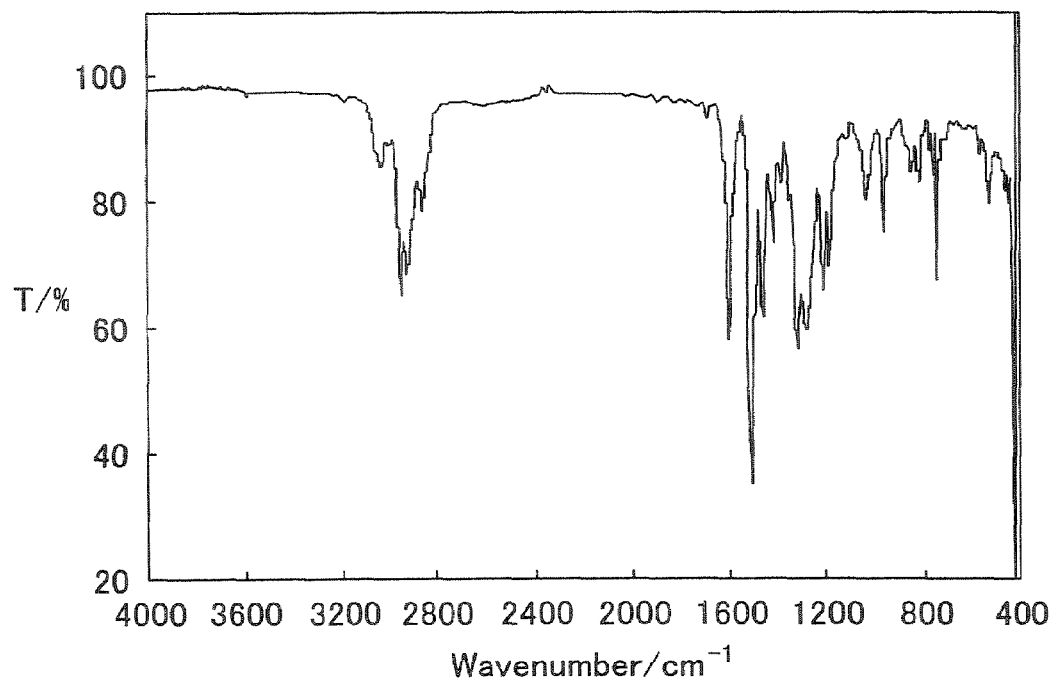
FIG. 4 illustrates an infrared absorption spectrum of the polymer obtained in Example 3.

Infrared absorption spectrum (NaCl cast film) of the polymer 3 is shown in FIG. 4.

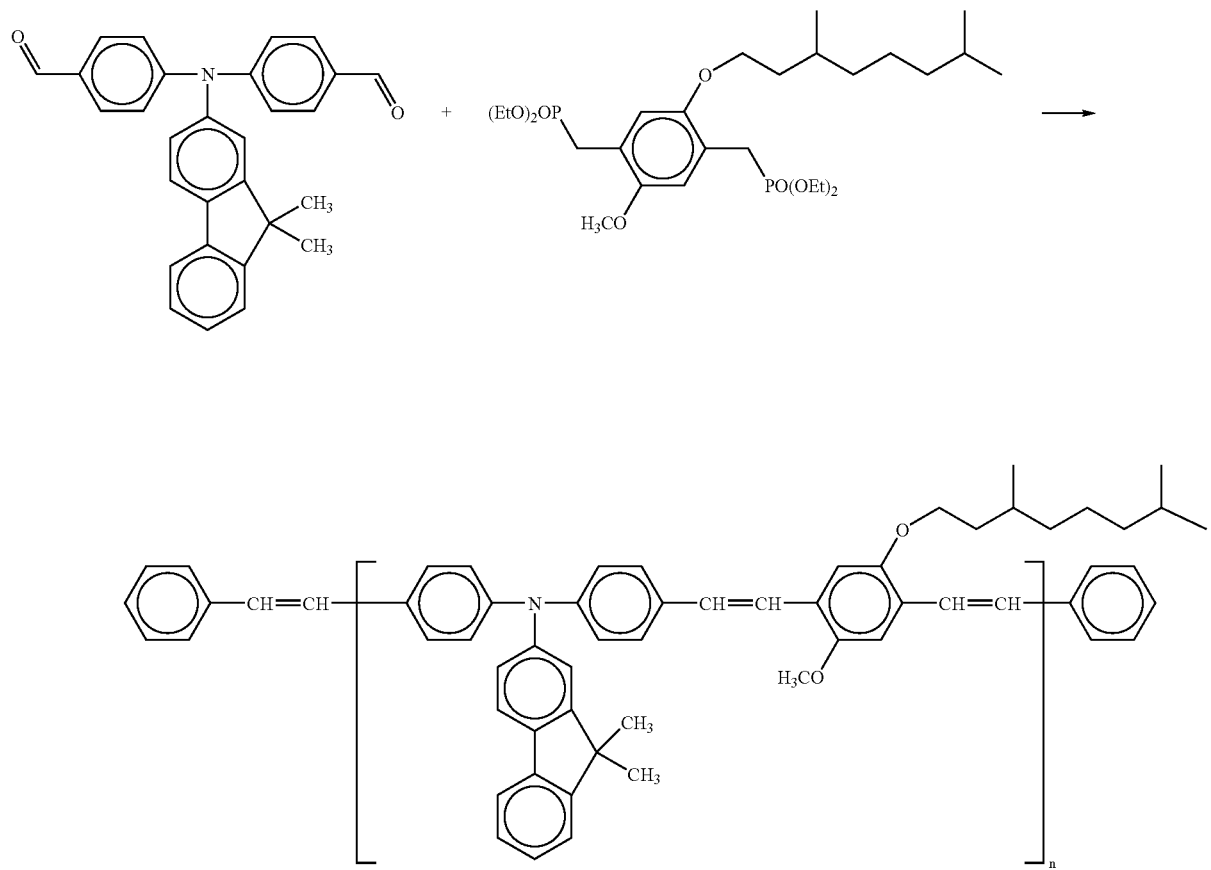

Polymer 3

Example 4

Synthesis of Polymer 4

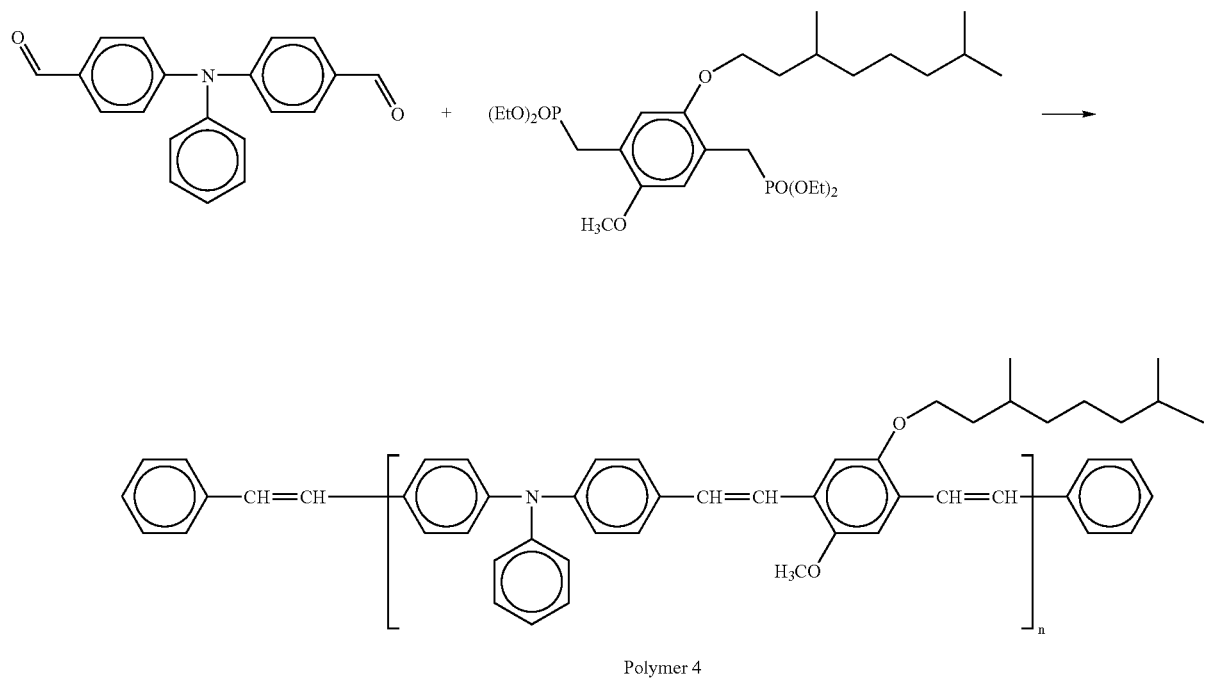

Polymer 4

A polymer 4 was prepared in the same manner as illustrated in Example 1 using 1.00 g (3.32 mmol) of the dialdehyde illustrated above and 1.87 g (3.32 mmol) of the diphosphonate illustrated above. The amount of the thus obtained polymer 4 was 1.32 g and the yield thereof was 71%.

Elemental analysis value (theoretical value): C, 83.78% (83.98%); H, 8.02% (7.77%); N, 2.34% (2.51%).

The glass transition temperature of the polymer 4 obtained using differential scanning calorimetry (DSC) was 131.6° C.

The polystyrene-conversion number average molecular weight and weight average molecular weight measured by gel permeation chromatography (GPC) were 47,900 and 152,700, respectively.

Figure 5:
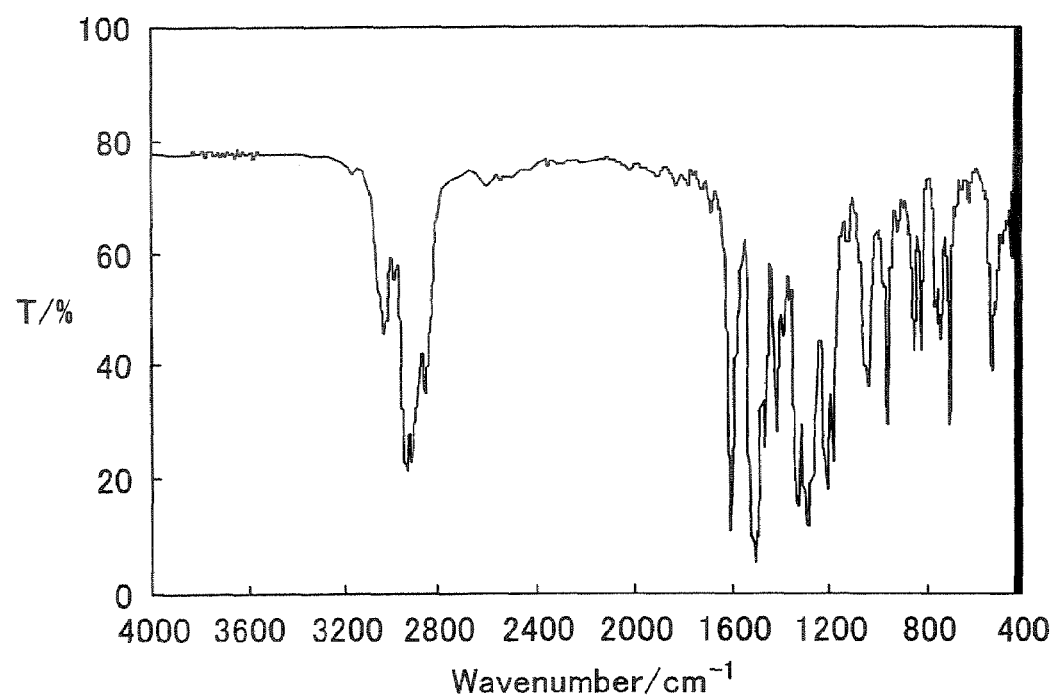
FIG. 5 illustrates an infrared absorption spectrum of the polymer obtained in Example 4.

Infrared absorption spectrum (NaCl cast film) of the polymer 4 is shown in FIG. 5.

Example 5

Synthesis of Polymer 5

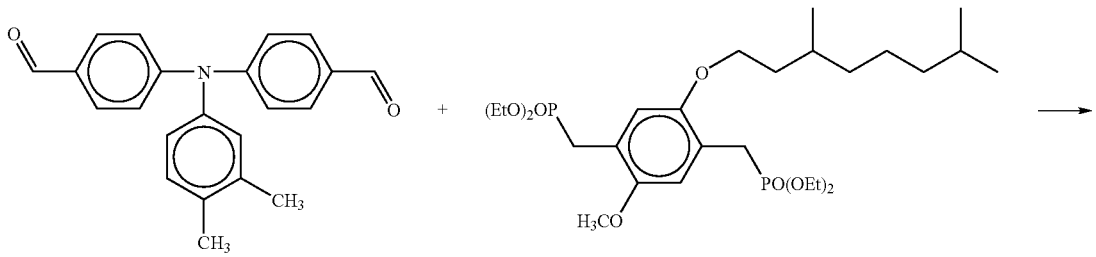

-continued

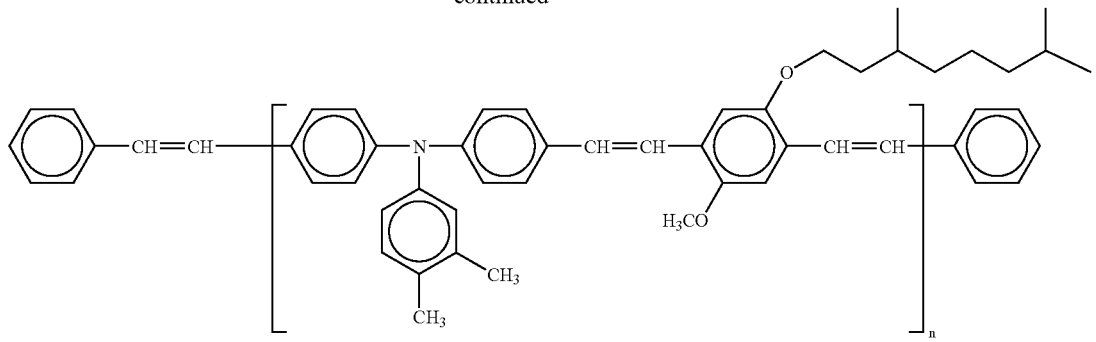

Polymer 5

A polymer 5 was prepared by: placing 0.872 g (2.65 mmol) of the dialdehyde illustrated above and 1.495 g (2.65 mmol) of the diphosphonate illustrated above in a 200 ml four-neck flask; performing nitrogen gas replacement; adding 80 ml of tetrahydrofuran and 14.1 mg (0.132 mmol) of benzaldehyde of to the mixture; to the solution, dropping 8.00 ml (8.00 mmol) of a 1.0 mol $dm^{-3}$ tetrahydrofuran solution of potassium t-butoxide; stirring the solution for two hours at room temperature; adding 60.5 mg (0.265 mmol) of diethyl benzylphosphonate to the resultant: further stirring for an hour; adding about 1 ml of acetic acid to the resultant; after the reaction, washing the solution with water; evaporating the solution to eliminate the solvent under reduced pressure; and then reprecipitating the resultant by dissolving the resultant in a tetrahydrofuran and methanol solution for purification thereof. The amount of the thus obtained polymer 5 was 1.328 g and the yield thereof was 86%.

Elemental analysis value (theoretical value): C, 83.80% (84.06%); H, 8.60% (8.90%); N, 2.15% (2.39%).

The glass transition temperature of the polymer 5 obtained using differential scanning calorimetry (DSC) was 122.1° C.

The polystyrene-conversion number average molecular weight and weight average molecular weight measured by gel permeation chromatography (GPC) were 132,000 and 32,500, respectively.

Figure 6:
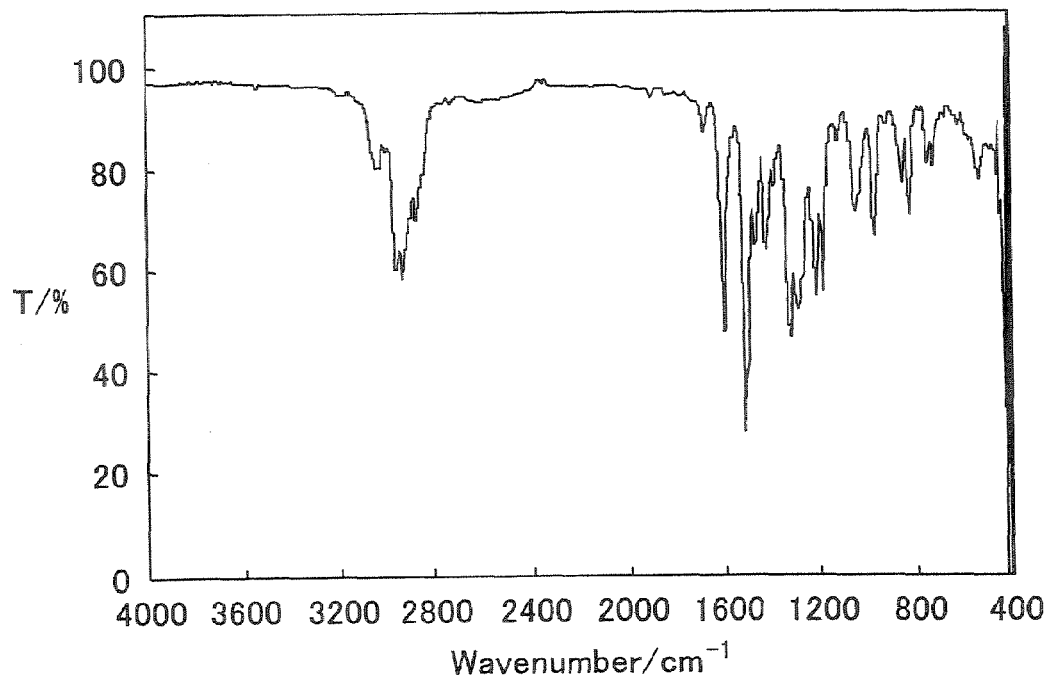
FIG. 6 illustrates an infrared absorption spectrum of the polymer obtained in Example 5.

Infrared absorption spectrum (NaCl cast film) of the polymer 5 is shown in FIG. 6.

Example 6

Synthesis of Polymer 6

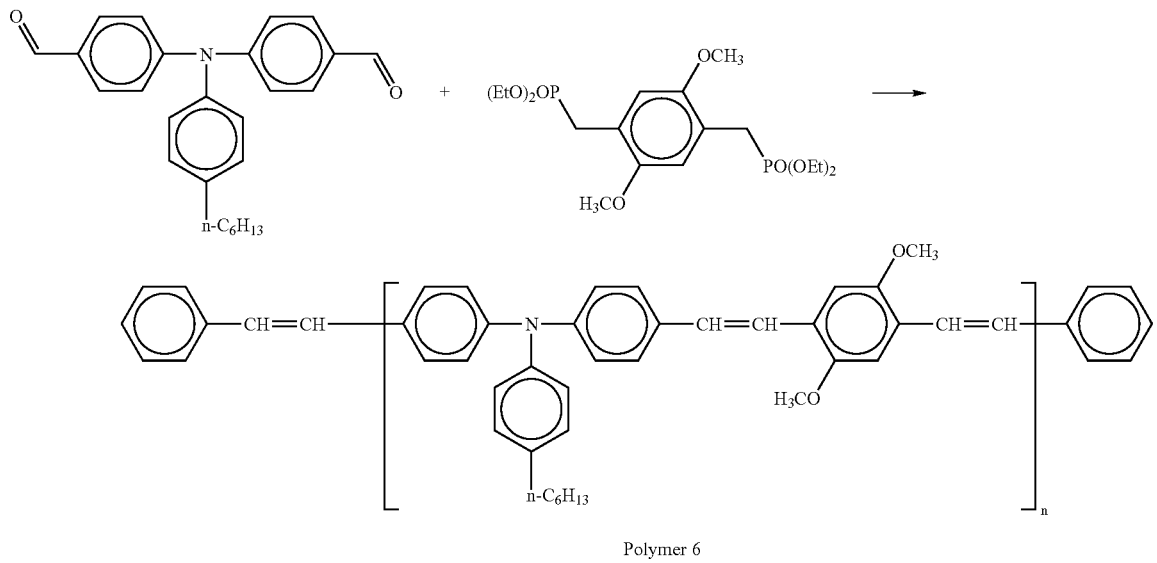

Polymer 6

A polymer 6 was prepared in the same manner as illustrated in Example 1 using 1.46 g (3.80 mmol) of the dialdehyde illustrated above and 1.67 g (3.80 mmol) of the diphosphonate illustrated above. The amount of the thus obtained polymer 6 was 1.47 g and the yield thereof was 75%.

Elemental analysis value (theoretical value): C, 83.94% (83.85%); H, 7.21% (7.23%); N, 2.51% (2.72%).

The glass transition temperature of the polymer 6 obtained using differential scanning calorimetry (DSC) was 182.5° C.

The polystyrene-conversion number average molecular weight and weight average molecular weight measured by gel permeation chromatography (GPC) were 27,900 and 85,000, respectively.

Figure 7:
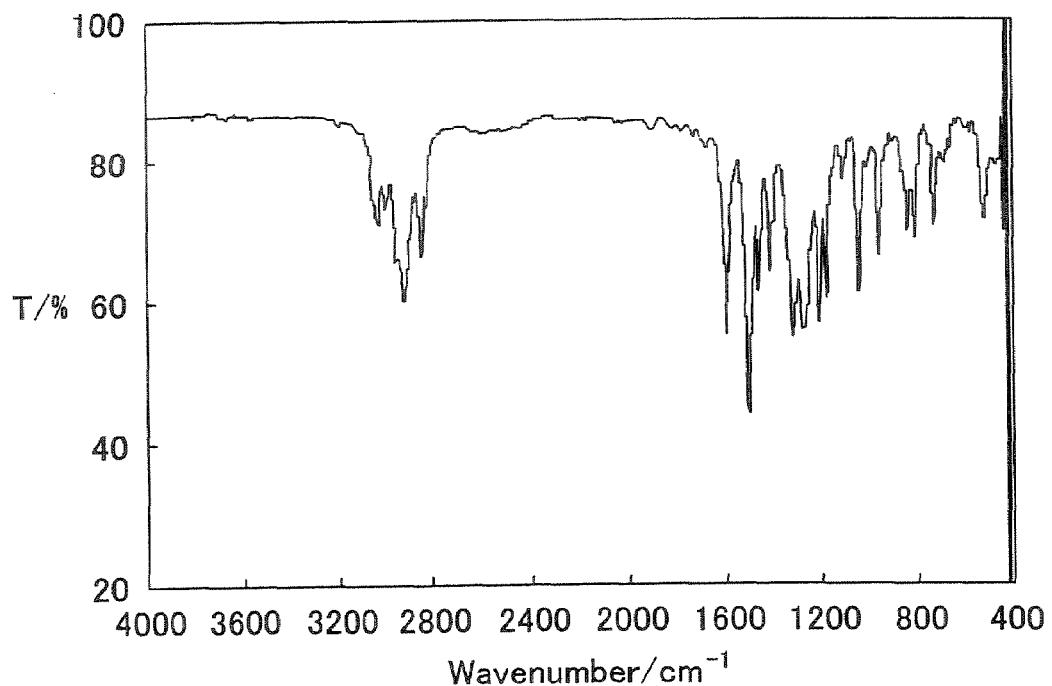
FIG. 7 illustrates an infrared absorption spectrum of the polymer obtained in Example 6.

Infrared absorption spectrum (NaCl cast film) of the polymer 6 is shown in FIG. 7.

Example 7

Synthesis of Polymer 7

A polymer 7 was prepared in the same manner as illustrated in Example 5 using 1.00 g (2.48 mmol) of the dialdehyde illustrated above and 1.40 g (2.48 mmol) of the diphosphonate illustrated above. The amount of the thus obtained polymer 7 was 0.74 g and the yield thereof was 45%.

Elemental analysis value (theoretical value): C, 85.56% (85.27%); H, 8.02% (7.78%); N, 2.01% (2.12%).

The polystyrene-conversion number average molecular weight and weight average molecular weight measured by gel permeation chromatography (GPC) were 22,700 and 51,900, respectively.

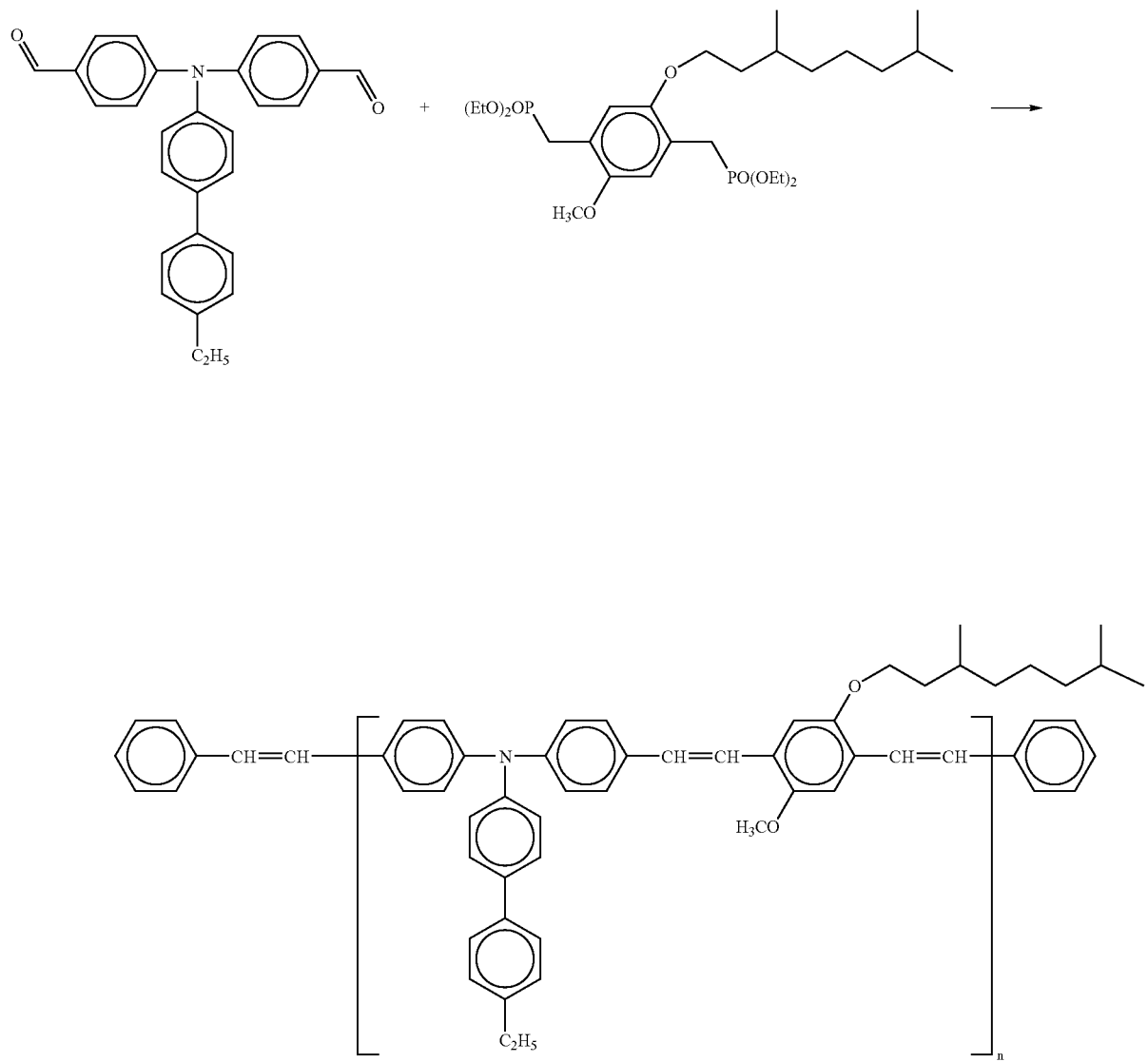

Polymer 7

Figure 8:
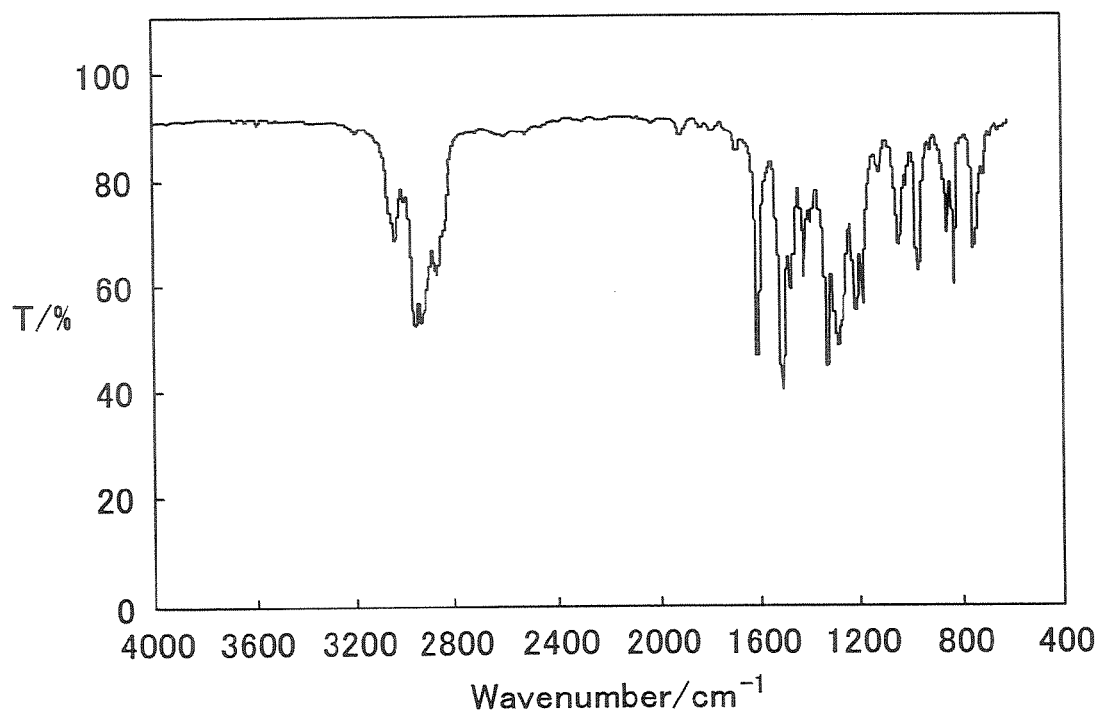
FIG. 8 illustrates an infrared absorption spectrum of the polymer obtained in Example 7.

Infrared absorption spectrum (NaCl cast film) of the polymer 7 is shown in FIG. 8.

Example 8

Synthesis of Polymer 8

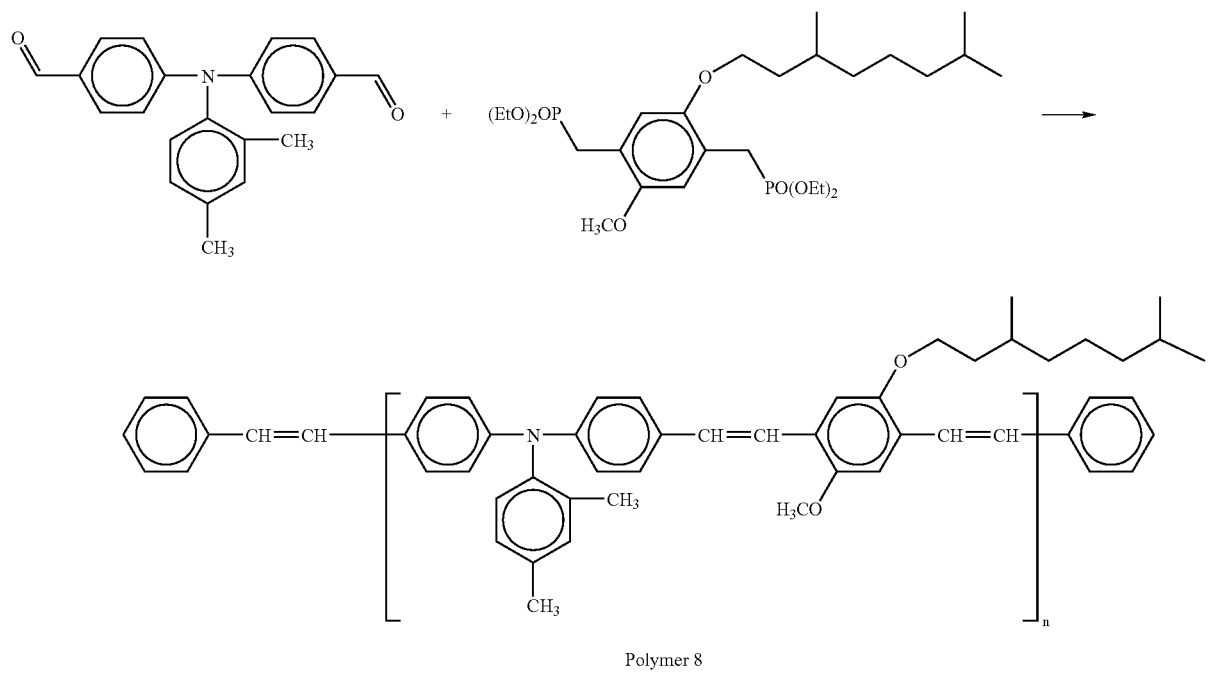

Polymer 8

A polymer 8 was prepared in the same manner as illustrated in Example 5 using 0.872 g (2.648 mmol) of the dialdehyde illustrated above and 1.495 g (2.648 mmol) of the diphosphonate illustrated above. The amount of the thus obtained polymer 8 was 1.473 g and the yield thereof was 95%.

Elemental analysis value (theoretical value): C, 84.25% (84.06%); H, 8.75% (8.90%); N, 2.23% (2.39%).

The glass transition temperature of the polymer 8 obtained using differential scanning calorimetry (DSC) was 135.8° C.

The polystyrene-conversion number average molecular weight and weight average molecular weight measured by gel permeation chromatography (GPC) were 15,400 and 39,900, respectively.

Figure 9:
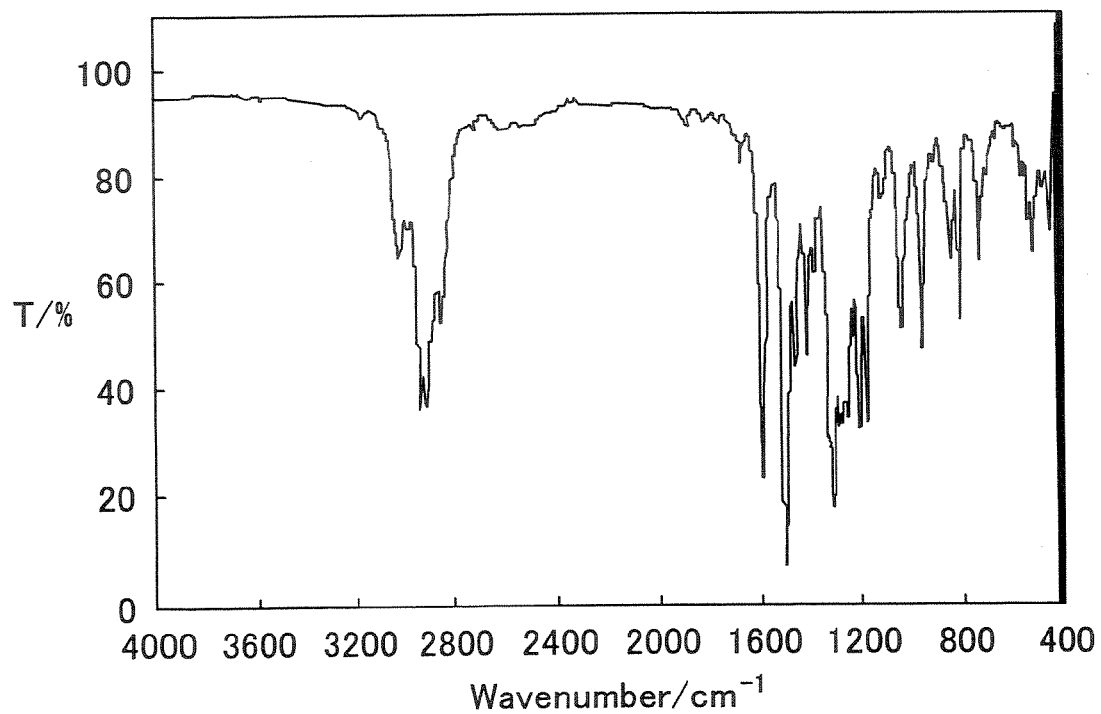
FIG. 9 illustrates an infrared absorption spectrum of the polymer obtained in Example 8.

Infrared absorption spectrum (NaCl cast film) of the polymer 8 is shown in FIG. 9.

Example 9

Synthesis of Polymer 9

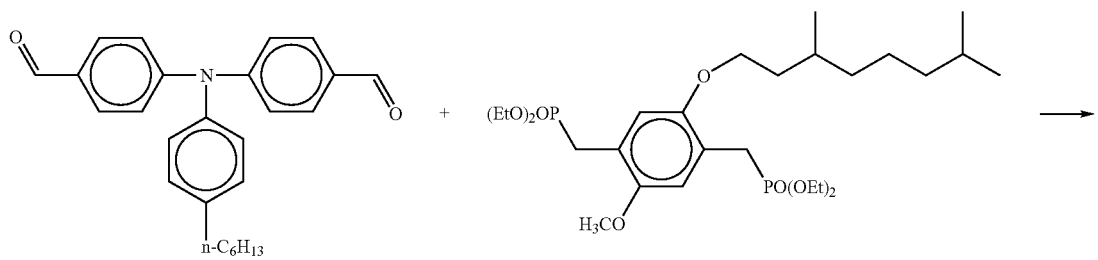

-continued

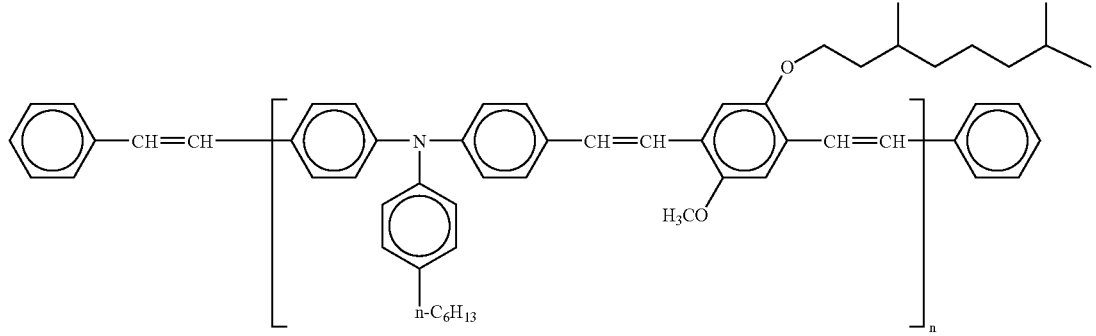

Polymer 9

A polymer 9 was prepared in the same manner as illustrated in Example 5 using 2.12 g (5.50 mmol) of the dialdehyde illustrated above and 3.11 g (5.50 mmol) of the diphosphonate illustrated above. The amount of the thus obtained polymer 9 was 3.30 g and the yield thereof was 92%.

Elemental analysis value (theoretical value): C, 84.45% (84.20%); H, 8.82% (8.64%); N, 2.00% (2.18%).

The glass transition temperature of the polymer 9 obtained using differential scanning calorimetry (DSC) was 96.1° C.

The polystyrene-conversion number average molecular weight and weight average molecular weight measured by gel permeation chromatography (GPC) were 35,600 and 139,700, respectively.

Figure 10:
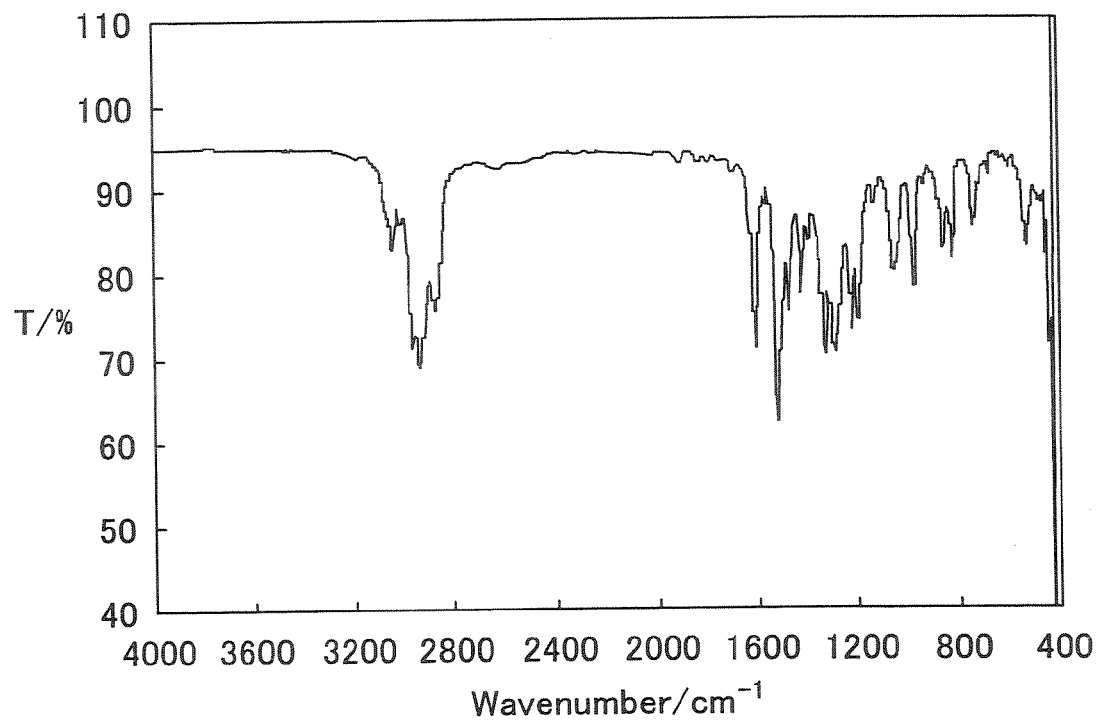
FIG. 10 illustrates an infrared absorption spectrum of the polymer obtained in Example 9.

Infrared absorption spectrum (NaCl cast film) of the polymer 9 is shown in FIG. 10.

Example 10

Synthesis of Polymer 10 gen gas replacement; adding 200 ml of tetrahydrofuran to the mixture; to the solution, dropping 8.00 ml (8.00 mmol) of a 1.0 mol dm$^{-3}$ tetrahydrofuran solution of potassium t-butoxide; stirring the solution for half an hour at room temperature; refluxing the solution for one and a half hours; adding 60.5 mg (0.265 mmol) of benzylphosphonatediethyl to the resultant: further refluxing the solution for an hour; subsequent to cooling, adding about 1 ml of acetic acid to the resultant; after the reaction, dropping the reactant solution into about 700 ml of water; and suction-filtrating the resultant. The amount of the thus obtained polymer 10 was 0.83 g and the yield thereof was 79%.

Elemental analysis value (theoretical value): C, 92.95% (90.19%); H, 6.01% (6.31%); N, 3.62% (3.51%).

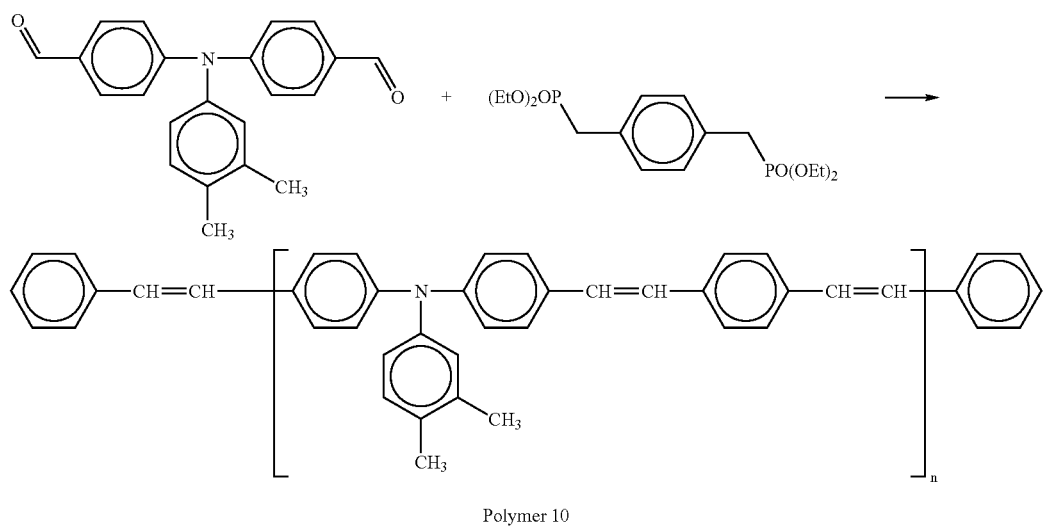

Polymer 10

A polymer 10 was prepared by: placing 0.872 g of the dialdehyde illustrated above, 1.002 g (2.65 mmol) of the diphosphonate illustrated above and 28.1 mg (0.265 mmol) of benzaldehyde in a 300 ml four-neck flask; performing nitro- The polystyrene-conversion number average molecular weight and weight average molecular weight measured by gel permeation chromatography (GPC) were 2,560 and 4,680, respectively.

Figure 11:
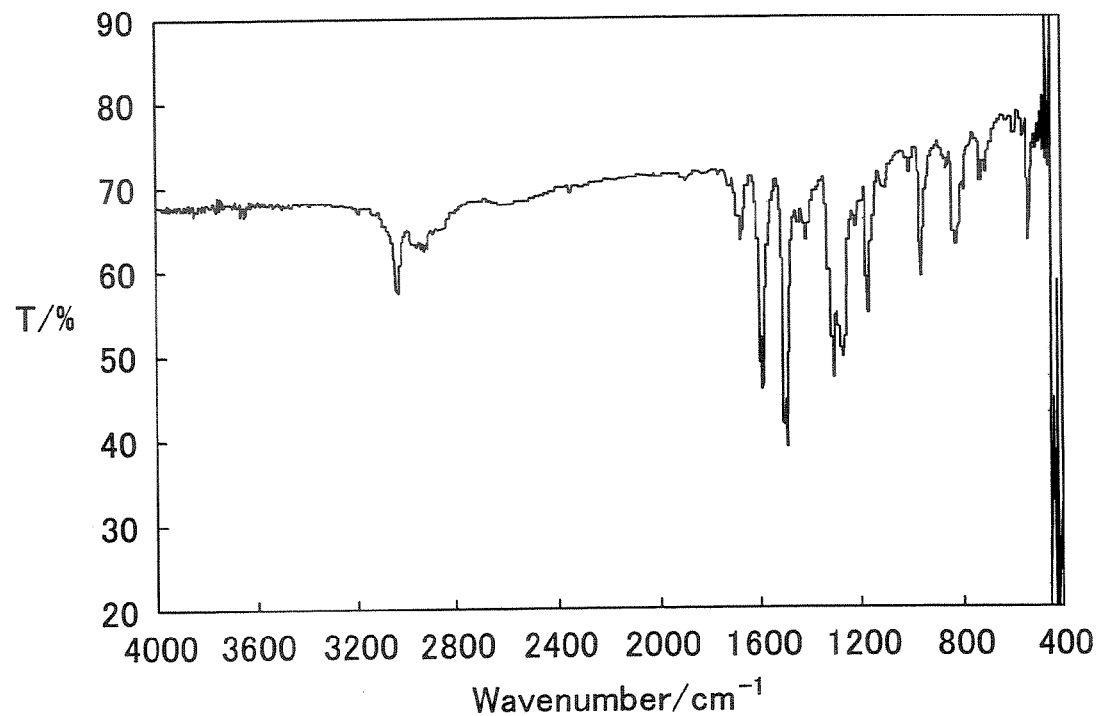
FIG. 11 illustrates an infrared absorption spectrum of the polymer obtained in Example 10.

Infrared absorption spectrum (NaCl cast film) of the polymer 10 is shown in FIG. 11.

Example 11

Synthesis of Polymer 11

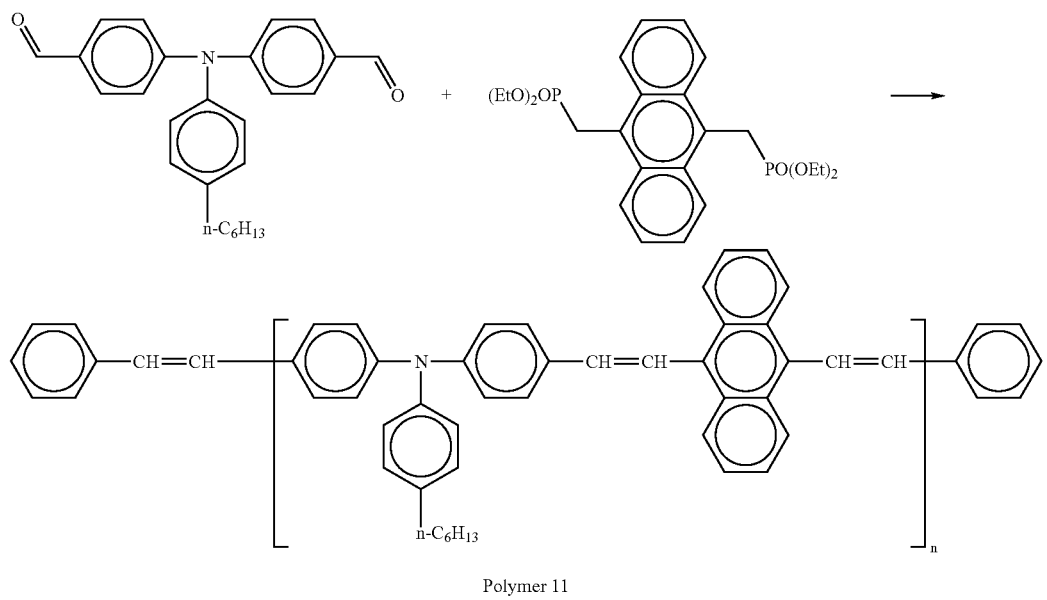

Polymer 11

A polymer 11 was prepared in the same manner as illustrated in Example 5 using 2.12 g (5.50 mmol) of the dialdehyde illustrated above and 2.63 g (5.50 mmol) of the diphosphonate illustrated above. The amount of the thus obtained polymer 11 was 2.72 g and the yield thereof was 89%.

Elemental analysis value (theoretical value): C, 90.89% (90.77%); H, 6.50% (6.71%); N, 2.22% (2.52%).

The polystyrene-conversion number average molecular weight and weight average molecular weight measured by gel permeation chromatography (GPC) were 3,700 and 8,000, respectively.

Figure 12:
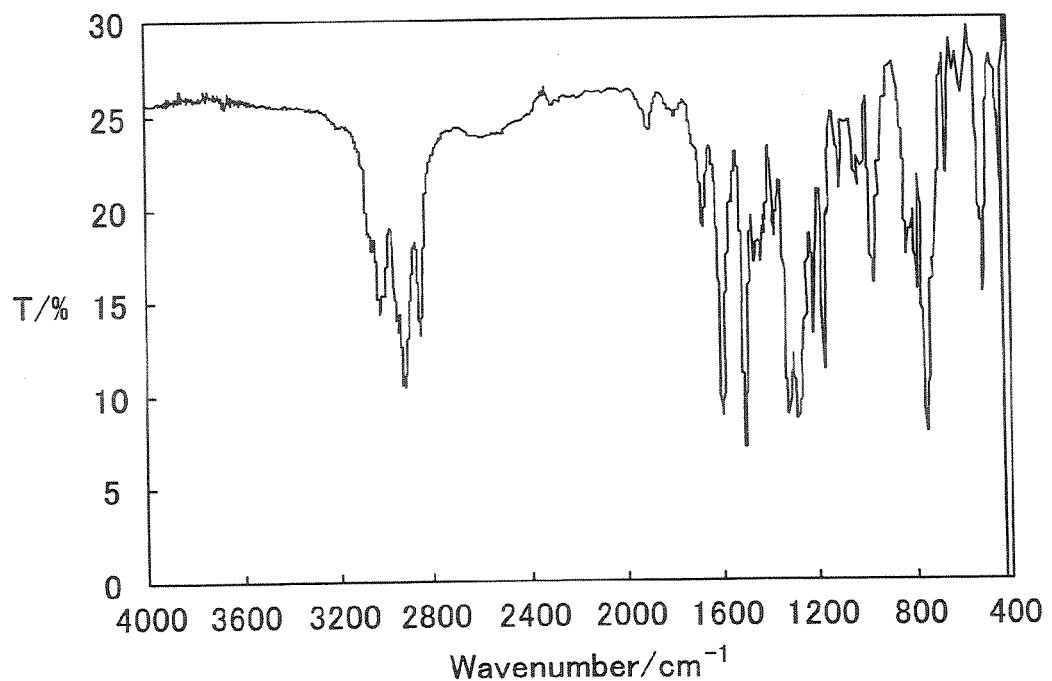
FIG. 12 illustrates an infrared absorption spectrum of the polymer obtained in Example 11.

Infrared absorption spectrum (NaCl cast film) of the polymer 11 is shown in FIG. 12.

Example 12

Synthesis of Polymer 12

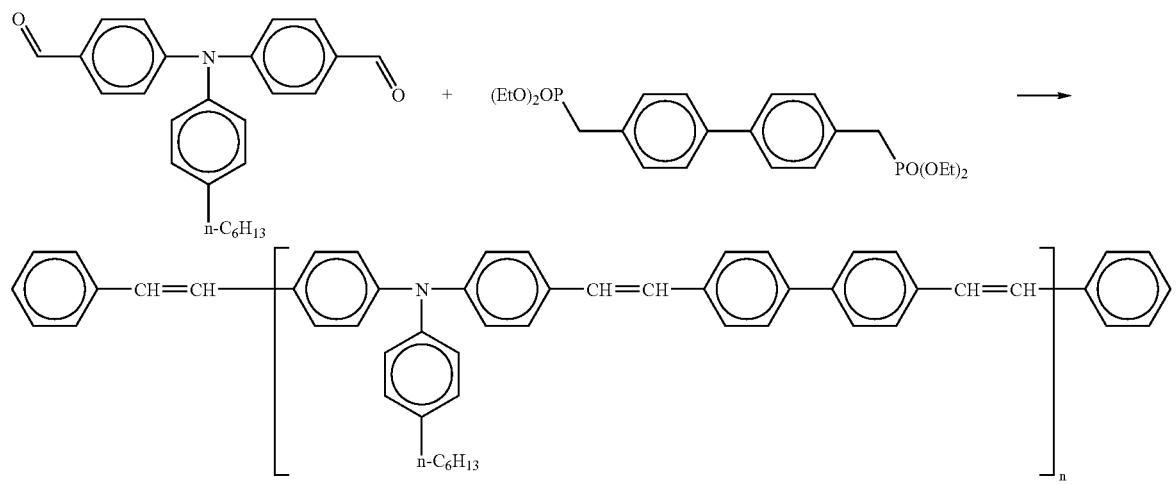

Polymer 12

A polymer 12 was prepared in the same manner as illustrated in Example 5 using 2.12 g (5.50 mmol) of the dialdehyde illustrated above and 3.11 g (5.50 mmol) of the diphosphonate illustrated above. The amount of the thus obtained polymer 12 was 2.34 g and the yield thereof was 80%.

Elemental analysis value (theoretical value): C, 90.64% (90.35%); H, 6.82% (7.01%); N, 2.55% (2.63%).

The polystyrene-conversion number average molecular weight and weight average molecular weight measured by gel permeation chromatography (GPC) were 5,500 and 13,300, respectively.

Figure 13:
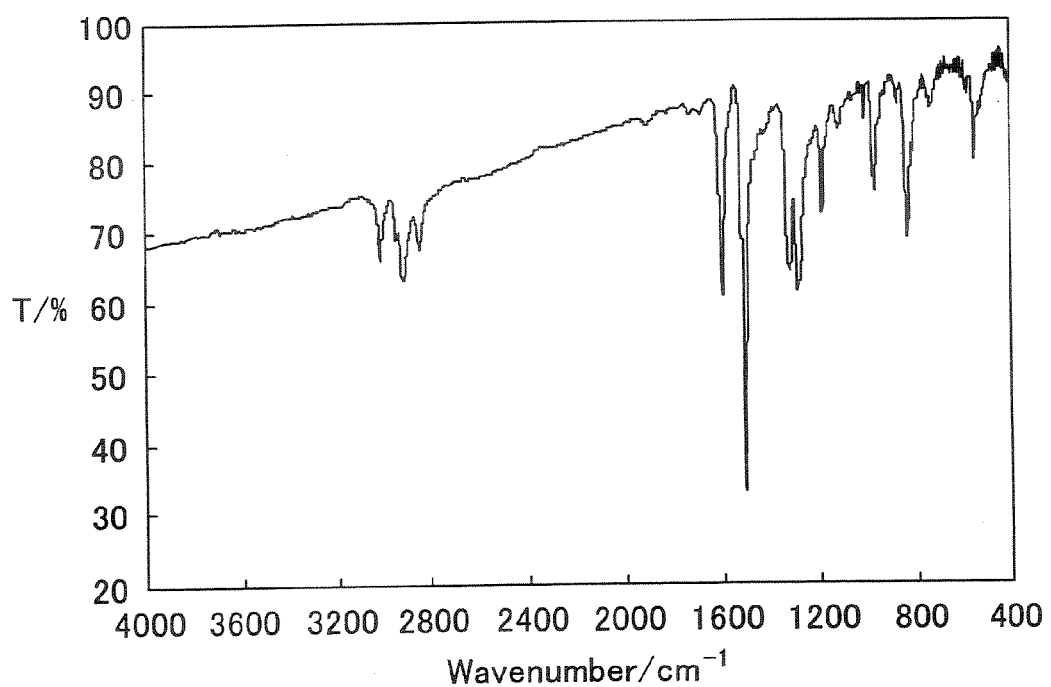
FIG. 13 illustrates an infrared absorption spectrum of the polymer obtained in Example 12.

Infrared absorption spectrum (KBr) of the polymer 12 is shown in FIG. 13.

Example 13

Synthesis of Polymer 13

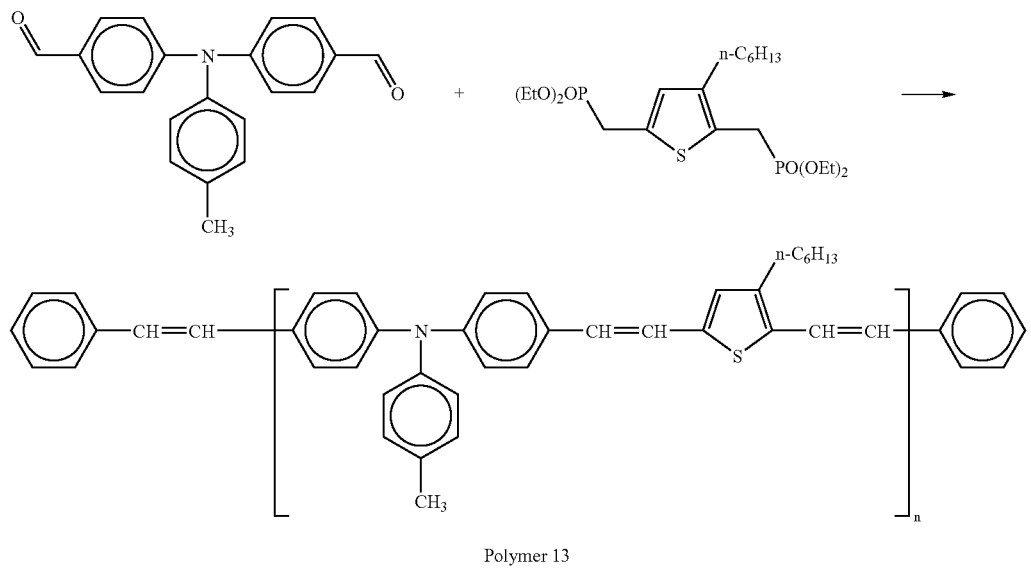

Polymer 13

A polymer 13 was prepared by: placing 0.835 g (2.65 mmol) of the dialdehyde illustrated above and 1.241 g (2.65 mmol) of the diphosphonate illustrated above in a 200 ml four-neck flask; performing nitrogen gas replacement; adding 80 ml of tetrahydrofuran and 14.1 mg (0.132 mmol) of benzaldehyde to the mixture; to the solution, dropping 8.00 ml (8.00 mmol) of a 1.0 mol dm$^{-3}$ tetrahydrofuran solution of potassium t-butoxide; stirring the solution for half an hour at a room temperature; refluxing the solution for three hours; adding 60.5 mg (0.265 mmol) of diethyl benzylphosphonate to the resultant: further refluxing the solution for an hour; subsequent to cooling, adding several drips of acetic acid to the resultant; after the reaction, dripping the reactant solution into water; filtrating the resultant; and reprecipitating the resulting solid by dissolving the resulting solid in a tetrahydrofuran and methanol solution. The amount of the thus obtained polymer 13 was 0.83 g and the yield thereof was 66%.

Elemental analysis value (theoretical value): C, 83.01% (83.32%); H, 7.01% (6.99%); N, 2.89% (2.94%); S, 6.80% (6.76%).

The glass transition temperature of the polymer 13 obtained using differential scanning calorimetry (DSC) was 163.4° C.

The polystyrene-conversion number average molecular weight and weight average molecular weight measured by gel permeation chromatography (GPC) were 7,900 and 17,200, respectively.

Figure 14:
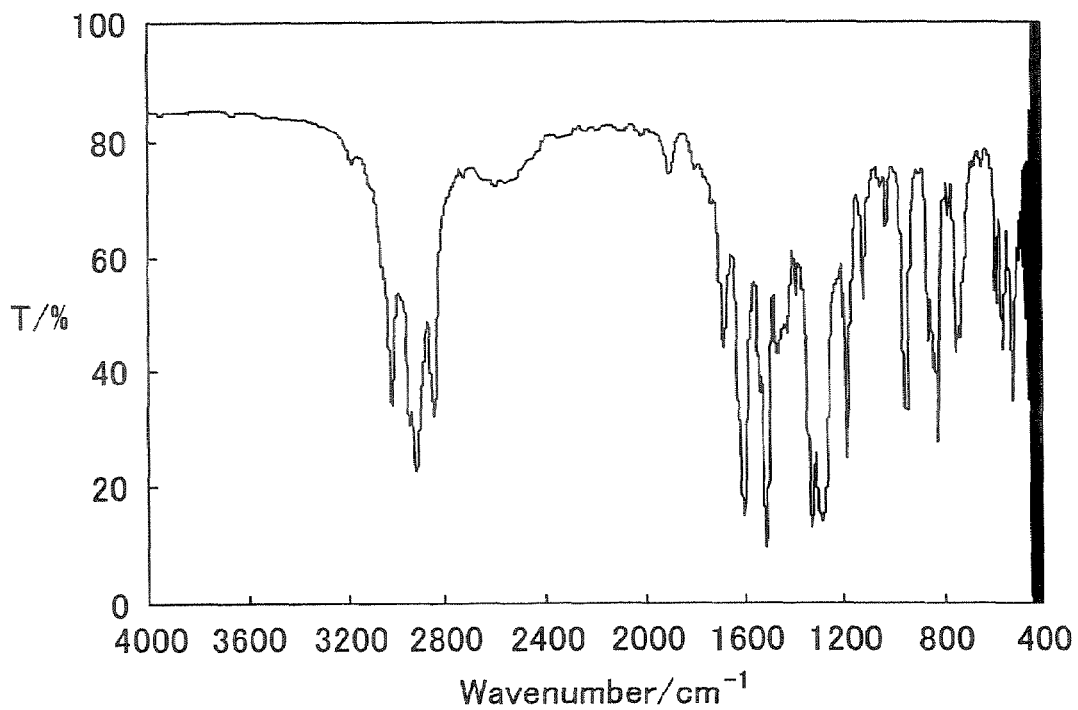
FIG. 14 illustrates an infrared absorption spectrum of the polymer obtained in Example 13.

Infrared absorption spectrum (NaCl cast film) of the polymer 13 is shown in FIG. 14.

Example 14

Synthesis of Polymer 14

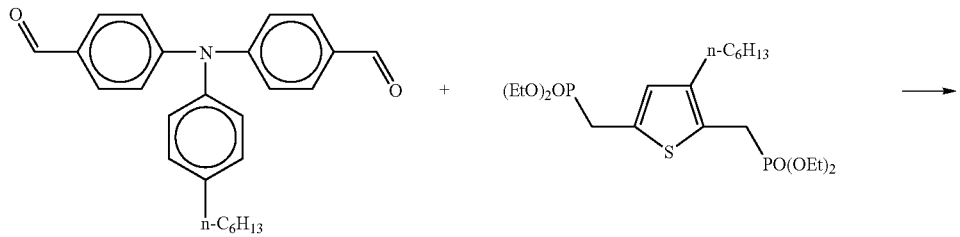

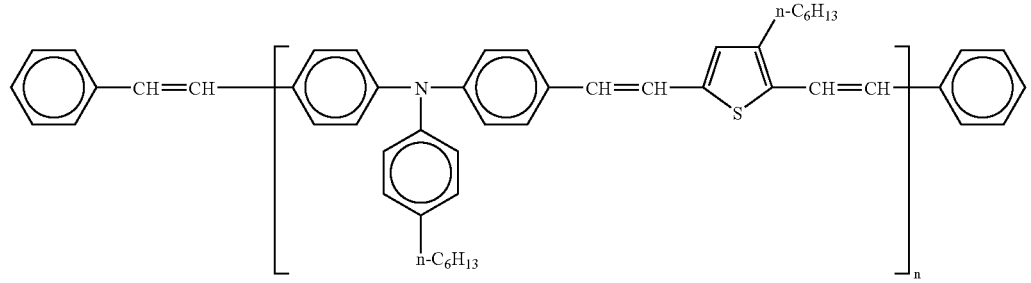

Polymer 14

A polymer 14 was prepared in the same manner as illustrated in Example 13 using 1.021 g (2.648 mmol) of the dialdehyde illustrated above and 1.241 g (2.648 mmol) of the diphosphonate illustrated above. The amount of the thus obtained polymer 14 was 0.918 g and the yield thereof was 62%.

Elemental analysis value (theoretical value): C, 83.55% (83.62%); H, 7.74% (7.94%); N, 2.63% (2.57%); S, 6.02% (5.87%).

The glass transition temperature obtained using differential scanning calorimetry (DSC) was 125.9° C.

The polystyrene-conversion number average molecular weight and weight average molecular weight measured by gel permeation chromatography (GPC) were 15,500 and 48,700, respectively.

Figure 15:
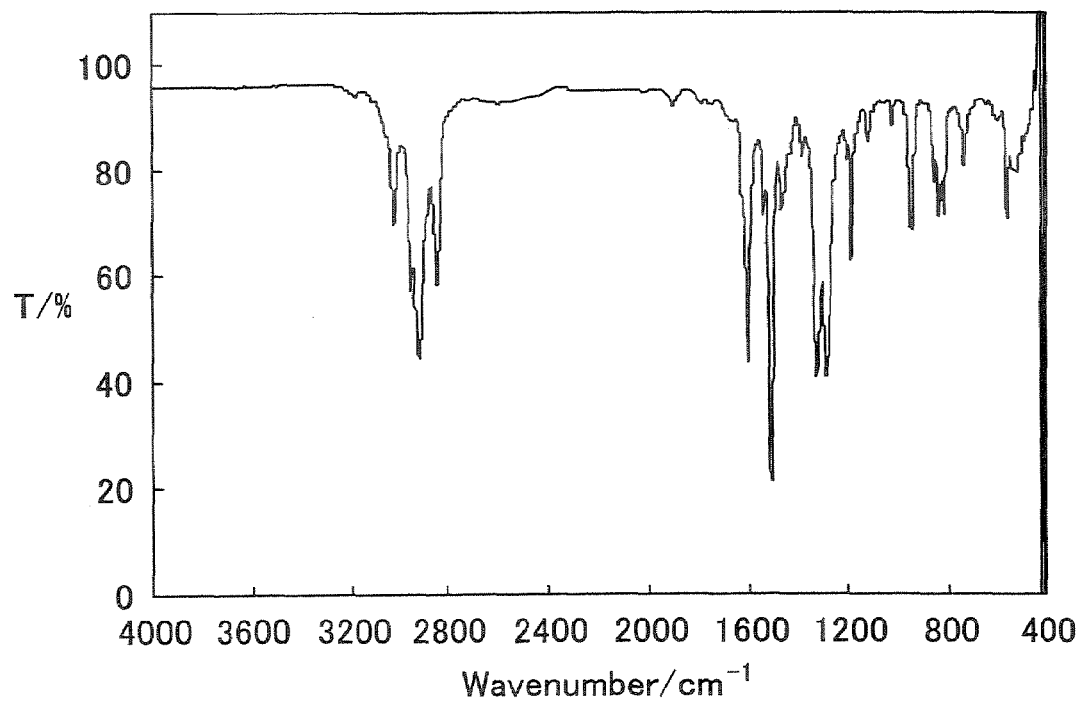
FIG. 15 illustrates an infrared absorption spectrum of the polymer obtained in Example 14.

Infrared absorption spectrum (NaCl cast film) of the polymer 14 is shown in FIG. 15.

Example 15

Synthesis of Polymer 15

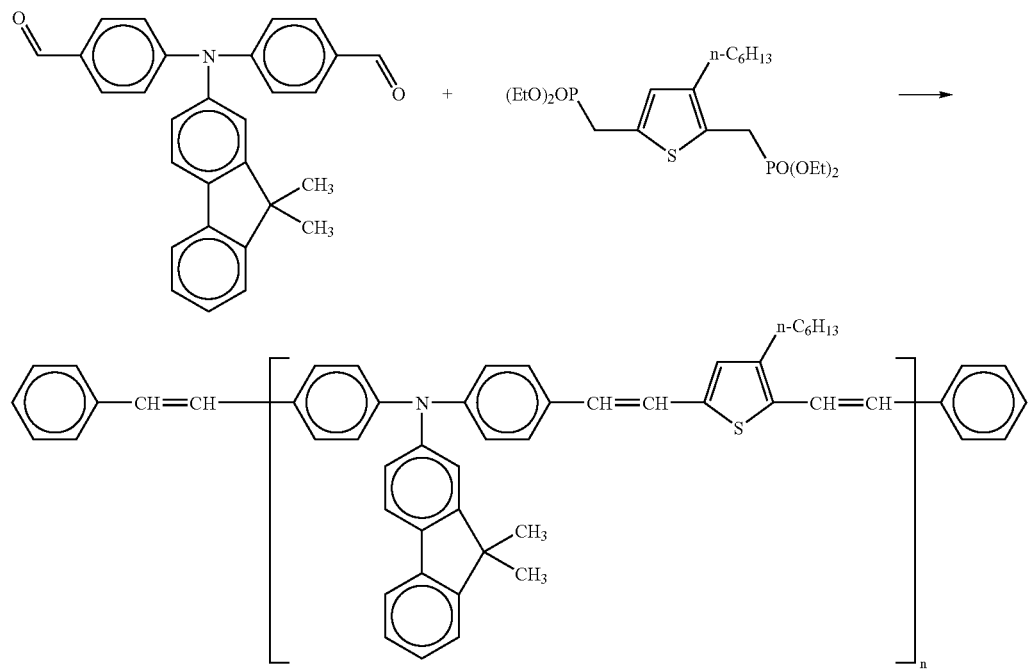

Polymer 15

A polymer 15 was prepared in the same manner as illustrated in Example 13 using 1.106 g (2.65 mmol) of the dialdehyde illustrated above and 1.241 g (2.65 mmol) of the diphosphonate illustrated above. The amount of the thus obtained polymer 15 was 0.817 g and the yield thereof was 53%.

Elemental analysis value (theoretical value): C, 85.52% (85.22%); H, 7.00% (6.80%); N, 2.15% (2.42%); S, 5.50% (5.55%).

The glass transition temperature of the polymer 15 obtained using differential scanning calorimetry (DSC) was 186.9° C.

The polystyrene-conversion number average molecular weight and weight average molecular weight measured by gel permeation chromatography (GPC) were 11,800 and 28,400, respectively.

Figure 16:
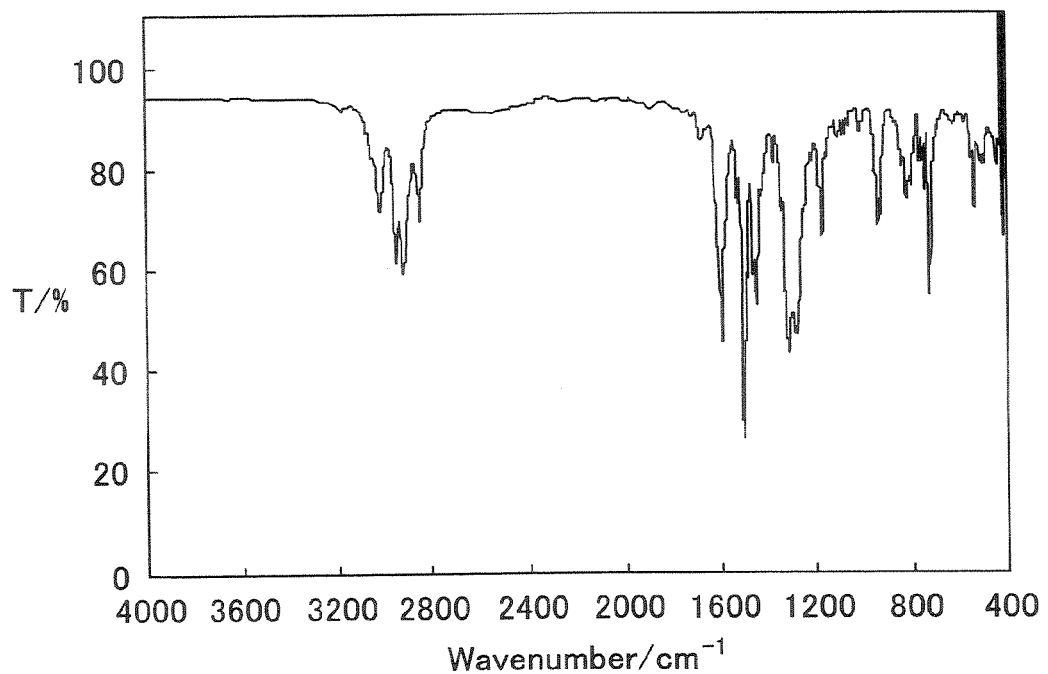
FIG. 16 illustrates an infrared absorption spectrum of the polymer obtained in Example 15.

Infrared absorption spectrum (NaCl cast film) of the polymer 15 is shown in FIG. 16.

Example 16

Synthesis of Polymer 16 dehyde illustrated above and 1.241 g (2.65 mmol) of the diphosphonate illustrated above. The amount of the thus obtained polymer 16 was 1.39 g and the yield thereof was 91%.

Elemental analysis value (theoretical value): C, 84.62% (84.93%); H, 7.01% (7.13%); N, 2.76% (2.42%); S, 5.69% (5.53%).

The glass transition temperature of the polymer 16 obtained using differential scanning calorimetry (DSC) was 166.4° C.

The polystyrene-conversion number average molecular weight and weight average molecular weight measured by gel permeation chromatography (GPC) were 8,300 and 19,900, respectively.

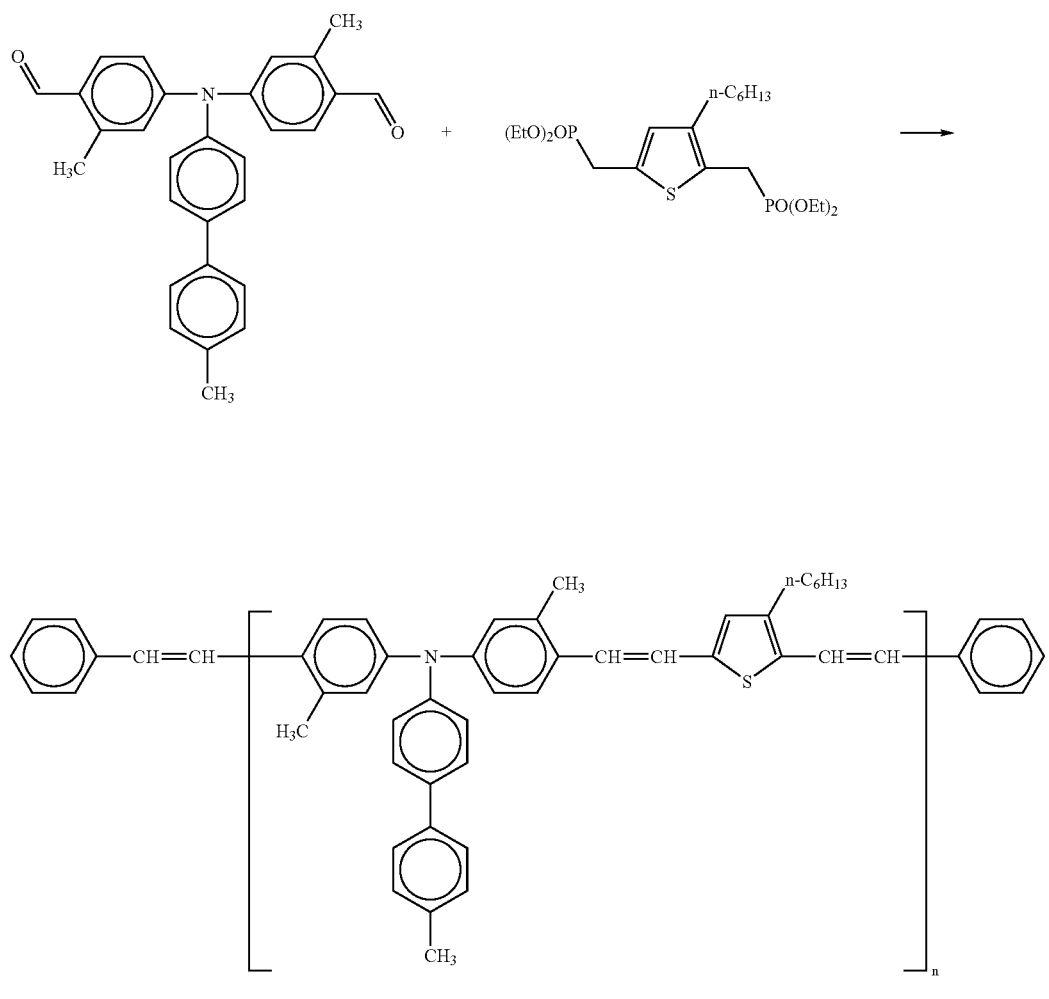

Polymer 16

Figure 17:
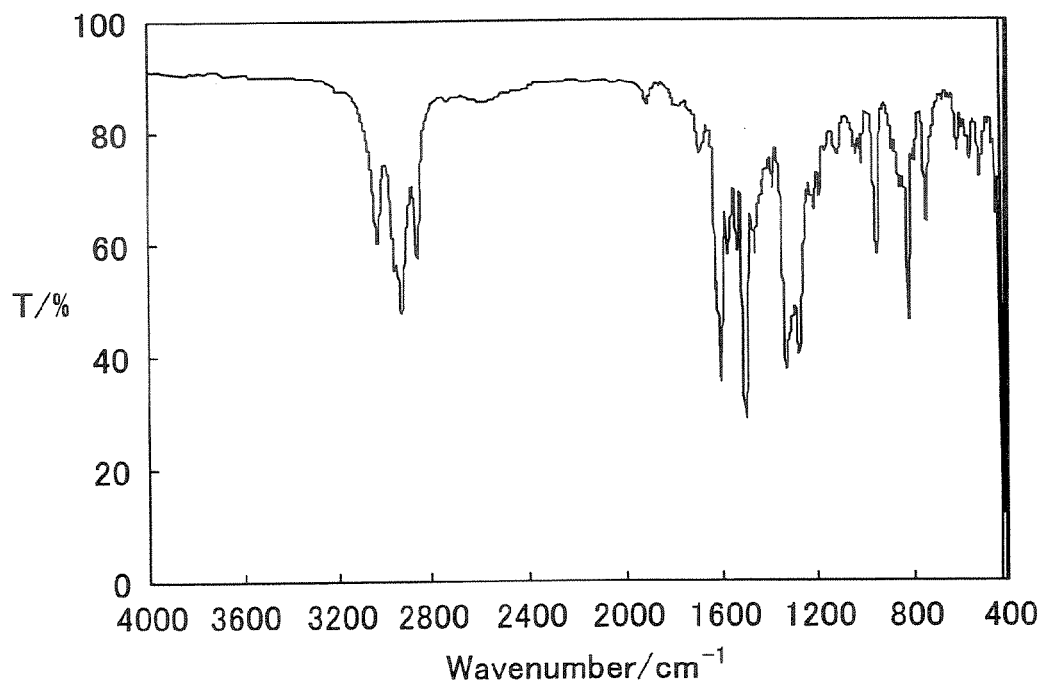
FIG. 17 illustrates an infrared absorption spectrum of the polymer obtained in Example 16.

A polymer 16 was prepared in the same manner as illustrated in Example 13 using 1.111 g (2.65 mmol) of the dial- Infrared absorption spectrum (NaCl cast film) of the polymer 16 is shown in FIG. 17.

Example 17

Synthesis of Polymer 17

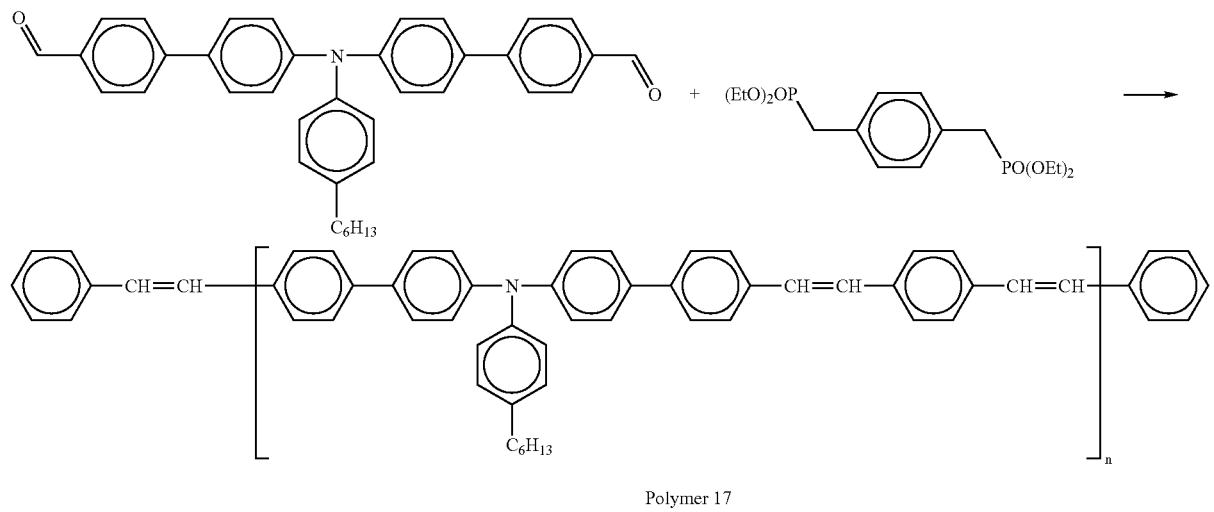

Polymer 17

A polymer 17 was prepared in the same manner as illustrated in Example 5 using 0.807 g (1.50 mmol) of the dialdehyde illustrated above and 0.568 g (1.50 mmol) of the diphosphonate illustrated above of. The amount of the thus obtained Polymer 17 was 0.84 g and the yield thereof was 92%.

Elemental analysis value (theoretical value): C, 90.65% (90.88%); H, 6.87% (6.81%); N, 2.33% (2.30%).

The polystyrene-conversion number average molecular weight and weight average molecular weight measured by gel permeation chromatography (GPC) were 5,600 and 18,600, respectively.

Figure 18:
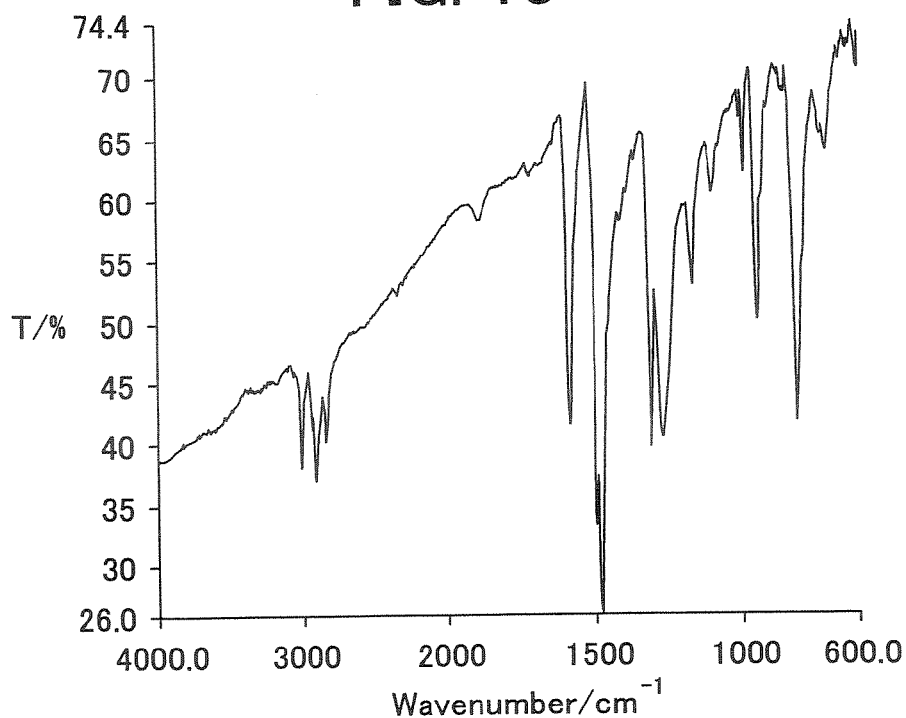
FIG. 18 illustrates an infrared absorption spectrum of the polymer obtained in Example 17.

Infrared absorption spectrum (NaCl cast film) of the polymer 17 is shown in FIG. 18.

Example 18

Synthesis of Polymer 18

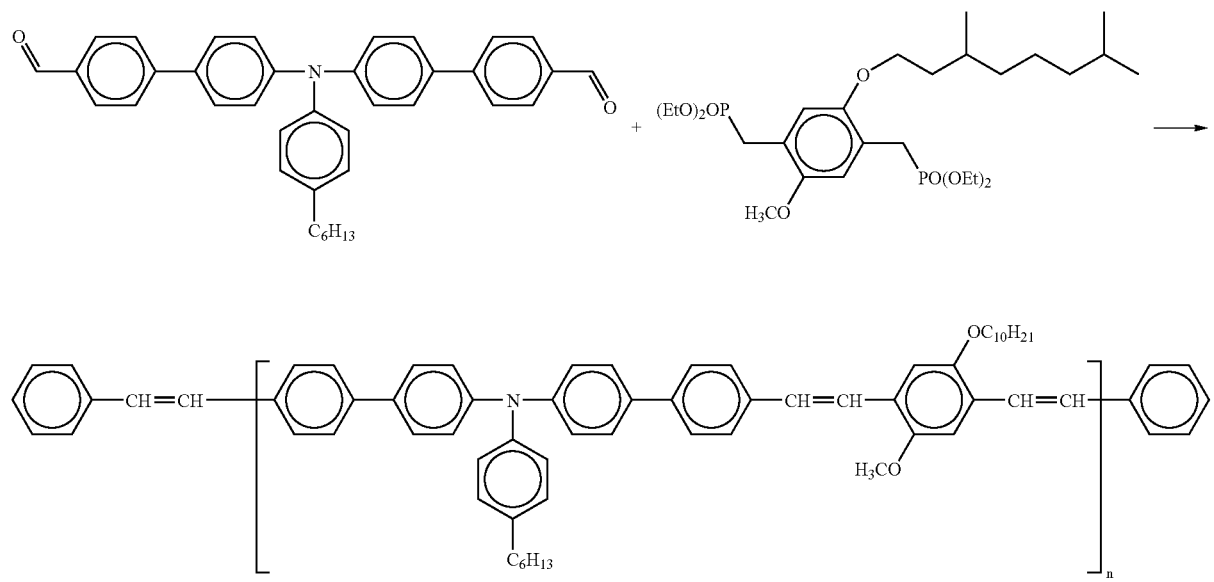

Polymer 18

A polymer 18 was prepared in the same manner as illustrated in Example 5 using 2.00 g (3.72 mmol) of the dialdehyde illustrated above and 2.10 g (3.72 mmol) of the diphosphonate illustrated above. The amount of the thus obtained polymer 18 was 2.20 g and the yield thereof was 75%.

Elemental analysis value (theoretical value): C, 85.95% (86.21%); H, 8.07% (8.00%); N, 1.59% (1.76%).

The polystyrene-conversion number average molecular weight and weight average molecular weight measured by gel permeation chromatography (GPC) were 29,800 and 83,000, respectively.

Figure 19:
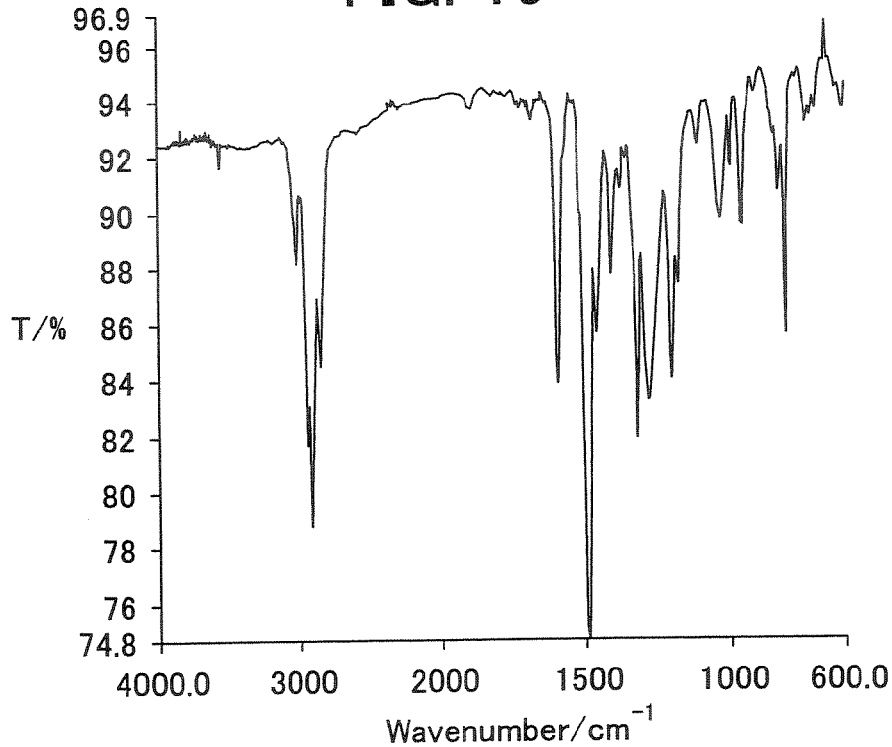
FIG. 19 illustrates an infrared absorption spectrum of the polymer obtained in Example 18.

Infrared absorption spectrum (NaCl cast film) of the polymer 18 is shown in FIG. 19.

Example 19

Synthesis of Polymer 19

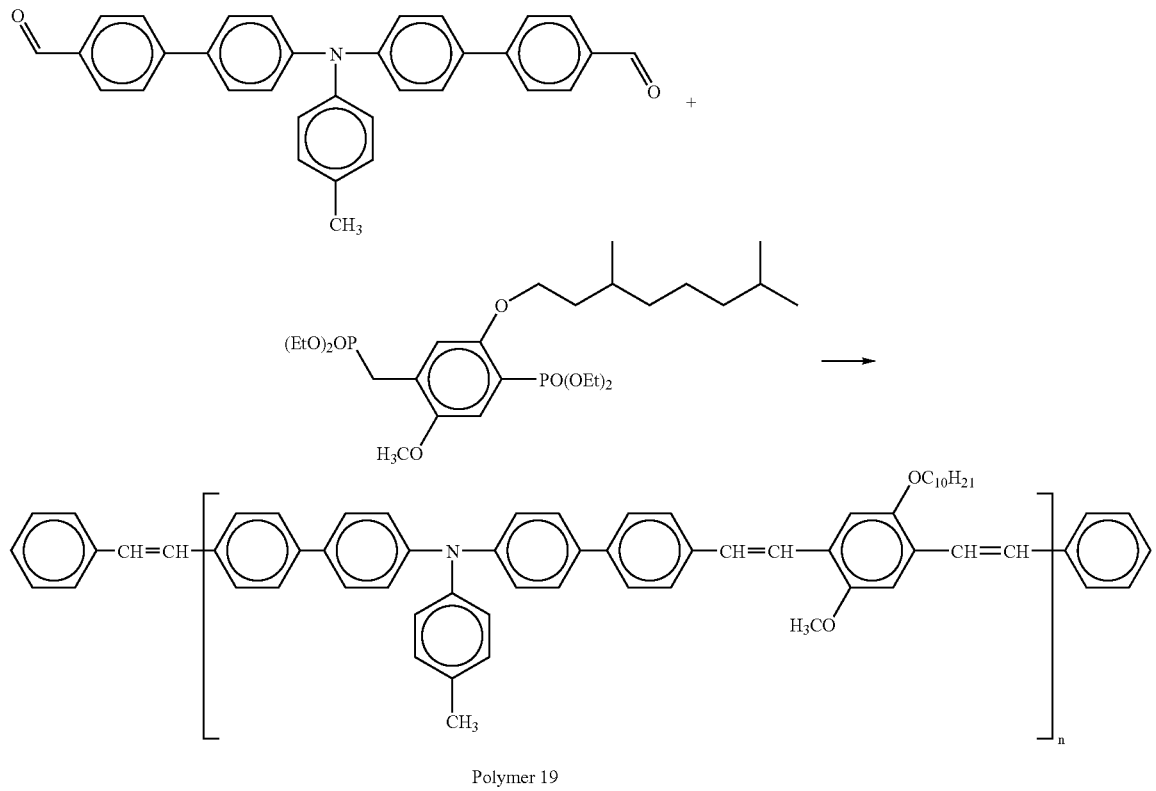

Polymer 19

A polymer 19 was prepared in the same manner as illustrated in Example 5 using 0.783 g (1.675 mmol) of the dialdehyde illustrated above and 0.946 g (1.675 mmol) of the diphosphonate illustrated above. The amount of the thus obtained polymer 19 was 0.76 g and the yield thereof was 62%.

Elemental analysis value (theoretical value): C, 86.55% (86.27%); H, 7.20% (7.38%); N, 2.12% (1.93%).

The polystyrene-conversion number average molecular weight and weight average molecular weight measured by gel permeation chromatography (GPC) were 45,000 and 103,700, respectively.

Figure 20:
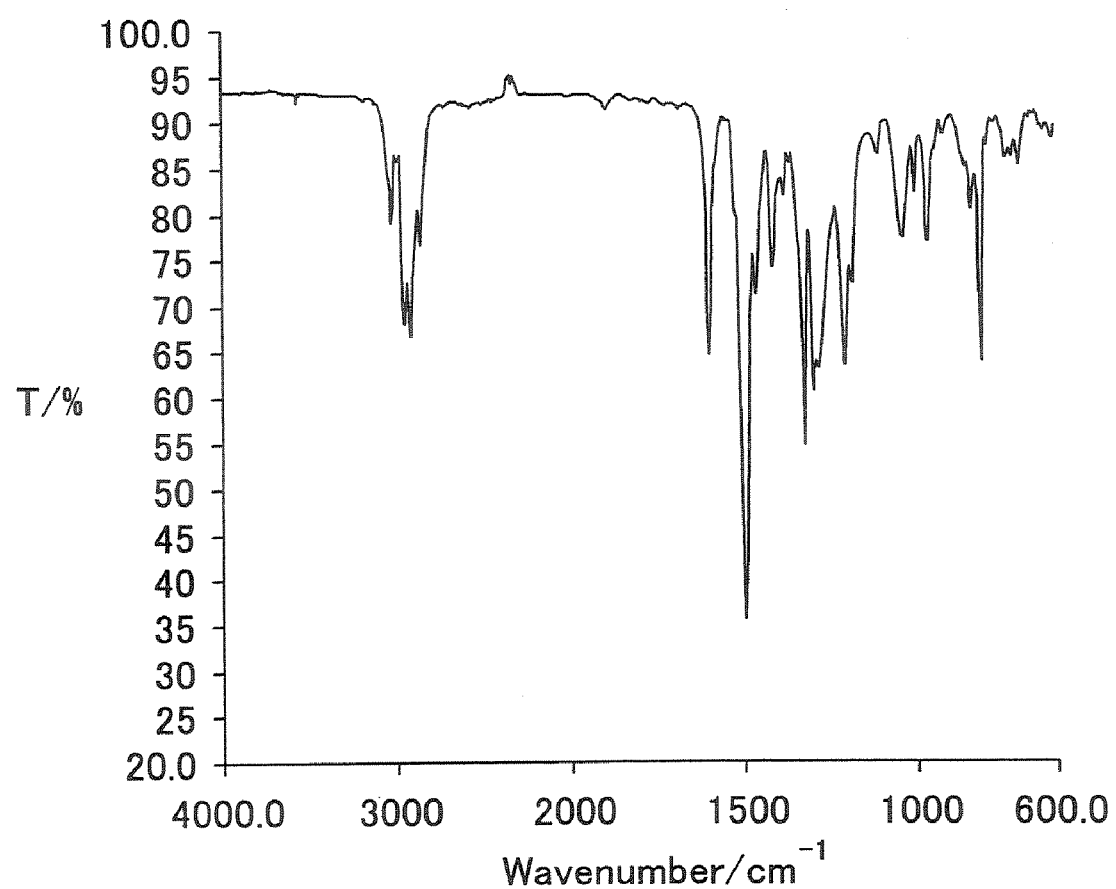
FIG. 20 illustrates an infrared absorption spectrum of the polymer obtained in Example 19.

Infrared absorption spectrum (NaCl cast film) of the polymer 19 is shown in FIG. 20.

Example 20

A solution of 10 wt % of the organic semiconductor material (number average molecular weight of 8,500, weight average molecular weight of 20,000) prepared by the process described in Example 1, in tetrahydrofuran was blade-coated onto a polyethyleneterephthalate (PET) substrate on which an Al electrode was deposited to form a thin film having a thickness of about 10 μm. Further, an Au electrode was deposited on this semiconductor film to form a sandwich cell.

Carrier mobility of the organic semiconductor material was evaluated by a time of flight method using this cell. The carrier mobility thereof was as high as $6.1 \times 10^{-3}$ cm$^2$ V$^{-1}$ s$^{-1}$ even at an electric field of $4.1 \times 10^5$ V/cm. The sandwich cell was found to be excellent.

Example 21

A sandwich cell was manufactured in the same manner as illustrated in Example 20 except that the organic semiconductor material prepared by the process illustrated in Example 2 was used.

Carrier mobility of the organic semiconductor material was evaluated by a time of flight method using this cell. The carrier mobility thereof was as high as $1.7 \times 10^{-3}$ cm$^2$ V$^{-1}$ s$^{-1}$ even at an electric field of $2.9 \times 10^5$ V/cm. The sandwich cell was found to be excellent.

Example 22

A sandwich cell was manufactured in the same manner as illustrated in Example 20 except that the organic semiconductor material prepared by the process illustrated in Example 3 was used.

Carrier mobility of the organic semiconductor material was evaluated by a time of flight method using this cell. The carrier mobility thereof was as high as $1.6 \times 10^{-3}$ cm$^2$ V$^{-1}$ s$^{-1}$ even at an electric field of $2.4 \times 10^5$ V/cm. The sandwich cell was found to be excellent.

Example 23

Figure 21:
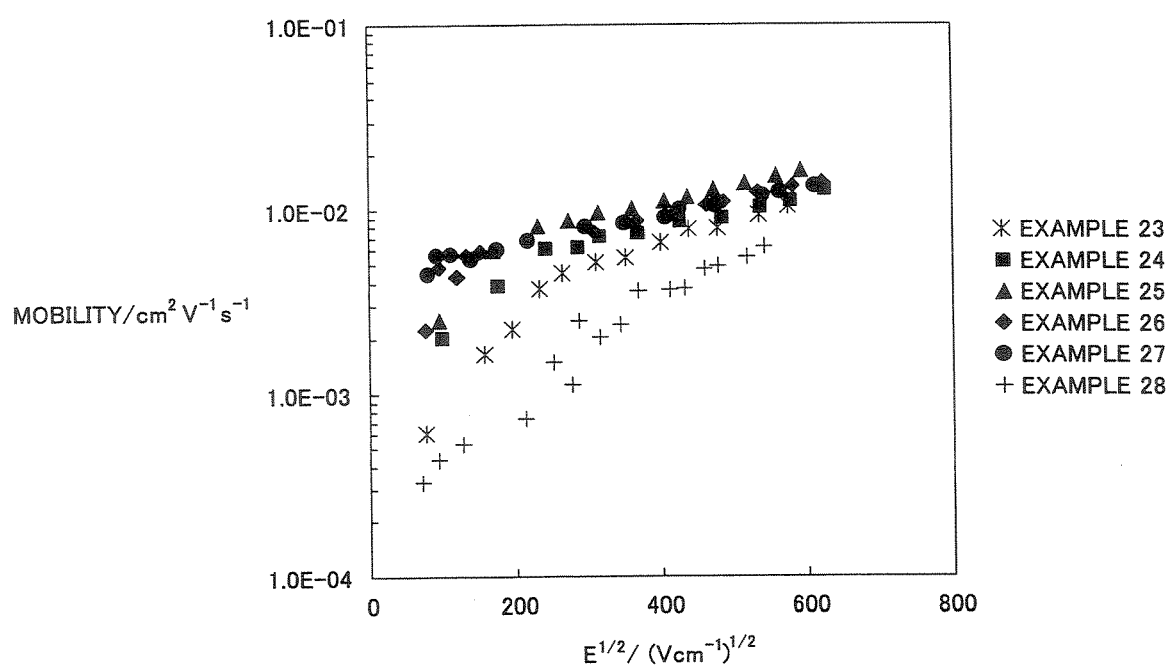
FIG. 21 illustrates a diagram of carrier mobilities of the polymer obtained in Examples 23 to 28.

A sandwich cell was made by the following processes: preparing a 10 wt % tetrahydrofuran solution of a composition made of 90 parts by weight of a Polymer 1' (weight average molecular weight of 109,100 and number average molecular weight of 27,100) which was prepared in the same manner as illustrated in Example 1 and 10 parts by weight of a compound A illustrated below; blade-coating the thus obtained solution on a PET substrate on which an Al electrode was deposited; drying the resultant at a temperature of 120° C. for half an hour to form a thin film having a thickness of 10 µm; and depositing Au on this semiconductor. Carrier mobility of the organic semiconductor material was evaluated by a time of flight method using this cell. The result is shown in FIG. 21.

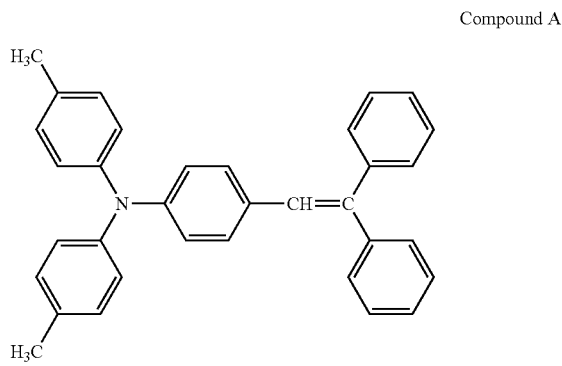

Compound A

Example 24

A sandwich cell was manufactured in the same manner as illustrated in Example 23 except that a composition made of 80 parts by weight of the polymer 1' (weight average molecular weight of 109,100 and number average molecular weight of 27,100) and 20 parts by weight of the compound A was used. Carrier mobility thereof was measured by the same method as illustrated in Example 23. The result is shown in FIG. 21.

Example 25

A sandwich cell was manufactured in the same manner as illustrated in Example 23 except that a composition made of 70 parts by weight of the polymer 1' (weight average molecular weight of 109,100 and number average molecular weight of 27,100) and 30 parts by weight of the compound A was used. Carrier mobility thereof was measured in the same manner as illustrated in Example 23. The result is shown in FIG. 21.

Example 26

A sandwich cell was manufactured in the same manner as illustrated in Example 23 except that a composition made of 60 parts by weight of the polymer 1' (weight average molecular weight of 109,100 and number average molecular weight of 27,100) and 40 parts by weight of the compound A was used. Carrier mobility thereof was measured in the same manner as illustrated in Example 23. The result is shown in FIG. 21.

Example 27

A sandwich cell was manufactured in the same manner illustrated in Example 23 except that a composition made of 50 parts by weight of the polymer 1' (weight average molecular weight of 109,100 and number average molecular weight of 27,100) and 50 parts by weight of the compound A was used. Carrier mobility thereof was measured in the same manner as illustrated in Example 23. The result is shown in FIG. 21.

Example 28

A sandwich cell was manufactured in the same manner illustrated in Example 23 except that a 10 wt % tetrahydrofuran solution singly made of the polymer 1' (weight average molecular weight of 109,100 and number average molecular weight of 27,100) was used. Carrier mobility thereof was measured in the same manner as illustrated in Example 23. The result is shown in FIG. 21.

As apparent from FIG. 21, carrier mobility evaluated in any one of Examples 23 to 28 was high. The compositions of the polymer 1' (weight average molecular weight of 109,100 and number average molecular weight of 27,100) and the composition A prepared in any one of Examples 23 to 27 have a relatively high carrier mobility compared with that of the material singly made of the polymer 1' (weight average molecular weight of 109,100 and number average molecular weight of 27,100) in Example 28 for any electric field intensity. As a result, it is found that the charge transport properties are improved.

Example 29

A thin film transistor device illustrated in FIG. 1A was manufactured in the following steps using the organic semiconductor material manufactured in Example 1; thermally oxidizing the surface of a silicon substrate which is already p-doped to function as a gate for forming a SiO$_2$ insulation layer having a thickness of 50 nm therein; removing the oxide film from one side of the substrate; depositing Al onto the surface where the oxide film is removed to prevent natural oxidation of the substrate; depositing an Au/Cr film on the SiO$_2$ insulation layer to make a source and a drain having a channel length of 40 µm and a channel width of 10 mm; and spin-coating and drying an approximately 1.0 wt % toluene solution of the polymer prepared in Example 1 to form an organic semiconductor layer.

The performance of the transistor was evaluated as follows (This evaluation method was also applied to the other Examples illustrated below). Field effect mobility of the organic semiconductor is calculated using the following formula: $Ids = \mu C_{in} W (V_g - V_{th})^2 / 2L$. In the formula, $C_{in}$ represents a capacitance of the gate insulation layer per unit area, W represents a channel width, L represents a channel length, $V_g$ represents a voltage applied to the gate, Ids represents a source-drain current, μ represents a mobility and $V_{th}$ represents a threshold voltage of the gate at which a channel begins to form.

Specifically, the source-drain current is measured when the gate voltage is applied from 10 to −20V while −20 V is applied between the source and the drain.

Square roots of the source-drain current measured in the conditions mentioned above are plotted against the gate voltage for straight-line approximation. $V_{th}$ is defined as the gate voltage when the square root of the source-drain current is 0 A in the approximated curve.

Figure 22:
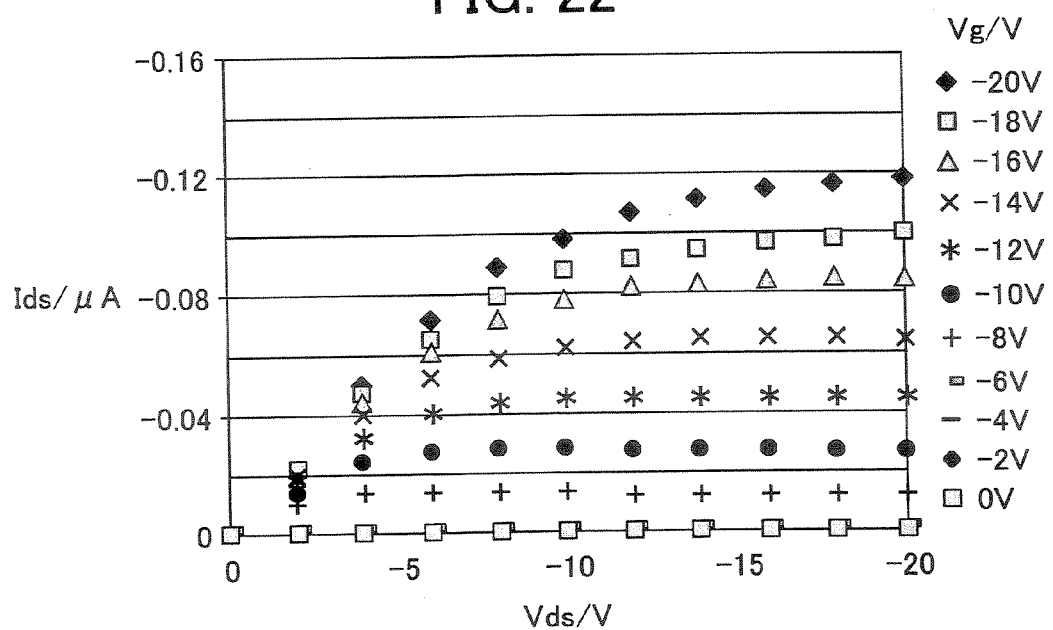
FIG. 22 illustrates a diagram indicating the transistor characteristics of the organic TFT manufactured in Example 29.

Transistor properties of the organic TFT manufactured are shown in FIG. 22. As apparent from FIG. 22, the device manufactured had excellent transistor properties. The mobility of this TFT was $2.7 \times 10^{-5}$ (cm²/Vs).

The manufactured organic TFT also had excellent properties such that the on/off ratio (the ratio of $I_{ds}$ at when $V_{ds}$ is −20V and $V_g$ is −20 V to the minimum $I_{ds}$ observed while $V_g$ varies from +10 to −20 V) was $5 \times 10^3$ and the threshold voltage is 2.5 V.

Example 30

A thin film transistor device illustrated in FIG. 1B was manufactured in the following steps using the organic semiconductor material prepared in Example 1; thermally oxidizing the surface of a silicon substrate which is already p-doped to function as a gate for forming a $SiO_2$ insulation layer having a thickness of 50 nm therein; removing the oxide film from one side of the substrate; depositing Al onto the surface where the oxide film is removed to prevent natural oxidation of the substrate; spin-coating and drying an approximately 1.0 wt % toluene solution of the polymer prepared in Example 1 on the $SiO_2$ insulation layer to form an organic semiconductor layer having a thickness of 30 nm; and subsequent to drying, depositing Au to form a source and a drain having a channel length of 40 μm and a channel width of 10 mm.

Figure 23:
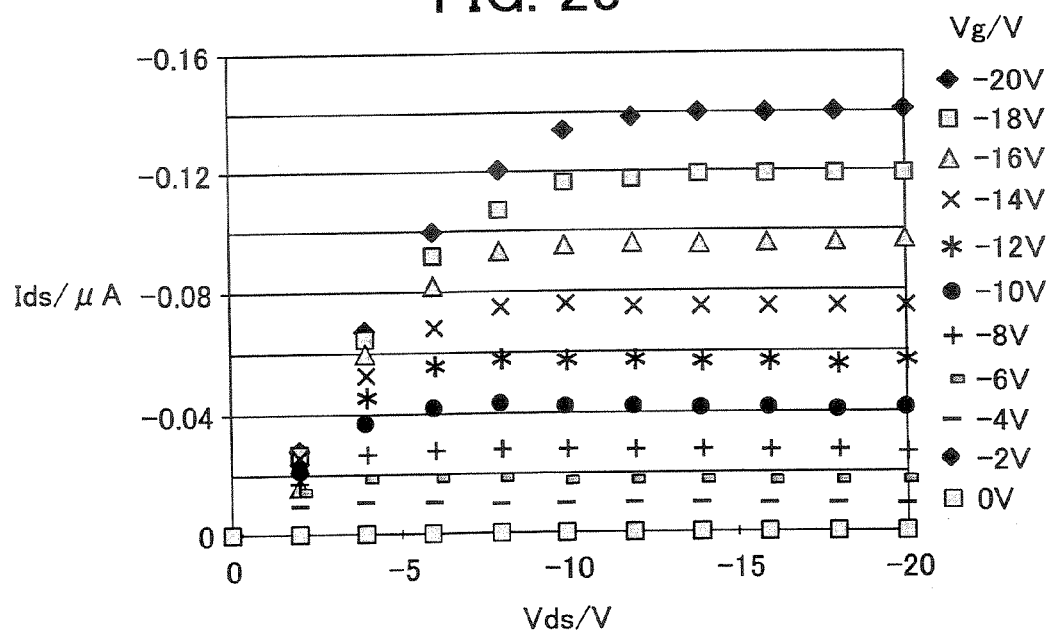
FIG. 23 illustrates a diagram indicating the transistor characteristics of the organic TFT manufactured in Example 30.

Transistor properties of the thus obtained organic TFT are shown in FIG. 23. As apparent from FIG. 23, the device manufactured showed excellent transistor properties.

The manufactured organic TFT had excellent properties such that themobility thereof was $3.2 \times 10^{-5}$ (cm²/Vs), the on/off ratio was $5 \times 10^3$ and the threshold voltage was 2.7 V.

Example 31

Figure 1B:
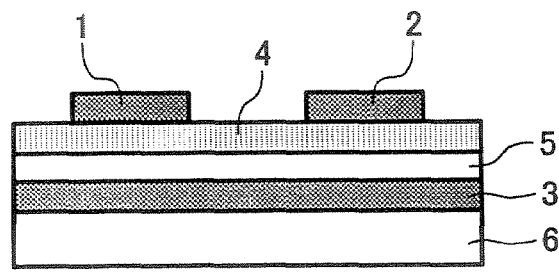
Figure 1C:
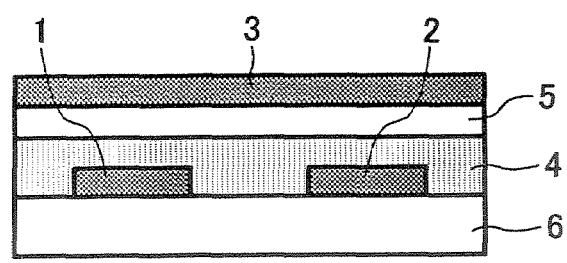
Figure 1D:
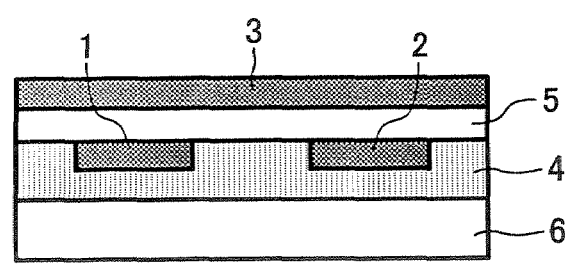

A thin film transistor device having the structure illustrated in FIG. 1B was manufactured in the same manner as illustrated in Example 30 except that the organic semiconductor material prepared by the process illustrated in Example 2 was used. The transistor properties of the organic TFT manufactured were as excellent as those of Example 29.

The on-current, the threshold voltage, the mobility and the on/off ratio of the TFT manufactured were −0.493 μA, 1.95 V, $1.01 \times 10^{-4}$ cm²/Vs and 1200, respectively.

Example 32

A thin film transistor device having the structure illustrated in FIG. 1B was manufactured in the same manner as illustrated in Example 29 except that the organic semiconductor material prepared by the process illustrated in Example 3 was used. The organic TFT manufactured showed excellent transistor properties as those of Example 30.

The on-current, the threshold voltage, the mobility and the on/off ratio of the TFT manufactured were −0.483 μA, 3.35 V, $8.76 \times 10^{-5}$ cm²/Vs and 1000, respectively.

Example 33

A device having the structure illustrated in FIG. 1B was manufactured in the same manner as illustrated in Example 30 using Polymer 4 prepared in Example 4.

The TFT manufactured showed excellent properties such that the on-current, the threshold voltage, the mobility and the on/off ratio were −0.229 μA, 2.54 V, $4.46 \times 10^{-5}$ cm²/Vs and 1900, respectively.

Example 34

A device having the structure illustrated in FIG. 1B was manufactured in the same manner as illustrated in Example 30 using the polymer 5 prepared in Example 5.

The TFT manufactured showed excellent properties such that the on-current, the threshold voltage, the mobility and the on/off ratio were −0.335 μA, 2.65 V, $6.45 \times 10^{-5}$ cm²/Vs and 3500, respectively.

Example 35

A device having the structure illustrated in FIG. 1B was manufactured in the same manner as illustrated in Example 30 using the polymer 7 prepared in Example 7.

The TFT manufactured showed excellent properties such that the on-current, the threshold voltage, the mobility and the on/off ratio were −0.574 μA, 1.01 V, $1.28 \times 10^{-4}$ cm²/Vs and 1500, respectively.

Example 36

A device having the structure illustrated in FIG. 1B was manufactured in the same manner as illustrated in Example 30 using the polymer 13 prepared in Example 13.

The TFT manufactured shows excellent properties such that the on-current, the threshold voltage, the mobility and the on/off ratio are −0.361 μA, 3.84 V, $6.27 \times 10^{-5}$ cm²/Vs and 420, respectively.

Example 37

A device having the structure illustrated in FIG. 1B was manufactured in the same manner as illustrated in Example 30 using the polymer 18 prepared in Example 18.

The TFT manufactured showed excellent properties such that the on-current, the threshold voltage, the mobility and the on/off ratio were −0.111 μA, −1.07 V, $3.07 \times 10^{-5}$ cm²/Vs and 1700, respectively.

Example 38

A device having the structure illustrated in FIG. 1B was manufactured in the same manner as illustrated in Example 30 using the polymer 19 prepared in Example 19.

The TFT manufactured showed excellent properties such that the on-current, the threshold voltage, the mobility and the on/off ratio were −0.137 μA, 0.37 V, $3.26 \times 10^{-5}$ cm²/Vs and 11200, respectively.

Comparative Example 1

Figure 24:
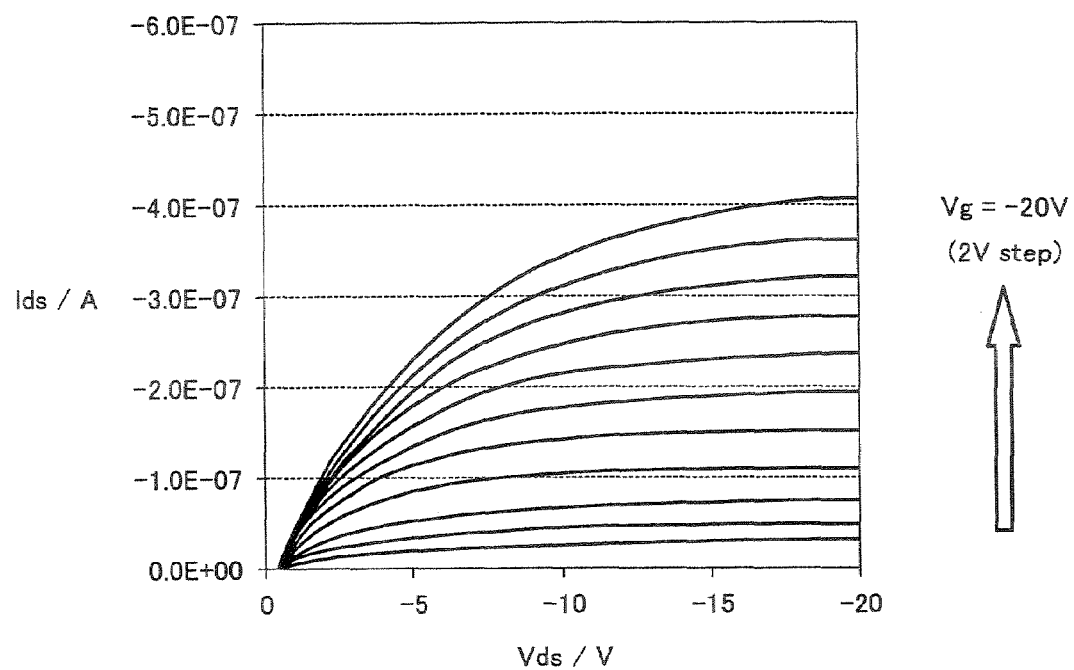
FIG. 24 illustrates a diagram indicating the transistor characteristics of the organic TFT manufactured in Comparative Example 1.

A thin film device having the structure illustrated in FIG. 1B was manufactured in the same manner as illustrated in Example 30 except that poly-3-hexylthiophene as a typical material for an organic semiconductor layer was used. Transistor properties of the thus obtained organic TFT are shown in FIG. 24. The mobility of the organic TFT was relatively as high as $7.76 \times 10^{-5}$ cm$^2$/Vs but the on/off ratio was around 10 because the off current was large.

In addition, severe environmental condition evaluations were performed for the device. These are: (1) electric characteristic evaluation just after the device is manufactured, (2) electric characteristic evaluation after the device is left in the atmosphere for a week. A ratio {(2)/(1)} of the value obtained from (2) to the value obtained from (1) is evaluated as a variable ratio. The result was that the variable ratios of the on-current and the on/off ratio were 0.80 and 0.62, respectively, meaning that the device had a poor durability for severe environmental conditions.

Comparative Example 2

An organic TFT was manufactured in the same manner as illustrated in Example 30 using a dioctylfluorenedithiophene copolymer (SCIENCE Vol. 290, 15 Dec. 2000, p. 2123) having a number average molecular weight of 19,500 and a weight average molecular weight of 51,500 represented by the following formula as a typical semiconductor material.

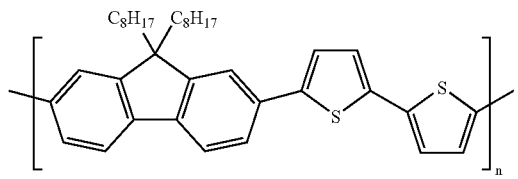

The manufactured TFT had an on-current of −23.2 nA, a threshold voltage of 0.09 V, a mobility of $5.69 \times 10^{-6}$ cm$^2$/Vs and an on/off ratio of 1400. The on/off ratio of this TFT was relatively excellent, but the mobility thereof was inferior by at least a magnitude compared with that of the material of the present invention. Therefore, it was proved that the materials of the present invention are effective.

Example 39

A 1% by weight solution of the polymer 1' (a weight average molecular weight of 109,100 and a number average molecular weight of 27,100) was prepared using various kinds of organic solvents of toluene, THF, chloroform, dichloromethane and dioxane and a film was formed from each solution by a cup spin method.

The height difference between the peak and the valley of the film was determined by observing concavity and convexity thereof in a scanning range of 0.5 square μm with an atomic force microscope (AFM). The result is shown in Table 1.

TABLE 1

| Solvent | PV (peak to valley) value |
|---|---|
| toluene | 33.4 nm |
| THF | 0.76 nm |
| chloroform | 210 nm |
| dichloromethane | 156 nm |
| dioxane | 10.6 nm |

Further, the same evaluation was performed using a composition solution made of toluene of 80% and paraxylene of 20% and the height difference between the peak and the valley was 0.56 nm.

A TFT was manufactured in the same manner as illustrated in Example 30 except that the spin coating solution used was prepared using the polymer 1 and a solvent mixture of 80% toluene and 20% paraxylene. The thus obtained TFT had an on-current of −1.41 μA, a threshold voltage of 2.23 V and a mobility of $4.30 \times 10^{-4}$ cm$^2$/Vs. This mobility was about 13 times as fast as that obtained in Example 30 and 76 times as fast as that obtained in Comparative Example 2 in which a conventional material was used.

In addition, the surface roughness and TFT properties of the semiconductor film were checked in detail. It was found that when the surface roughness (the height difference between the peak and the valley) is not greater than 10 nm, and preferably not greater than 1 nm, the TFT properties improved.

Example 40

Figure 25:
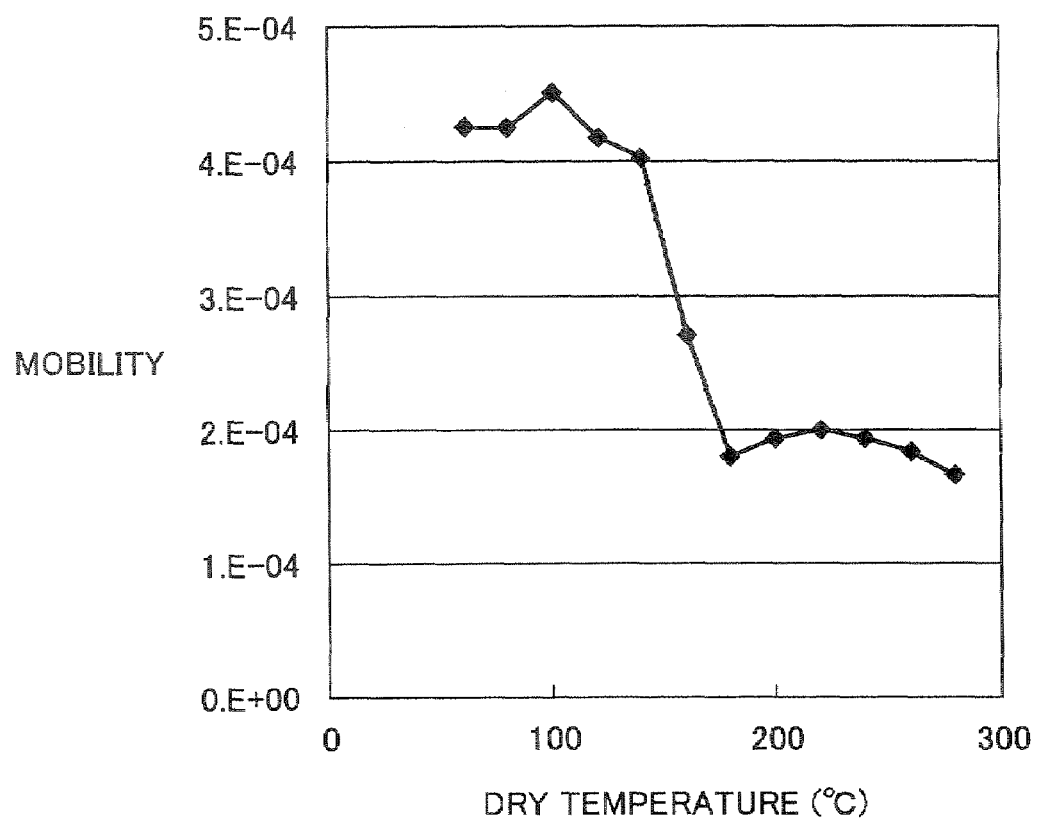
FIG. 25 illustrates a diagram indicating the transistor characteristics of the organic TFT manufactured in Example 40.

The relationship between the drying temperature and the TFT properties at the time when the TFT was manufactured in the same manner as illustrated in Example 30 except that the organic semiconductor solution used a solution mixture of 80% toluene and 20% paraxylene, ias shown in FIG. 25.

The mobility dropped sharply when the drying temperature was 160° C. and thereafter became nearly constant. Therefore, it is preferable to dry a film at a temperature not higher than 150° C.

Example 41

A thin film transistor device having the structure illustrated in FIG. 1B was manufactured in the following steps using a composition made of the polymer 1' (a weight average molecular weight of 109,100 and a number average molecular weight of 27,100) and the compound A: thermally oxidizing the surface of a silicon substrate which is already p-doped to function as a gate for forming a SiO$_2$ insulation layer having a thickness of 50 nm therein; removing the oxide film from one side of the substrate; depositing Al onto the surface where the oxide film is removed to prevent natural oxidation of the substrate; preparing a 1.0 wt % THF/p-xylene (80/20) solution of a composition made of the polymer 1 and the compound A (60 parts by weight of the polymer 1 and 40 parts by weight of the compound A); spin coating and drying the solution on the SiO$_2$ insulation layer to form an organic semiconductor layer having a thickness of 30 nm; and depositing Au on the organic semiconductor layer to form a source and a drain having a channel length of 40 μm and a channel width of 10 mm.

Figure 26:
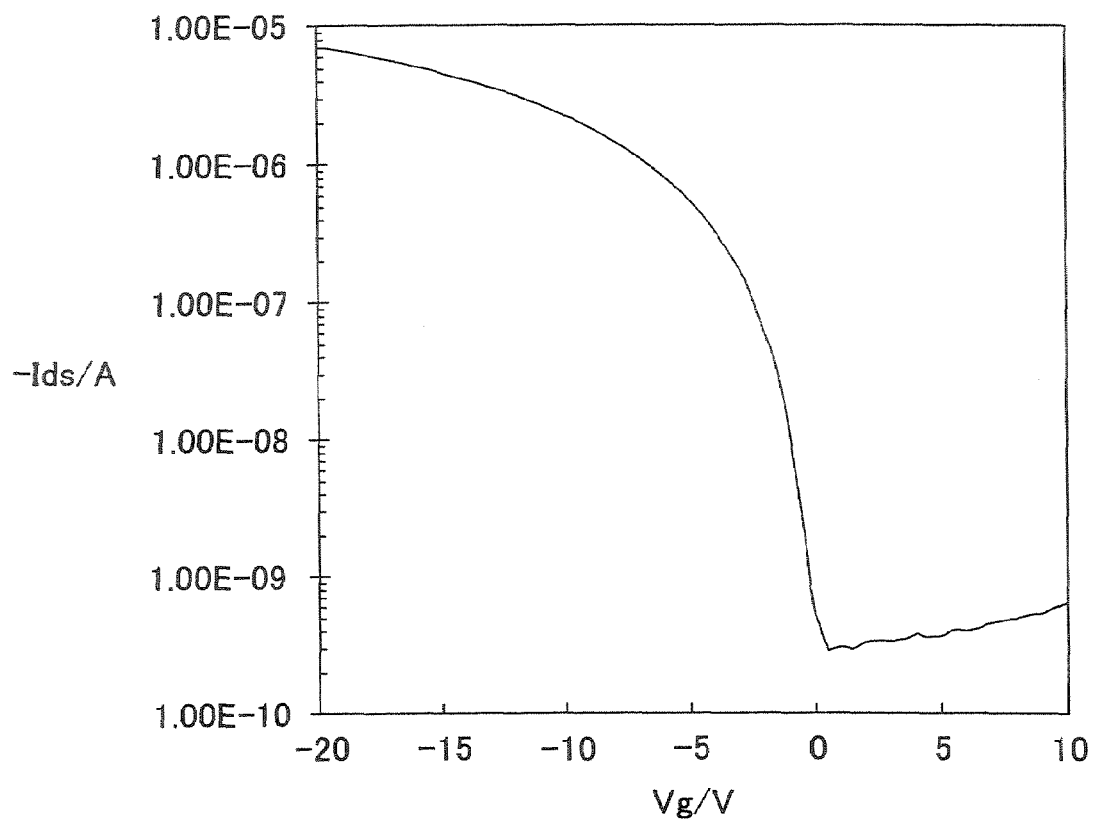
FIG. 26 illustrates a diagram indicating the transistor characteristics of the organic TFT manufactured in Example 41.

Transistor properties of the thus manufactured organic TFT are showed in FIG. 26. As apparent from FIG. 26, the manufactured device showed excellent transistor properties.

The manufactured TFT operated in a depression mode and had an excellent mobility of $1.04 \times 10^{-3}$ (cm$^2$/Vs).

The device was evaluated on durability for environmental conditions as done in Comparative Example 1. The variable ratios of the on-current and the on/off ratio were both 1.00, meaning that the device had an excellent durability for a severe environmental condition.

Example 42

A thin film transistor device having the structure illustrated in FIG. 1A was manufactured in the following steps using a composition made of the polymer 1' (a weight average molecular weight of 109,100 and a number average molecular weight of 27,100) and the compound A: thermally oxidizing the surface of a silicon substrate which is already p-doped to function as a gate for forming a $SiO_2$ insulation layer having a thickness of 50 nm therein; removing the oxide film from one side of the substrate; depositing Al onto the surface where the oxide film is removed to prevent natural oxidation of the substrate; depositing an Au/Cr film on the $SiO_2$ insulation layer to form a source and a drain having a channel length of 40 µm and a width of 10 mm; preparing a 1.0 wt % THF/p-xylene (80/20) solution of a composition made of the polymer 1 and the compound A (60 parts by weight of the polymer 1 and 40 parts by weight of the compound A); and spin coating and drying the solution on the $SiO_2$ insulation layer to form an organic semiconductor layer having a thickness of 30 nm.

Transistor properties of the thus manufactures organic TFT were measured. The organic TFT had almost the same results as those of Example 41 and showed excellent properties for carrier mobility, on/off ratio and durability in a severe environmental condition.

Example 43

A thin film transistor device having the structure illustrates in FIG. 1B was manufactured in the following steps using the polymer 1' (a weight average molecular weight of 109,100 and a number average molecular weight of 27,100): thermally oxidizing the surface of a silicon substrate which is already p-doped to function as a gate for forming a $SiO_2$ insulation layer having a thickness of 50 nm therein; removing the oxide film from one side of the substrate; depositing Al onto the surface where the oxide film is removed to prevent natural oxidation of the substrate; exposing the surface of the $SiO_2$ insulation layer to a vapor of hexamethyldisilazane (HMDS); spin coating a 1.0 wt % THF/p-xylene (80/20) solution of the polymer 1 to form an organic semiconductor layer having a thickness of 30 nm; and depositing Au on the organic semiconductor layer to form a source and a drain having a channel length of 40 µm and a channel width of 10 mm.

The manufactured TFT had an on-current of −1.85 µA, a threshold voltage of −1.12 V and a mobility of $8.29 \times 10^{-4}$ $cm^2/Vs$, meaning that the TFT had excellent properties.

Further, the device had a threshold voltage of −1.12 V and the transistor showed an enhancement mode. This is greatly preferable in light of transistor operation.

In an attempt to determine a suitable range of the surface energy, the period of HDMS exposure time and the heat treatment temperature thereafter were varied and further a surface modifying agent such as octadecyltrichlorosilane was used.

The surface energy was calculated by Zisman plot and evaluated using water, glycerine, formamide, diethylenegly-col and dipropylene glycol as a standard testing solution.

The determined range of the surface energy which provides a preferable result was from 25 to 40 mN/m. When the surface energy is too small, a spin coating method cannot be applied for film-forming because application solutions are rejected. When the surface energy is too large, the threshold voltage obtained is a positive value (depression mode) and not preferable.

Example 44

A device having the structure illustrated in FIG. 1B was manufactured in the same manner as illustrated in Example 43 using the polymer 9 which was manufactured in Example 9. In this process, the surface energy was adjusted to be 28 mN/m by exposing the gate insulation film to a vapor of HMDS and the formed film was dried at 75° C.

The manufactured TFT had an on-current of −3.34 µA, a threshold voltage of −1.76 V and a mobility of $1.75 \times 10^{-3}$ $cm^2/Vs$, meaning that the TFT had excellent properties. The mobility was 307 times as fast as that obtained in Comparative Example 2. Also the transistor had a threshold voltage of −1.76 V and showed an enhancement mode.

Example 45

A TFT having the structure illustrates in FIG. 1B was manufactured in the same manner as illustrated in Example 44 using the polymer 14 which was manufactured in Example 14. The manufactured device showed an enhancement operation and had excellent properties such that the mobility was $3.6 \times 10^{-4}$ $cm^2/Vs$ and the on/off ratio was not less than $1 \times 10^4$.

Example 46

A TFT having the structure illustrates in FIG. 1B was manufactured in the same manner as illustrated in Example 44 using the polymer 18 which was manufactured in Example 18, The manufactured device showed an enhancement operation and had excellent properties such that the mobility was $3.1 \times 10^{-5}$ $cm^2/Vs$ and the on/off ratio was not less than $2 \times 10^3$.

Example 47

A TFT having the structure illustrates in FIG. 1B was manufactured in the same manner as illustrated in Example 44 using the polymer 8 which was manufactured in Example 8. The manufactured device showed an enhancement operation and had excellent properties such that the mobility was $1.1 \times 10^{-3}$ $cm^2/Vs$ and the on/off ratio was not less than $1 \times 10^4$.

Example 48

A TFT having the structure illustrated in FIG. 1B was manufactured in the same manner as illustrated in Example 44 using the polymer 15 which was manufactured in Example 15. The manufactured device showed an enhancement operation and had excellent properties such that the mobility was $2.62 \times 10^{-4}$ $cm^2/Vs$ and the on/off ratio was not less than $1 \times 10^4$.

Example 49

A TFT having the structure illustrates in FIG. 1B was manufactured in the same manner as illustrated in Example 44 using the polymer 16 which was manufactured in Example 16. The manufactured device showed an enhancement operation and had excellent properties such that the mobility was $1.0 \times 10^{-4}$ $cm^2/Vs$ and the on/off ratio was not less than $6.2 \times 10^3$.

Example 50

A TFT having the structure illustrates in FIG. 1B was manufactured in the same manner as illustrated in Example 44 using a composition made of 60 parts by weight of the polymer 1' which had a weight average molecular weight of 109,100 and a number average molecular weight 27,100 and 40 parts by weight of the compound A. The manufactured device showed an enhancement operation and had excellent properties such that the mobility was $3.01 \times 10^{-3}$ $cm^2/Vs$ and the on/off ratio was not less than $2.6 \times 10^4$.

This document claims priority and contains subject matter related to Japanese Patent Applications Nos. 2003-03582 filed on Feb. 13, 2003, 2003-307561 filed on Aug. 29, 2003, 2003-185402 filed on Jun. 27, 2003, 2003-373723 filed on Oct. 31, 2003, 2004-24866 filed on Jan. 30, 2004, 2004-24867 filed on Jan. 30, 2004, 2004-24878 filed on Jan. 30, 2004, and 2004-27234 filed on Feb. 3, 2004, incorporated herein by reference.

Having now fully described the invention, it will be apparent to one of ordinary skill in the art that many changes and modifications can be made thereto without departing from the spirit and scope of the invention as set forth therein.

What is claimed is:

1. An organic semiconductor material comprising:
a polymer comprising a repeat unit represented by the following formula (I):

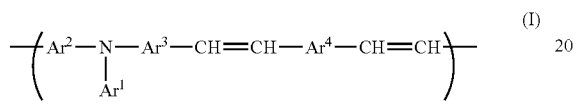

wherein, $Ar^1$ represents a substituted aromatic hydrocarbon group or a non-substituted aromatic hydrocarbon group, $Ar^2$ and $Ar^3$ each, independently, represent a divalent aromatic hydrocarbon selected from the group consisting of substituted or non-substituted monocyclic aromatic hydrocarbons, substituted or non-substituted non-condensed polycylic aromatic hydrocarbons and substituted or a non-substituted condensed polycylic aromatic hydrocarbons and $Ar^4$ represents a bivalent group of benzene, thiophene, biphenyl or anthracene, each of which can optionally have a substituent; and
a compound represented by the following formula (VII):

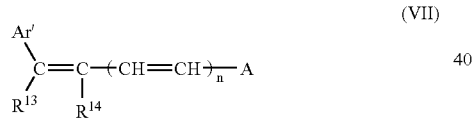

wherein, n is 0 or 1, Ar' represents a substituted aryl group or a non-substituted aryl group, $R^{13}$ and $R^{14}$ each, independently, represents a hydrogen atom, a substituted or non-substituted alkyl group, or a substituted or non-substituted aryl group, wherein Ar' and $R^{13}$ can optionally combine to form a ring, A represents a 9-anthryl group, a substituted or non-substituted carbazolyl group, a group represented by the following formula (1), or a group represented by the following formula (2):

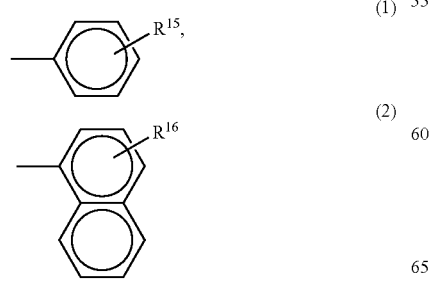

wherein $R^{15}$ and $R^{16}$ each, independently, represents a hydrogen atom, an alkyl group, alkoxyl group, a halogen atom or a group represented by the following formula (3):

wherein, $R^{17}$ and $R^{18}$ each, independently, represents a substituted or non-substituted alkyl group or a substituted or non-substituted aryl group, wherein $R^{17}$ and $R^{18}$ can optionally combine to form a ring.

2. An organic thin film transistor comprising:
a substrate;
an organic semiconductor layer which comprises a polymer comprising a repeat unit represented by the following formula (I):

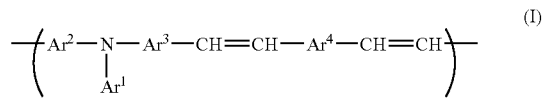

wherein, $Ar^1$ represents a substituted aromatic hydrocarbon group or a non-substituted aromatic hydrocarbon group, $Ar^2$ and $Ar^3$ each, independently, represents a divalent aromatic hydrocarbon selected from the group consisting of substituted or non-substituted monocyclic aromatic hydrocarbons, substituted or non-substituted non-condensed polycyclic aromatic hydrocarbons and substituted or a non-substituted condensed polycyclic aromatic hydrocarbons and $Ar^4$ represents a bivalent group of benzene, thiophene, biphenyl or anthracene, each of which can optionally have a substituent, and which is located overlying the substrate;
an electrode pair having a source electrode and a drain electrode; and
a third electrode.

3. The organic thin film transistor comprising:
a substrate;
an organic semiconductor layer which comprises the organic semiconductor material of claim 1 and which is located overlying the substrate;
an electrode pair having a source electrode and
a drain electrode; and
a third electrode.

4. The organic thin film transistor according to claim 2, wherein at least one of $Ar^1$, $Ar^2$, $Ar^3$ and $Ar^4$ included in the repeat unit comprises:
at least one substituted or non-substituted alkyl group, substituted or non-substituted alkoxy group or substituted or non-substituted alkylthio group, each of which comprises a straight chain or a branched chain and having 2 to 18 carbon atoms.

5. The organic thin film transistor according to claim 2, further comprising an insulation layer between the electrode pair and the third electrode.

6. The organic thin film transistor according to claim 5, wherein the insulation layer has a surface energy of from 25 to 40 mN/m.

7. The organic thin film transistor according to claim 2, wherein the organic semiconductor layer has a surface having a surface roughness not greater than 1 nm in PV value.

8. A method of manufacturing an organic thin film transistor, comprising:
applying a solution comprising a solvent and a polymer comprising a repeat unit represented by the following formula (I):

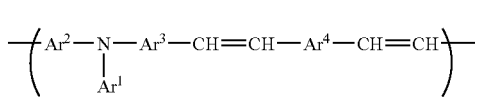

wherein, $Ar^1$ a substituted aromatic hydrocarbon group or a non-substituted aromatic hydrocarbon group, $Ar^2$ and $Ar^3$ each, independently, represents a divalent aromatic hydrocarbon selected from the group consisting of substituted or non-substituted monocyclic aromatic hydrocarbons, substituted or non-substituted non-condensed polycyclic aromatic hydrocarbons and substituted or a non-substituted condensed polycyclic aromatic hydrocarbons and $Ar^4$ represents a bivalent group of benzene, thiophene, biphenyl or anthracene, each of which can optionally have a substituent, on the substrate; and
drying the solvent of the applied solution to 3 form an organic layer on the substrate.

9. The method according to claim 8, wherein the solution further comprises a compound having the following formula (VII):

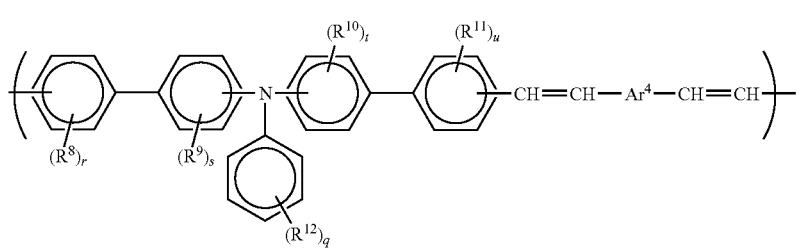

wherein, n is 0 or 1, Ar' represents a substituted aryl group or a non-substituted aryl group, $R^{13}$ and $R^{14}$ each, independently, represents a hydrogen atom, a substituted or non-substituted alkyl group, or a substituted or non-substituted aryl group, wherein Ar' and $R^{13}$ can optionally combine to form a ring, A represents a 9-anthryl group, a substituted or non-substituted carbazolyl group, a group represented by the following formula (1), or a group represented by the following formula (2):

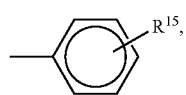

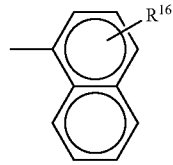

wherein $R^{15}$ and $R^{16}$ each, independently, represents a hydrogen atom, an alkyl group, alkoxyl group, a halogen atom or a group represented by the following formula (3):

wherein, $R^{17}$ and $R^{18}$ each, independently, represents a substituted or non-substituted alkyl group or a substituted or non-substituted aryl group, and wherein $R^{17}$ and $R^{18}$ can optionally combine to form a ring.

10. The method according to claim 8, further comprising forming an insulation layer overlying the substrate, wherein the solution is applied on a surface of the insulation layer, and wherein the surface of the insulation layer has a surface energy of from 25 to 40 mN/m.

11. The method according to claim 10, further comprising:
subjecting the surface of the insulation layer to a silane coupling treatment before said solution applying step.

12. The method according to claim 8, wherein the organic semiconductor layer has a surface having a surface roughness not greater than 1 nm in PV value.

13. The method according to claim 8, wherein the organic semiconductor layer is applied by a cup spin method.

14. The method according to claim 8, wherein the solvent comprises:
tetrahydrofuran serving as a main component; and
at least one element selected from the group consisting of toluene, xylene, dioxane, chloroform and dichloromethane.

15. The method according to claim 8, wherein the solvent is dried at a temperature not higher than 150° C.

16. The organic semiconductor material according to claim 1, wherein the repeat unit of the polymer is represented by the following formula (II):

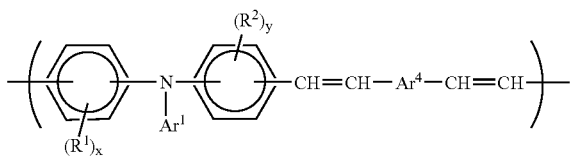

(II)

wherein, Ar¹ represents a substituted aromatic hydrocarbon group or a non-substituted aromatic hydrocarbon group, Ar⁴ represents a bivalent group of benzene, thiophene, biphenyl or anthracene, each of which can optionally have a substituent, R¹ and R² each, independently, represents a halogen atom, a substituted or non-substituted alkyl group, a substituted or non-substituted alkoxy group or a substituted or non-substituted alkylthio group, and x and y each, independently represents 0 or an integer of from 1 to 4.

17. The organic semiconductor material according to claim 16, wherein the repeat unit of the polymer is represented by the following formula (III):

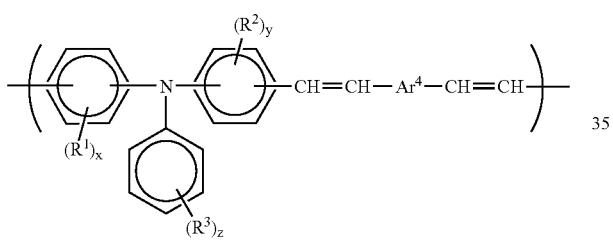

(III)

wherein, Ar⁴ represents a bivalent group of benzene, thiophene, biphenyl or anthracene, each of which can optionally have a substituent, R¹ and R² each, independently, represents a halogen atom, a substituted or non-substituted alkyl group, a substituted or non-substituted alkoxy group or a substituted or non-substituted alkylthio group, R³ represents a halogen atom, a substituted or non-substituted alkyl group, a substituted or non-substituted alkoxy group, a substituted or non-substituted alkylthio group or a substituted or non-substituted aryl group, x and y each, independently, represents 0 or an integer of from 1 to 4 and z represents 0 or an integer from 1 to 5.

18. The organic semiconductor material according to claim 16, wherein the repeat unit is represented by the following formula (IV):

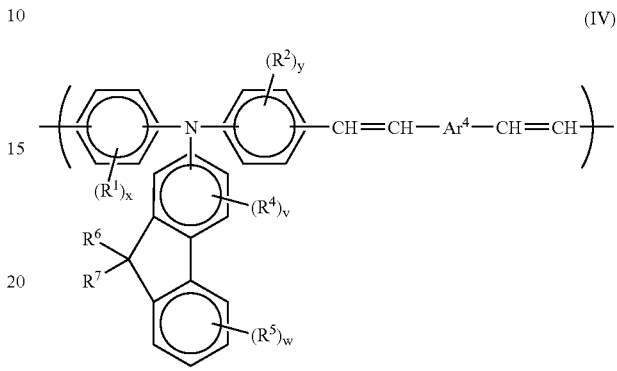

(IV)

wherein, Ar⁴ represents a bivalent group of benzene, thiophene, biphenyl or anthracene, each of which can optionally have a substituent, R², R⁴ R⁵ R⁶ and R⁷ each, independently, represents a halogen atom, a substituted or non-substituted alkyl group, a substituted or non-substituted alkoxy group or a substituted or non-substituted alkylthio group, v represents 0 or an integer of from 1 to 3 and w, x and y independently represent 0 or an integer of from 1 to 4.

19. The organic semiconductor material according to claim 1, wherein the repeat unit of the polymer is represented by the following formula:

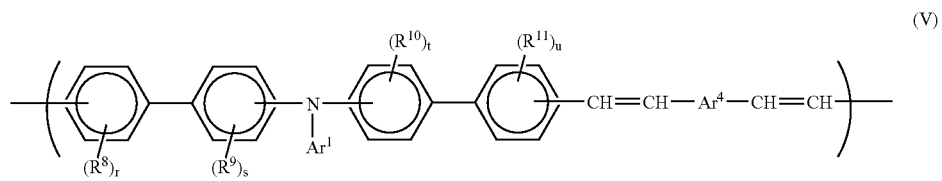

(V)

wherein, Ar¹ represents a substituted aromatic hydrocarbon group or a non-substituted aromatic hydrocarbon group, Ar⁴ represents a bivalent group of benzene, thiophene, biphenyl or anthracene, each of which can optionally have a substituent, R⁸, R⁹, R¹⁰ and R¹¹ each, independently, represent a halogen atom, a substituted or non-substituted alkyl group, a group, and r, s, t and u each, independently, represents 0 and an integer of from 1 to 4.

20. The organic semiconductor material according to claim 19, wherein the repeat unit of the polymer is represented by the following formula (VI):

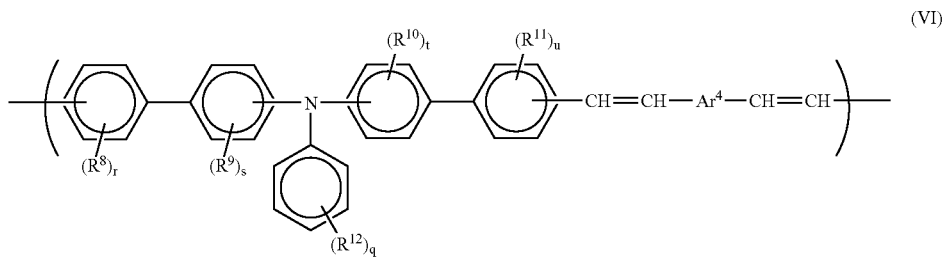

(VI)

wherein, Ar⁴ represents a bivalent group of benzene, thiophene, biphenyl or anthracene, each of which can have a substituent, $R^8$, $R^9$, $R^{10}$, $R^{11}$ and $R^{12}$ each, independently, represents a halogen atom, a substituted or non-substituted alkyl group, a substituted or non-substituted alkoxy group or a substituted or non-substituted alkylthio group, q represents 0 or an integer of from 1 to 5 and r, s, t and u each, independently, represents 0 or an integer of from 1 to 4.

21. The organic semiconductor material according to claim 1, wherein at least one of $Ar^1$, $Ar^2$, $Ar^3$ and $Ar^4$ included in the repeat unit of the polymer comprises:

at least one substituted or non-substituted alkyl group, substituted or non-substituted alkoxy group or substituted or non-substituted alkylthio group, each of which comprises a straight chain or a branched chain and having 2 to 18 carbon atoms.

* * * * *